United States Patent
Hayashiguchi

(10) Patent No.: US 12,107,029 B2
(45) Date of Patent: Oct. 1, 2024

(54) POWER MODULE WITH GRAPHITE PLATE

(71) Applicant: ROHM CO., LTD., Kyoto (JP)

(72) Inventor: Masashi Hayashiguchi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 359 days.

(21) Appl. No.: 17/595,230

(22) PCT Filed: Jul. 29, 2020

(86) PCT No.: PCT/JP2020/028958
§ 371 (c)(1),
(2) Date: Nov. 11, 2021

(87) PCT Pub. No.: WO2021/029220
PCT Pub. Date: Feb. 18, 2021

(65) Prior Publication Data
US 2022/0319952 A1   Oct. 6, 2022

(30) Foreign Application Priority Data

Aug. 9, 2019   (JP) ................. 2019-147650

(51) Int. Cl.
*H01L 23/373*   (2006.01)
*H01L 23/00*   (2006.01)
(Continued)

(52) U.S. Cl.
CPC ........ *H01L 23/373* (2013.01); *H01L 23/3672* (2013.01); *H01L 24/29* (2013.01);
(Continued)

(58) Field of Classification Search
CPC .................................................. H01L 23/373
(Continued)

(56) References Cited

U.S. PATENT DOCUMENTS 6,486,627 B1 * 11/2002 Gabrys ................... H02J 9/066
307/68
2012/0032725 A1   2/2012 Hiyama
(Continued)

FOREIGN PATENT DOCUMENTS

DE   112019006032 T5   10/2021
JP      2012038803       2/2012
(Continued)

OTHER PUBLICATIONS

International Search Report and Written Opinion issued for International Patent Application No. PCT/JP2020/028958, Date of mailing: Oct. 27, 2020, 9 pages including English translation of Search Report.

(Continued)

*Primary Examiner* — Ajay Arora
(74) *Attorney, Agent, or Firm* — HSML P.C.

(57) ABSTRACT

A power module includes a substrate that is electrically insulative and includes a substrate main surface and a substrate back surface at opposite sides in a thickness direction. The power module also includes a mounting layer that is conductive and arranged on the substrate main surface. The power module further includes a graphite plate having anisotropic thermal conductivity and including a plate main surface and a plate back surface at opposite sides in the thickness direction. The plate back surface is connected to the mounting layer. The power module further includes a power semiconductor element arranged on the plate main surface.

18 Claims, 44 Drawing Sheets

(51) Int. Cl.
*H01L 23/367* (2006.01)
*H01L 25/18* (2023.01)

(52) U.S. Cl.
CPC .............. *H01L 24/32* (2013.01); *H01L 24/48* (2013.01); *H01L 24/73* (2013.01); *H01L 25/18* (2013.01); *H01L 2224/29139* (2013.01); *H01L 2224/32225* (2013.01); *H01L 2224/48139* (2013.01); *H01L 2224/48229* (2013.01); *H01L 2224/73265* (2013.01); *H01L 2924/10272* (2013.01); *H01L 2924/1203* (2013.01); *H01L 2924/13091* (2013.01)

(58) Field of Classification Search
USPC .......................................................... 257/712
See application file for complete search history.

(56) References Cited

U.S. PATENT DOCUMENTS

| | | | | |
|---|---|---|---|---|
| 2012/0152510 A1* | 6/2012 | Noda | ................... | B23K 35/025 228/208 |
| 2014/0124915 A1 | 5/2014 | Hayashi et al. | | |
| 2019/0051606 A1 | 2/2019 | Oomori | | |
| 2022/0013427 A1 | 1/2022 | Otsuka | | |

FOREIGN PATENT DOCUMENTS

| | | |
|---|---|---|
| JP | 2012222160 | 11/2012 |
| JP | 2014022450 | 2/2014 |
| JP | 2016149431 A | 8/2016 |
| JP | 2017168582 | 9/2017 |
| JP | 2018174252 A | 11/2018 |
| WO | 2013002249 A1 | 1/2013 |

OTHER PUBLICATIONS

International Preliminary Report on Patentability issued for International Patent Application No. PCT/JP2020/028958, Date of mailing: Feb. 17, 2022, 11 pages including English translation.
Office Action issued in Japanese Patent Application No. 2021-539196, Mar. 19, 2024, with machine translation (8 pages).
Office Action issued for German Patent Application No. 11 2020 003 823.8, dated Apr. 11, 2024, 14 pages including informal English translation.
Notice of Reasons for Refusal issued for Japanese Patent Application 2021-539196, Dispatch date: Aug. 6, 2024, 9 pages including English machine translation.

* cited by examiner

POWER MODULE WITH GRAPHITE PLATE

TECHNICAL FIELD

The present disclosure related to a power module.

BACKGROUND ART

One known example of a power module is used as an inverter device (refer to, for example, Patent Document 1). The power module includes series-connected power semiconductor elements formed by transistors such as Insulated Gate Bipolar Transistors (IGBTs) and Metal Oxide Semiconductor Field Effect Transistors (MOSFETs).
Patent Document 1: Japanese Laid-Open Patent Publication No. 2012-38803

SUMMARY

Large currents flow through the power semiconductor elements of a power module. Thus, the temperature of the power semiconductor elements easily becomes high. This increases the significance of a heat dissipation structure for the power semiconductor elements in the power module.

It is an objective of the present disclosure to provide a power module that dissipates heat efficiently from the power semiconductor elements.

A power module that achieves the above objective includes a substrate, a mounting layer, a graphite plate, and a power semiconductor element. The substrate is electrically insulative and includes a substrate main surface and a substrate back surface at opposite sides in a thickness direction. The mounting layer is conductive and arranged on the substrate main surface. The graphite plate has anisotropic thermal conductivity and includes a plate main surface and a plate back surface at opposite sides in the thickness direction. The plate back surface is connected to the mounting layer. The power semiconductor element is arranged on the plate main surface.

This configuration readily disperses the heat of the power semiconductor elements in a planar direction of the graphite plate. Accordingly, the heat of the power semiconductor elements are transmitted over a wide range to the graphite plate. This efficiently dissipates heat from the power semiconductor elements.

A power module that achieves the above objective includes a substrate that is electrically insulative and includes a substrate main surface and a substrate back surface at opposite sides in a thickness direction. A first mounting layer, a second mounting layer, and a conductive layer are arranged on the substrate main surface in a direction orthogonal to the thickness direction. The power module further includes a first graphite plate, a second graphite plate, a first power semiconductor element, and a second semiconductor element. The first graphite plate has anisotropic thermal conductivity and includes a first plate main surface and a first plate back surface at opposite sides in the thickness direction. The first plate back surface is formed on the first mounting layer. The second graphite plate has anisotropic thermal conductivity and includes a second plate main surface and a second plate back surface at opposite sides in the thickness direction. The second plate back surface is formed on the second mounting layer. The first power semiconductor element is arranged on the first plate main surface. The second power semiconductor element is arranged on the second plate main surface.

This configuration readily disperses the heat of the first power semiconductor element in a planar direction of the first graphite plate and the heat of the second power semiconductor element in a planar direction of the second graphite plate. Accordingly, the heat of the first power semiconductor element is transmitted over a wide range to the first graphite plate, and the heat of the second power semiconductor element is transmitted over a wide range to the second graphite plate. This efficiently dissipates heat from the power semiconductor elements.

The power module dissipates heat efficiently from the power semiconductor elements.

DESCRIPTION OF THE EMBODIMENTS

A power module in accordance with one embodiment will now be described with reference to the drawings. The embodiments described below exemplify configurations and methods for embodying a technical concept without any intention to limit the material, shape, structure, arrangement, dimensions, and the like of each component. The embodiment described below may undergo various modifications.

First Embodiment

With reference to FIGS. 1 to 27, a power module 1A in accordance with a first embodiment will now be described.

FIGS. 1 to 6 illustrate the appearance of the power module 1A. FIG. 7 illustrates the internal structure of the power module 1A.

Figure 1:
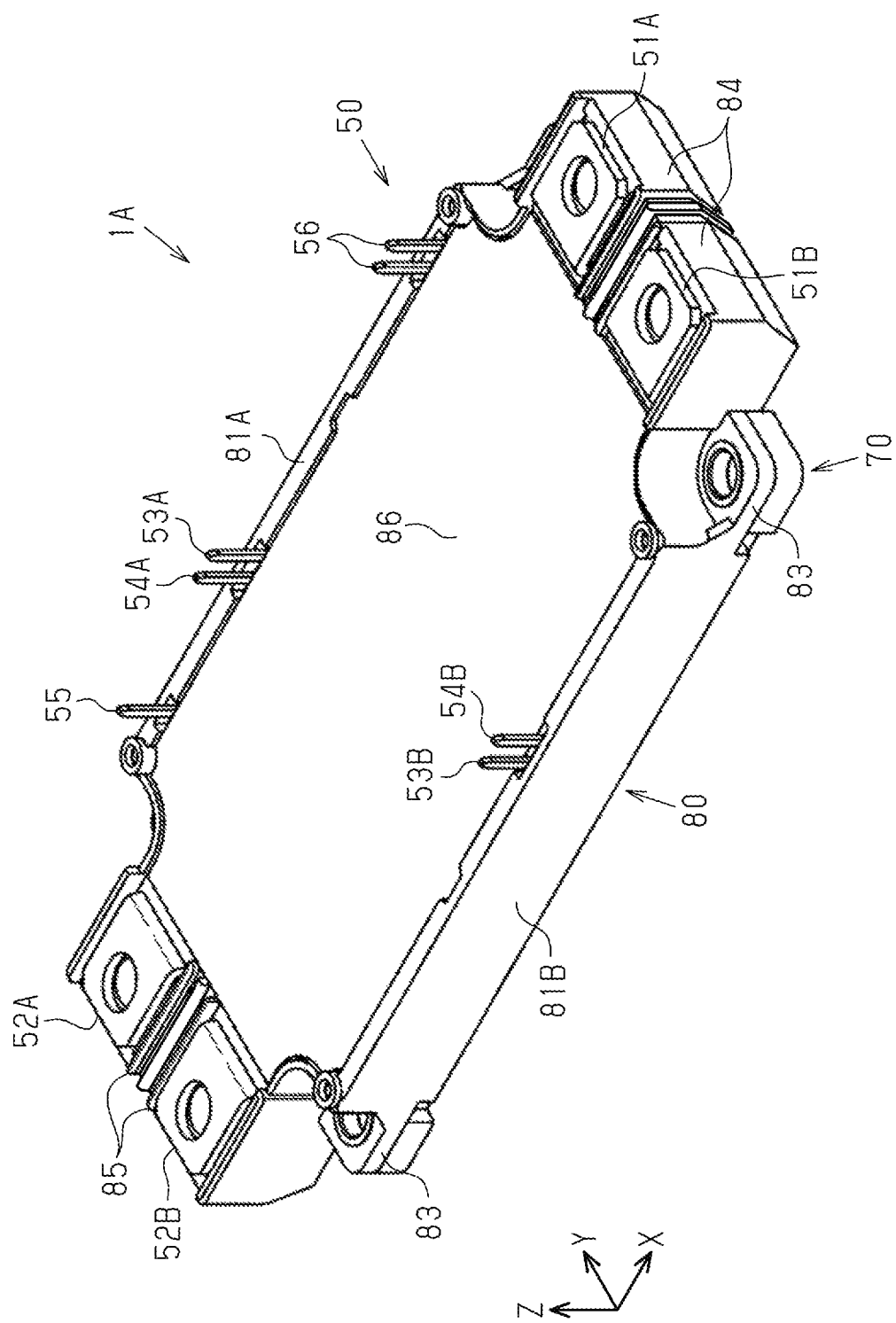
FIG. 1 is a perspective view of the power module in accordance with the first embodiment.
Figure 2:
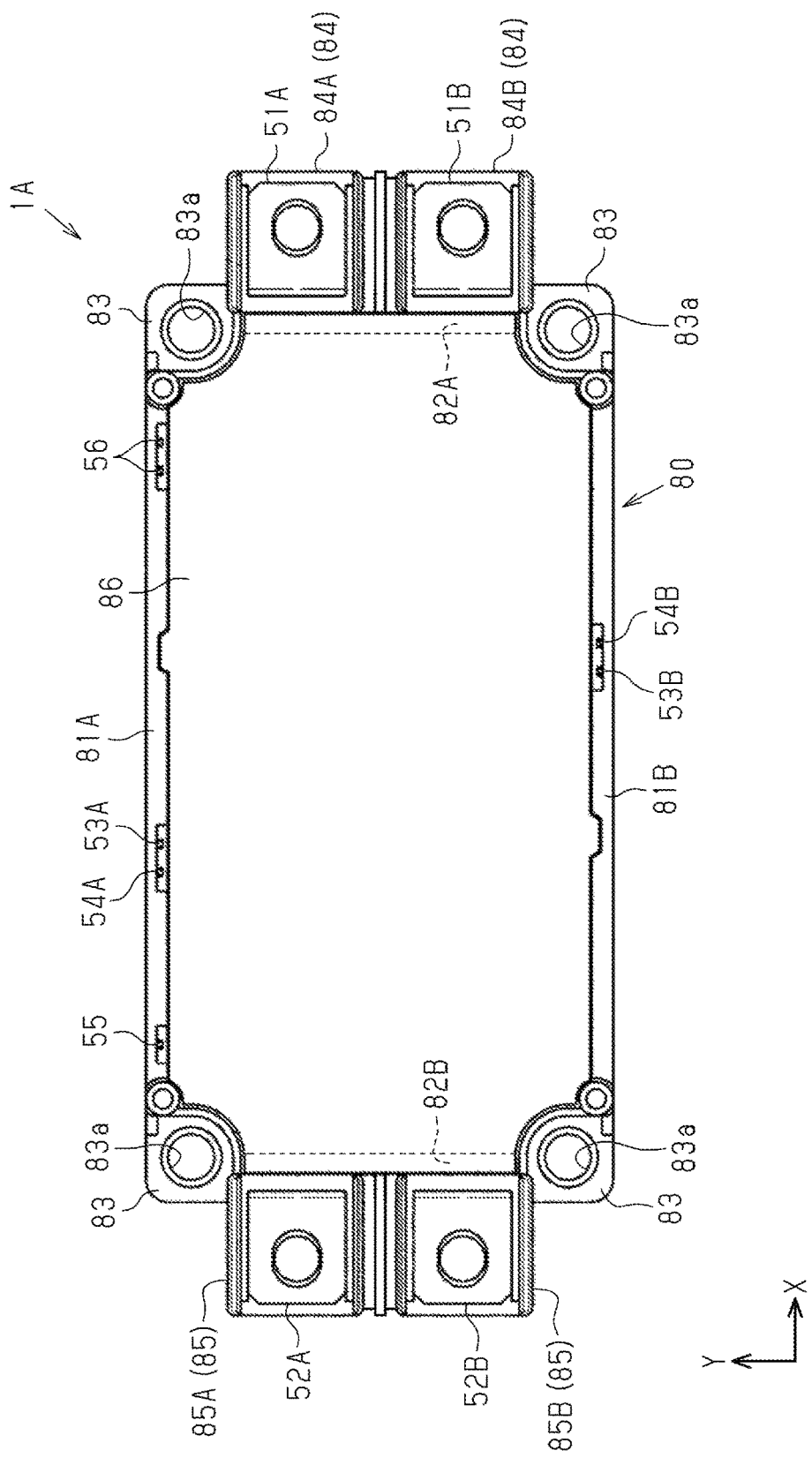
FIG. 2 is a plan view of the power module shown in FIG. 1.

As shown in FIGS. 1 to 7, the power module 1A mainly includes substrates 10, connecting members 20, power semiconductor elements 30, diodes 40, terminals 50, an encapsulation resin 60 (refer to FIG. 12), a heat dissipation plate 70 that is one example of a cooler, and a case 80 that accommodates these components. FIG. 7 does not show the encapsulation resin 60 for the sake of brevity. As shown in FIGS. 1 to 6, the substrates 10, the connecting members 20, the power semiconductor elements 30, the diodes 40, and the encapsulation resin 60 are arranged within the heat dissipation plate 70 and the case 80 and not exposed to the outside. The terminals 50 are accommodated in the case 80 in a state partially exposed or projected to the outside of the case 80 The power module 1A is used in, for example, in an inverter device. As shown in FIGS. 1 and 2, the power module 1A is rectangular as viewed in a thickness direction of the substrates 10 (hereafter, referred to as plan view). For the sake of brevity, the thickness direction of the substrates 10 will be referred to as "the thickness direction Z" and two directions that are orthogonal to each other and orthogonal to the thickness direction Z are respectively referred to as "the width direction X" and "the length direction Y." In the present embodiment, the power module 1A extends in a long-side direction that is the width direction X and a short-side direction that is the length direction Y.

Figure 8:
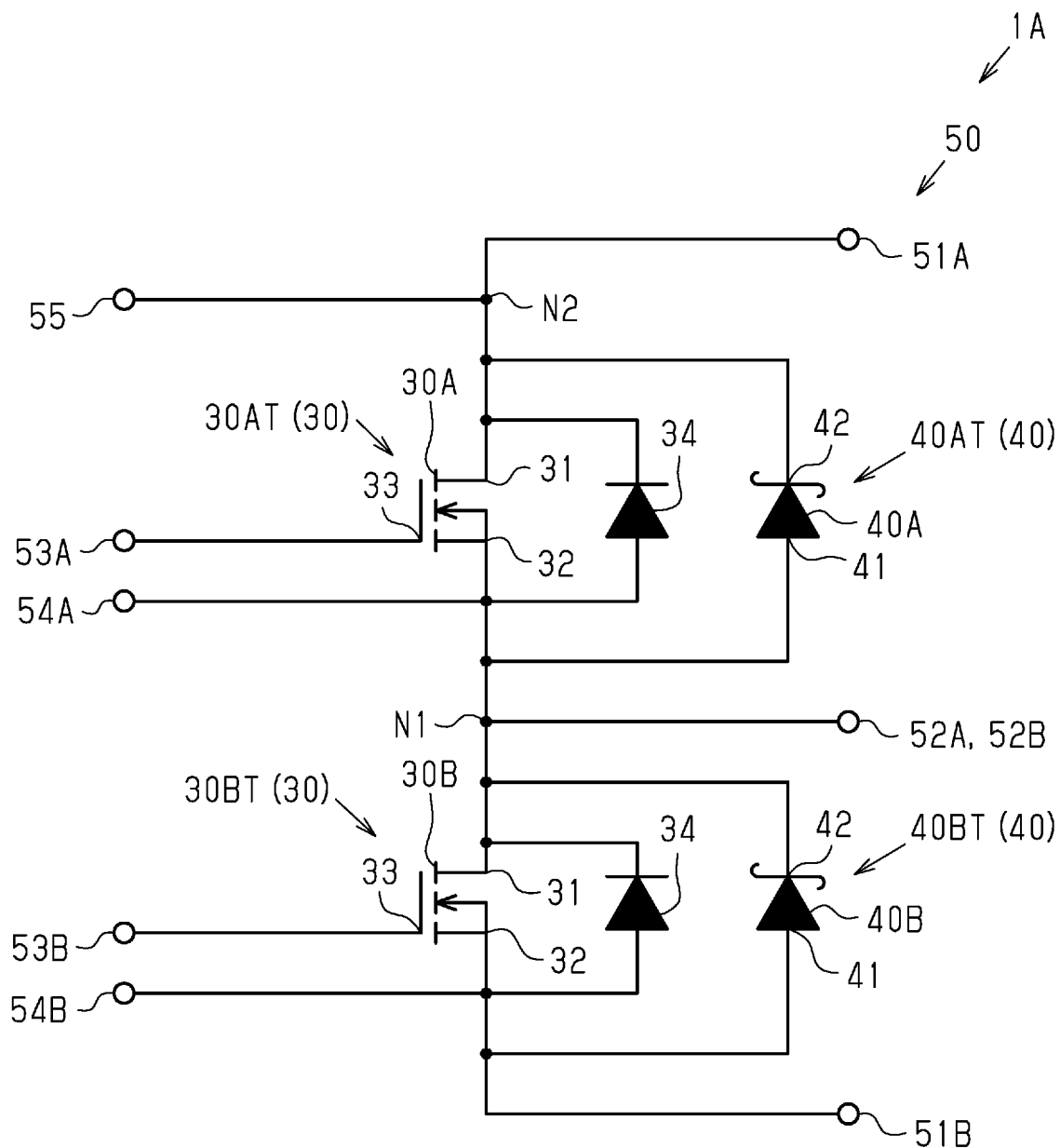
FIG. 8 is a plan view illustrating the internal structure of the power module shown in FIG. 1.

FIG. 8 shows the circuit configuration of the power module 1A in accordance with the present embodiment. The power module 1A includes a first power semiconductor element group 30AT of first power semiconductor elements 30A that are the power semiconductor elements 30, a second power semiconductor element group 30BT of the second power semiconductor elements 30B that are the power semiconductor elements 30, a first diode group 40AT of first diodes 40A that are the diodes 40, and a second diode group 40BT of second diodes 40B that are the diodes 40. For the sake of brevity, FIG. 8 shows one first power semiconductor element 30A of the first power semiconductor element group 30AT and one second power semiconductor element 30B of the second power semiconductor element group 30BT.

Each first power semiconductor element 30A of the first power semiconductor element group 30AT and each second power semiconductor element 30B of the second power semiconductor element group 30BT is used as a switching element. The power semiconductor elements 30A and 30B use, for example, transistors formed from silicon (Si) or silicon carbide (SiC), transistors formed from gallium nitride (GaN) or gallium arsenide (GaAs), transistors formed from gallium oxide ($Ga_2O_3$), or the like. The power semiconductor elements 30A and 30B that are formed from SiC are suited for high-speed operations. In the present embodiment, the power semiconductor elements 30A and 30B use n-type Metal-Oxide-Semiconductor Field-Effect Transistors (MOSFETs) formed from SiC. Each of the power semiconductor elements 30A and 30B is not limited to a MOSFET and may be a field effect transistor such as a Metal-Insulative Material-Semiconductor FET (MISFET) or a bipolar transistor such as an Insulated Gate Bipolar Transistor (IGBT). The power semiconductor elements 30A and 30B may be n-channel MOSFETs or p-channel MOSFETs.

Each of the power semiconductor elements 30A and 30B includes a drain electrode 31, a source electrode 32, and a gate electrode 33. Further, each of the power semiconductor elements 30A and 30B includes a body diode 34. The drain electrode 31 of each first power semiconductor element 30A is one example of the first back surface drive electrode recited in the claims, and the drain electrode 31 of each second power semiconductor element 30B is one example of the second back surface drive electrode recited in the claims. The source electrode 32 of each first power semiconductor element 30A is one example of the first main surface drive electrode recited in the claims, and the source electrode 32 of each second power semiconductor element 30B is one example of the second main surface drive electrode recited in the claims. The gate electrode 33 of each first power semiconductor element 30A and the gate electrode 33 of each second power semiconductor element 30B are each an example of the control electrode recited in the claims.

Although not shown in FIG. 8, the first power semiconductor elements 30A of the first power semiconductor element group 30AT are connected in parallel to each other. More specifically, the drain electrodes 31 of the first power semiconductor elements 30A are connected to one another, and the source electrodes 32 of the first power semiconductor elements 30A are connected to one another. Further, the second power semiconductor elements 30B of the second power semiconductor element group 30BT are connected in parallel to one another. More specifically, the drain electrodes 31 of the second power semiconductor elements 30B are connected to one another, and the source electrodes 32 of the second power semiconductor elements 30B. The first power semiconductor element group 30AT and the second power semiconductor element group 30BT are connected in series to each other. More specifically, the source electrodes 32 of the first power semiconductor element group 30AT (source electrodes 32 of the first power semiconductor elements 30A) are electrically connected to the drain electrodes 31 of the second power semiconductor element group 30BT (drain electrodes 31 of the second power semiconductor elements 30B). In this manner, in the present embodiment, the power module 1A forms an inverter circuit, the first power semiconductor element group 30AT forms an upper arm, and the second power semiconductor element group 30BT forms a lower arm.

Each of the diodes 40A and 40B includes an anode electrode 41 and a cathode electrode 42. The first diodes 40A of the first diode group 40AT are connected in antiparallel to the first power semiconductor elements 30A of the first power semiconductor element group 30AT, respectively. More specifically, the cathode electrode 42 of each first diode 40A is connected to the drain electrode 31 of the corresponding first power semiconductor element 30A, and the anode electrode 41 of each first diode 40A is connected to the source electrode 32 of the corresponding first power semiconductor element 30A. The second diodes 40B of the second diode group 40BT are connected in antiparallel to the second power semiconductor elements 30B of the second power semiconductor element group 30BT, respectively. More specifically, the cathode electrode 42 of each second diode 40B is connected to the drain electrode 31 of the corresponding second power semiconductor element 30B, and the anode electrode 41 of each second diode 40B is connected to the source electrode 32 of the corresponding second power semiconductor element 30B.

The drain electrodes 31, the source electrodes 32, and the gate electrodes 33 of the first power semiconductor elements 30A of the first power semiconductor element group 30AT and the second power semiconductor elements 30B of the second power semiconductor element group 30BT are connected to the terminals 50.

As shown in FIGS. 1, 2, and 8, the terminals 50 include a first input terminal 51A, a second input terminal 51B, a first output terminal 52A, a second output terminal 52B, a first control terminal 53A, a second control terminal 53B, a first detection terminal 54A, a second detection terminal 54B, a power current terminal 55, and two temperature terminals 56. The two temperature terminals 56 are electrically connected to the power semiconductor elements 30A and 30B and not shown in FIG. 8 for the sake of brevity. Each of the first output terminal 52A and the second output terminal 52B is an example of the output terminal recited in the claims.

The first input terminal 51A is electrically connected to the drain electrodes 31 of the first power semiconductor element group 30AT. More specifically, the first input terminal 51A is electrically connected to the drain electrode 31 of each first power semiconductor element 30A. The second input terminal 51B is electrically connected to the source electrodes 32 of the second power semiconductor element group 30BT. More specifically, the second input terminal 51B is electrically connected to the source electrode 32 of each second power semiconductor element 30B. The output terminals 52A and 52B are electrically connected to a node N1 between the source electrodes 32 of the first power semiconductor element group 30AT and the drain electrodes 31 of the second power semiconductor element group 30BT. More specifically, the output terminals 52A and 52B are electrically connected to the node N1 between the source electrodes 32 of the first power semiconductor elements 30A and the drain electrodes 31 of the second power semiconductor elements 30B. The first control terminal 53A is electrically connected to the gate electrodes 33 of the first power semiconductor element group 30AT. More specifically, the first control terminal 53A is electrically connected to the gate electrode 33 of each first power semiconductor element 30A. The second control terminal 53B is electrically connected to the gate electrodes 33 of the second power semiconductor element group 30BT. That is, the second control terminal 53B is connected to the gate electrode 33 of each second power semiconductor element 30B. The first detection terminal 54A is electrically connected to the source electrodes 32 of the first power semiconductor element group 30AT. More specifically, the first detection terminal 54A is electrically connected to the source electrode 32 of each first power semiconductor element 30A. The second detection terminal 54B is electrically connected to the source electrodes 32 of the second power semiconductor element group 30BT. More specifically, the second detection terminal 54B is electrically connected to the source electrode 32 of each second power semiconductor element 30B. The power current terminal 55 is electrically connected to a node N2 between the first input terminal 51A and the drain electrodes 31 of the first power semiconductor element group 30AT. More specifically, the power current terminal 55 is electrically connected to the node N2 between the first input terminal 51A and the drain electrodes 31 of each first power semiconductor element 30A. In the present embodiment, the control terminals 53A and 53B, the detection terminals 54A and 54B, the power current terminal 55, and the two temperature terminals 56 are electrically connected to a control circuit (not shown) located outside the power module 1A.

As shown in FIGS. 1 and 2, each of the terminals 51A, 51B, 52A, 52B, 53A, 53B, 54A, 54B, 55, and 56 are arranged on the case 80.

As shown in FIGS. 1, 2, and 7, the case 80 has the form of a frame surrounding the substrates 10, the connecting members 20, the power semiconductor elements 30, and the diodes 40 in plan view. The case 80 is formed from, for example, a synthetic resin such as polyphenylene sulfide (PPS) that is electrically insulative and has superior heat resistance. The case 80 includes two side walls 81A and 81B, two terminal seats 82A and 82B, attaching portions 83, a power terminal seat 84, and an output terminal seat 85.

Figure 3:
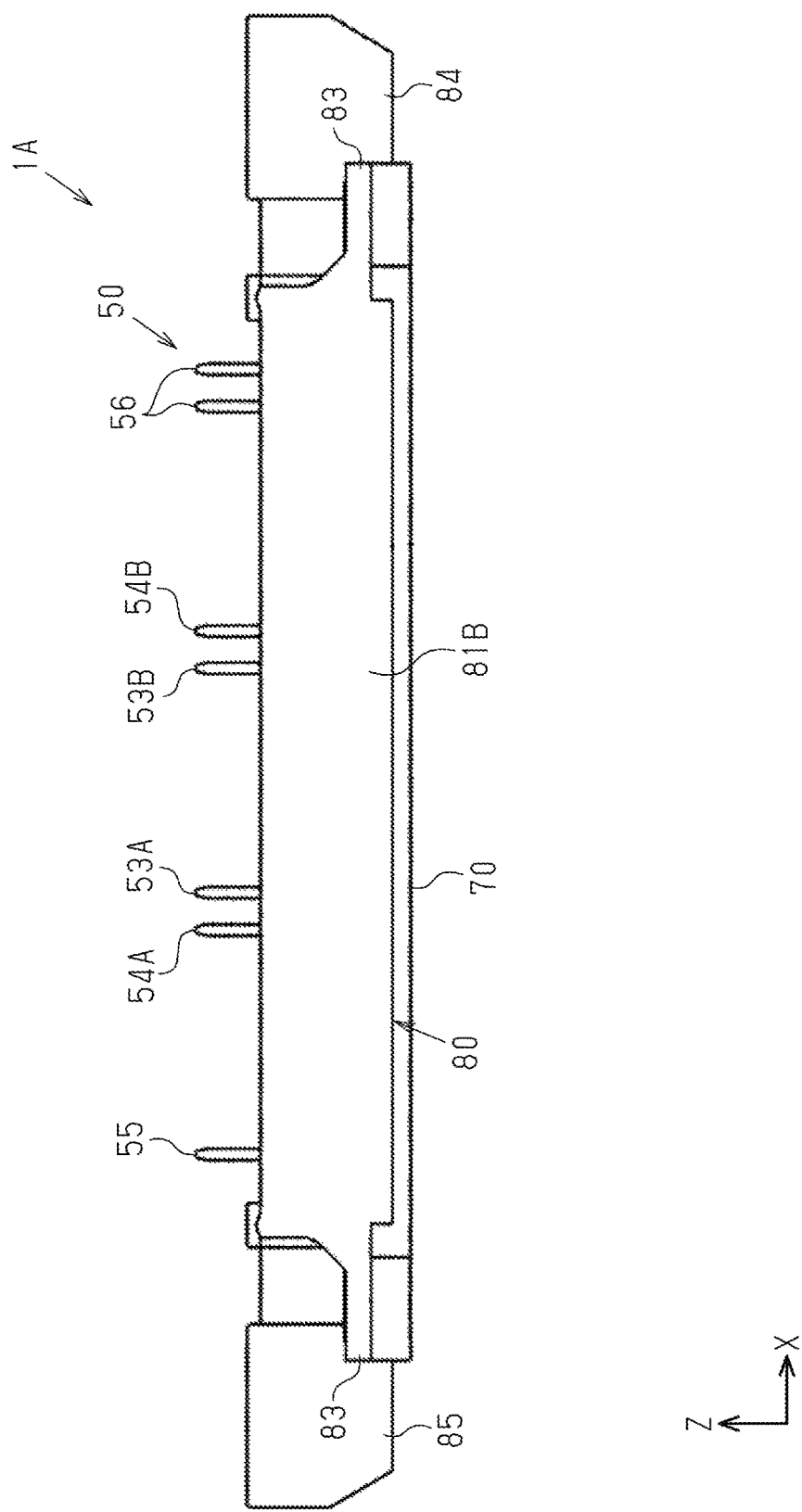
FIG. 3 is a side view of the power module shown in FIG. 1.
Figure 4:
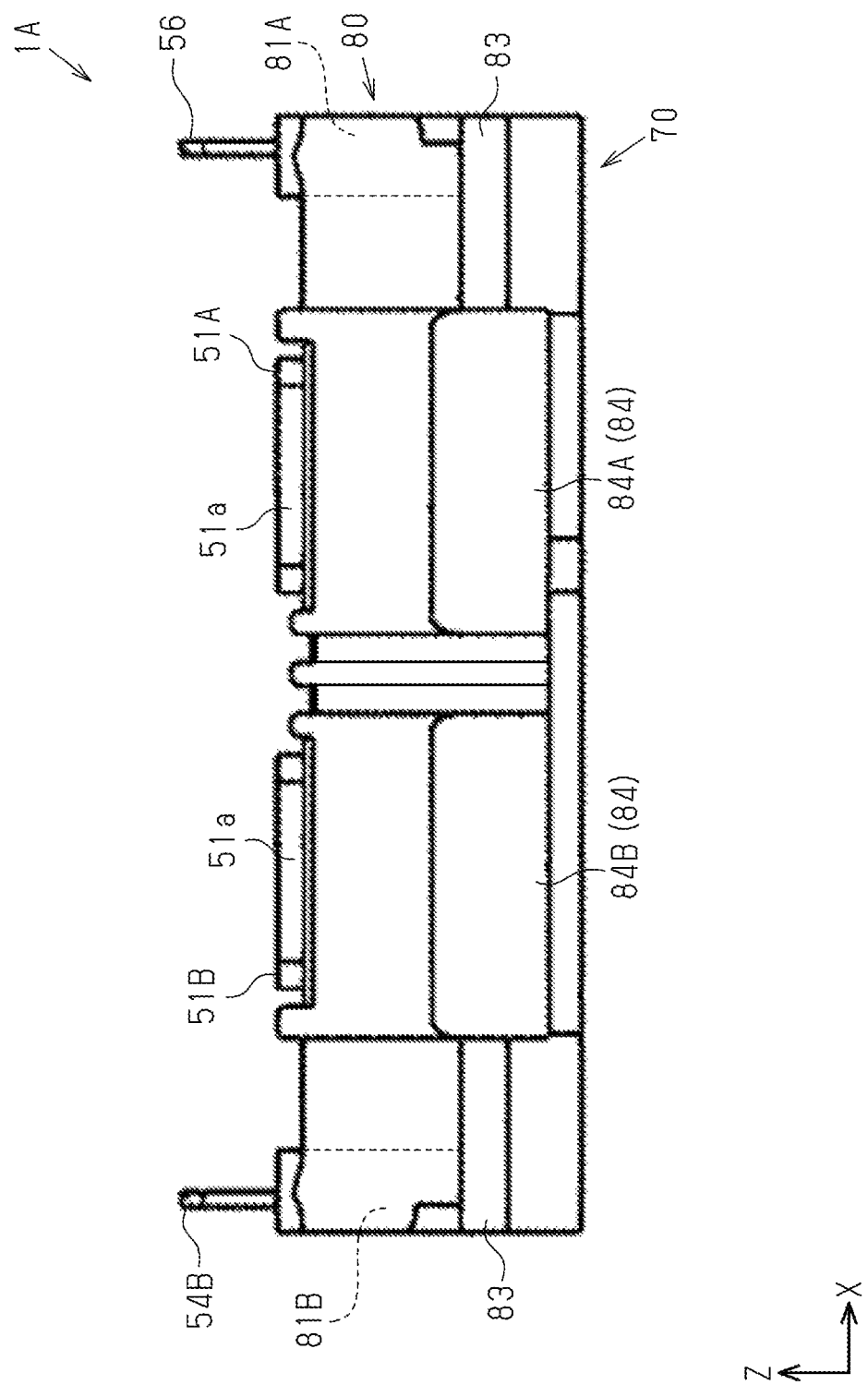
FIG. 4 is a side view of the power module shown in FIG. 1 taken from a direction that differs from the view of FIG. 3.
Figure 5:
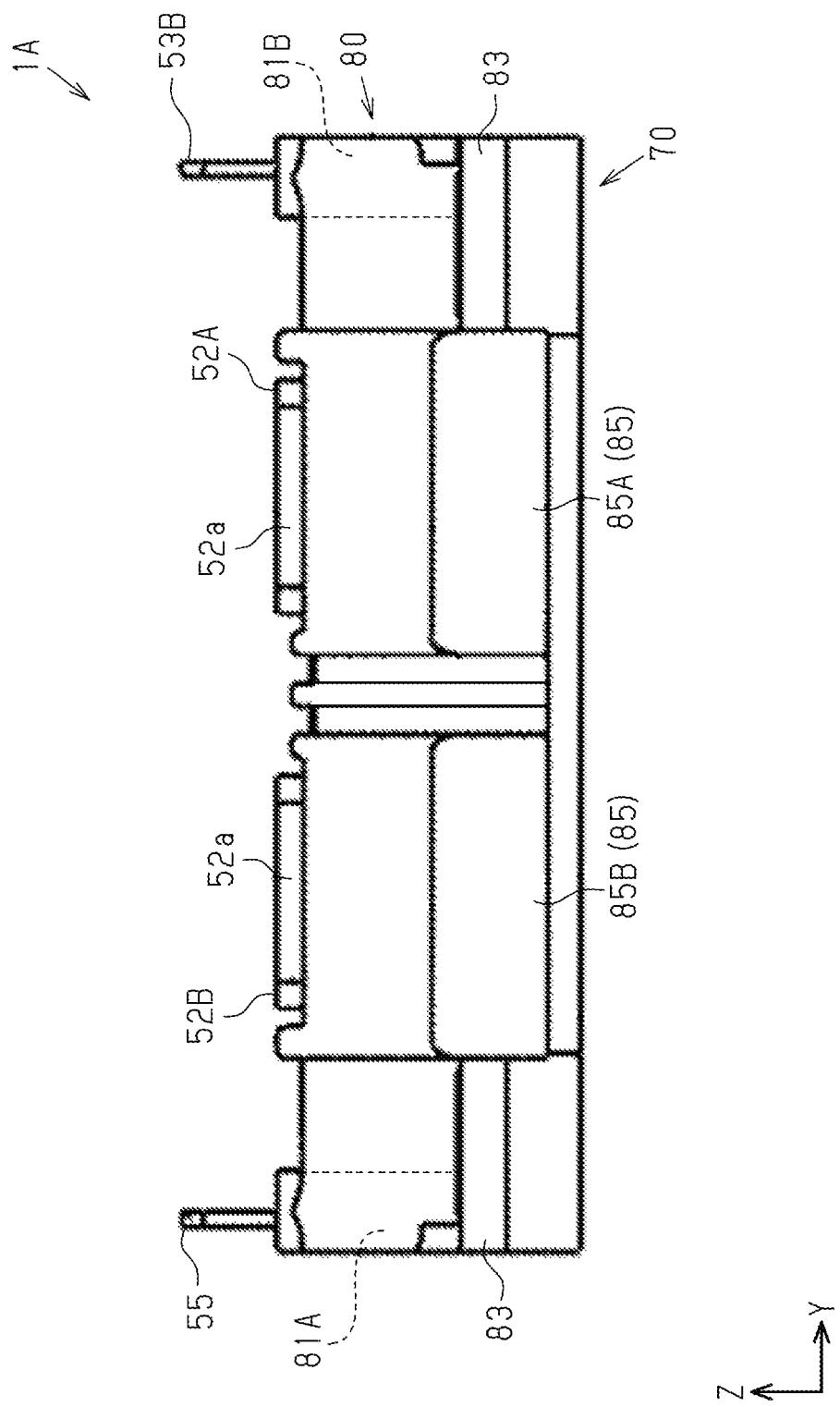
FIG. 5 is a side view of the power module shown in FIG. 1 taken from a direction that differs from the view of FIGS. 3 and 4.
Figure 6:
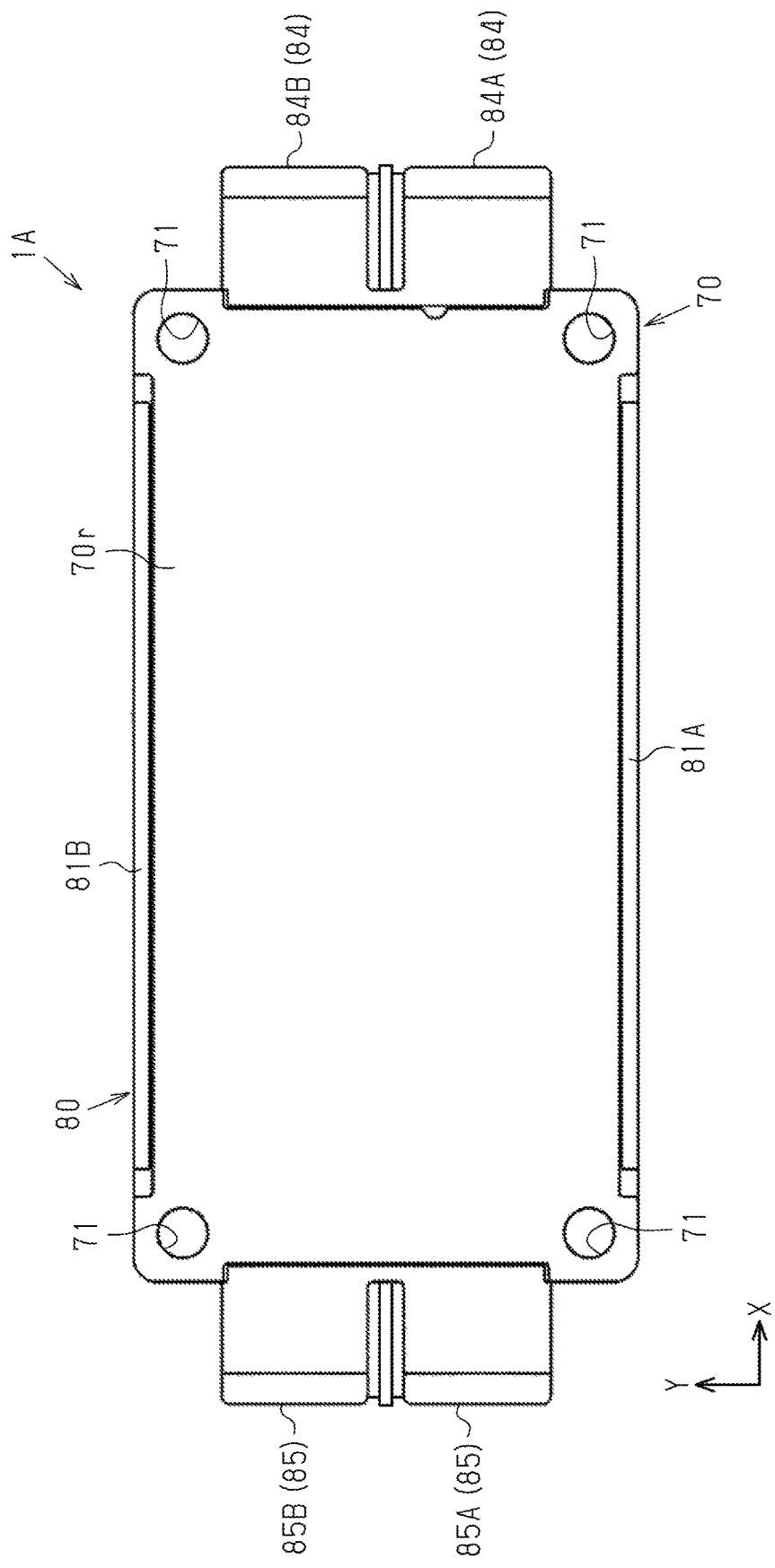
FIG. 6 is a bottom view of the power module shown in FIG. 1.
Figure 7:
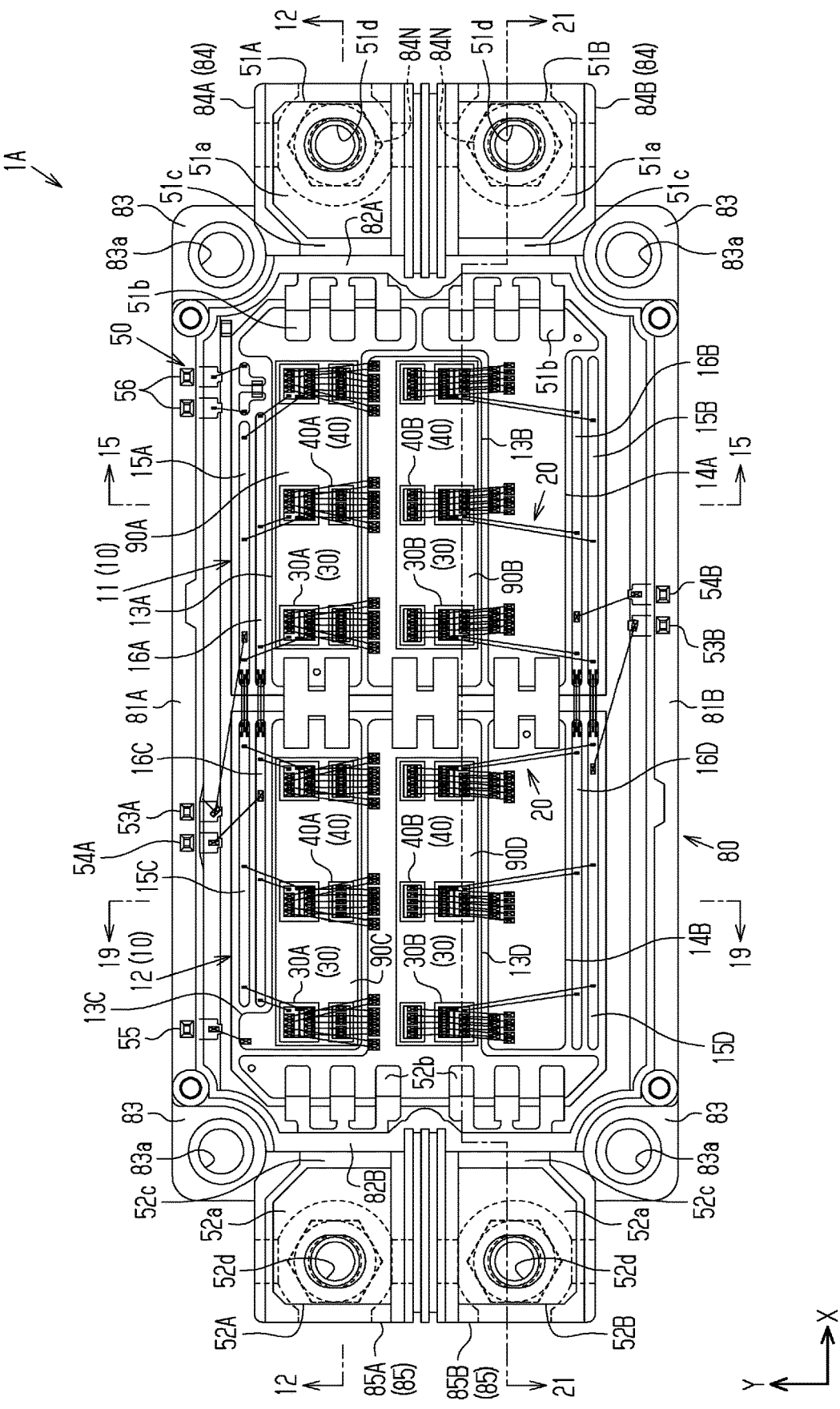
FIG. 7 is a plan view illustrating the internal structure of the power module shown in FIG. 1.

As shown in FIGS. 2, 6, and 7, the two side walls 81A and 81B extend in the width direction X and are spaced apart from each other in the length direction Y in plan view. As shown in FIGS. 3 to 5, the two side walls 81A and 81B extend in the thickness direction Z in side view. As shown in FIGS. 2 and 7, the first control terminal 53A, the first detection terminal 54A, the power current terminal 55, and the two temperature terminals 56 are arranged inside the side wall 81. The second control terminal 53B and the second detection terminal 54B are arranged inside the side wall 81B. The control terminals 53A and 53B, the detection terminals 54A and 54B, the power current terminal 55, and the two temperature terminals 56 are supported by the two side walls 81A and 81B. As shown in FIGS. 1 and 3, the control terminals 53A and 53B, the detection terminals 54A and 54B, the power current terminal 55, and the two temperature terminals 56 each project out of the two side walls 81A and 81B in the thickness direction Z. The control terminals 53A and 53B, the detection terminals 54A and 54B, the power current terminal 55, and the two temperature terminals 56 are each formed by, for example, a metal bar of copper (Cu). The surface of each metal bar is plated with, for example, tin (Sn). Nickel plating may be applied between the surface of the metal bar and the tin plating. The control terminals 53A and 53B, the detection terminals 54A and 54B, the power current terminal 55, and the two temperature terminals 56 are, for example, identically shaped and, in one example, each L-shaped so as to include a first portion extending in the length direction Y and a second portion extending in the thickness direction Z.

As shown in FIGS. 2 and 7, the two terminal seats 82A and 82B are joined with the two ends of each of the two side walls 81A and 81B in the width direction X. The two side walls 81A and 81B and the two terminal seats 82A and 82B form a frame surrounding the substrates 10, the connecting members 20, the power semiconductor elements 30, and the diodes 40. The two terminal seats 82A and 82B are spaced apart from each other in the width direction X. The power terminal seat 84 is joined with the terminal seat 82A and projects outward from the terminal seat 82A in the width direction X. The output terminal seat 85 is joined with the terminal seat 82B and projects outward from the terminal seat 82B in the width direction X.

Figure 12:
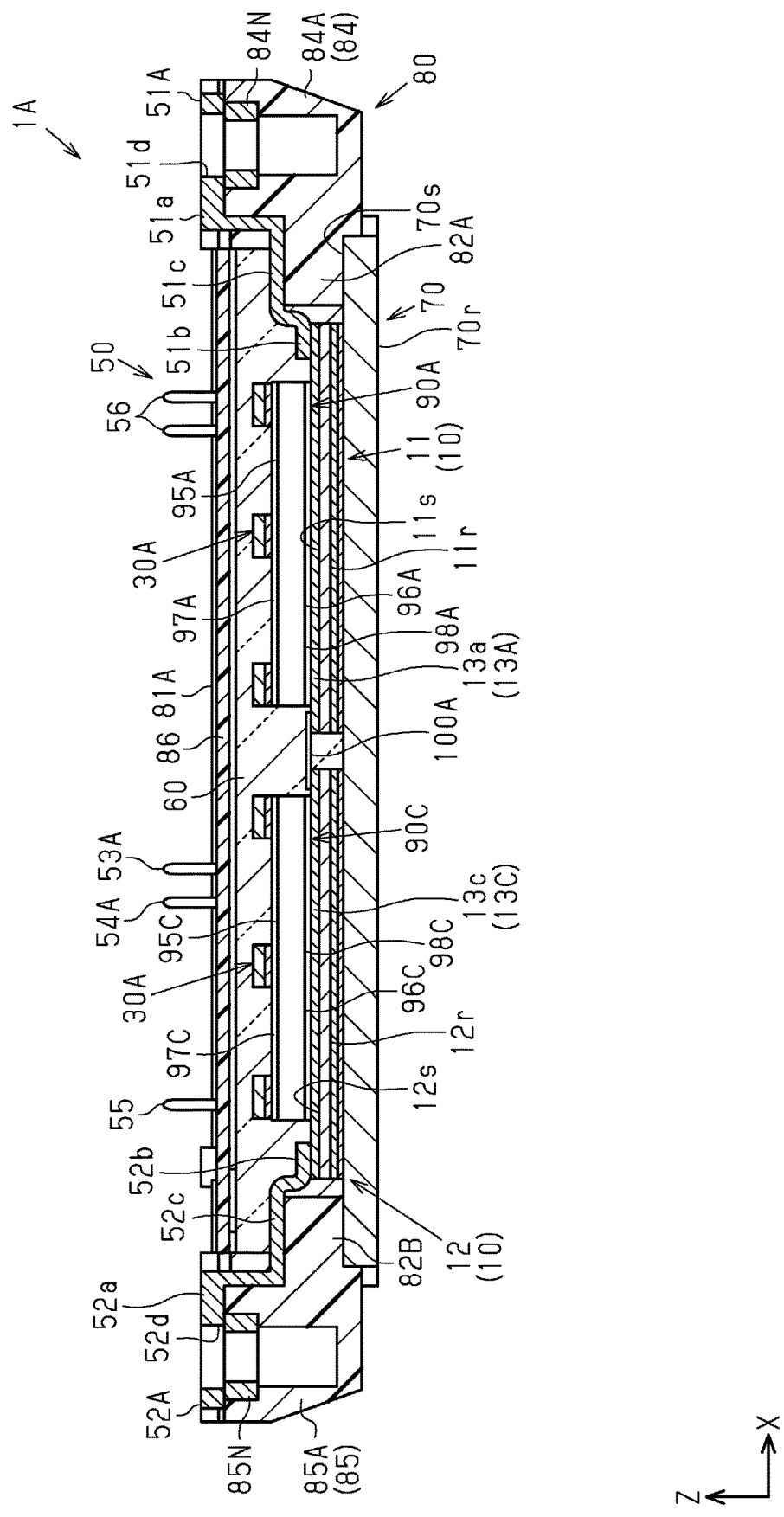
FIG. 12 is a cross-sectional view taken along line 12-12 in FIG. 7.

As shown in FIGS. 2, 4, and 7, the power terminal seat 84 includes a first terminal seat 84A and a second terminal seat 84B. The first terminal seat 84A and the second terminal seat 84B are aligned in the width direction X and arrayed in the length direction Y. Part of the first input terminal 51A is arranged on the first terminal seat 84A. The first terminal seat 84A supports part of the first input terminal 51A. The second terminal seat 84B supports part of the second input terminal 51B. The second terminal seat 84B supports part of the second input terminal 51B. As shown in FIGS. 7 and 12, a nut 84N is arranged inside the first terminal seat 84A. Further, as shown in FIG. 7, in the same manner as the first terminal seat 84A, a nut 84N is also arranged inside the second terminal seat 84B.

As shown in FIG. 7, the first input terminal 51A and the second input terminal 51B are shaped identically. Each of the input terminals 51A and 51B includes an exposed portion 51a that is exposed to the outside of the power module 1A, a connecting portion 51b that is electrically connected to the power semiconductor elements 30A and 30B, and a coupling portion 51c that couples the exposed portion 51a and the connecting portion 51b. In the present embodiment, each of the input terminals 51A and 51B is a single component in which the exposed portion 51a, the connecting portion 51b, and the coupling portion 51c are formed integrally. The exposed portion 51a includes a through hole 51d extending through the exposed portion 51a in the thickness direction Z. As shown in FIG. 12, the first input terminal 51A has a stepped form. The exposed portion 51a of the first input terminal 51A is supported by the first terminal seat 84A. The exposed portion 51a of the second input terminal 51Ba is supported by the second terminal seat 84B. As shown in FIG. 7, the through hole 51d is arranged in the exposed portion 51a of the first input terminal 51A in correspondence with the nut 84N of the first terminal seat 84A. The through hole 51d is arranged in the exposed portion 51a of the second input terminal 51Ba in correspondence with the nut 84N of the second terminal seat 84B. There is more than one connecting portion 51b. The connecting portions 51b are spaced apart in the length direction Y.

As shown in FIGS. 2, 5, and 7, the output terminal seat 85 includes a first terminal seat 85A and a second terminal seat 85B. The first terminal seat 85A and the second terminal seat 85B are aligned in the width direction X and arrayed in the length direction Y. Part of the first output terminal 52A is arranged on the first terminal seat 85A. The first terminal seat 85A supports part of the first output terminal 52A. Part of the second output terminal 52B is arranged on the second terminal seat 85B. The second terminal seat 85B supports part of the second output terminal 52B. As shown in FIGS. 7 and 12, a nut 85N is arranged inside the first terminal seat 85A. Further, as shown in FIG. 7, in the same manner as the first terminal seat 85A, a nut 85N is also arranged inside the second terminal seat 85B.

As shown in FIG. 7, the first output terminal 52A and the second output terminal 52B are shaped identically. In the present embodiment, the output terminals 52A and 52B and the input terminals 51A and 51B are shaped identically. Each of the output terminals 52A and 52B includes an exposed portion 52a that is exposed to the outside of the power module 1A, a connecting portion 52b that is electrically connected to the power semiconductor elements 30A and 30B, and a coupling portion 52c that couples the exposed portion 52a and the connecting portion 52b. In the present embodiment, each of the output terminals 52A and 52B is a single component in which the exposed portion 52a, the connecting portion 52b, and the coupling portion 52c are formed integrally. The exposed portion 52a includes a through hole 52d extending through the exposed portion 52a in the thickness direction Z. As shown in FIG. 12, the first output terminal 52A has a stepped form. The exposed portion 52a of the first output terminal 52A is supported by the first terminal seat 85A. The exposed portion 52a of the second output terminal 52B is supported by the second terminal seat 85B. As shown in FIG. 7, the through hole 52d is arranged in the exposed portion 52a of the first output terminal 52A in correspondence with the nut 85N of the first terminal seat 85A. The through hole 52d is arranged in the exposed portion 52a of the second output terminal 52B in correspondence with the nut 85N of the second terminal seat 85B. There is more than one connecting portion 52b. The connecting portions 52b are spaced apart in the length direction Y.

As shown in FIGS. 3 and 6, the heat dissipation plate 70 that is attached to the case 80 closes an open end of the case 80 in the thickness direction Z. The heat dissipation plate 70 is formed from, for example, alumina ($Al_2O_3$). The heat dissipation plate 70 may be formed by a metal plate of Cu. In this case, the surface of the metal plate may be plated with nickel. As shown in FIG. 12, the heat dissipation plate 70 includes a heat dissipation main surface 70s and a heat dissipation back surface 70r at opposite sides in the thickness direction Z. The heat dissipation back surface 70r is exposed to the outside of the power module 1A. As shown in FIG. 6, the heat dissipation plate 70 includes support holes 71, each extending in the thickness direction Z through one of the four corners of the heat dissipation plate 70 in plan view.

As shown in FIG. 2, the attaching portions 83 are arranged in the four corners of the case 80 in plan view. Each attaching portion 83 includes an attaching hole 83a extending through the attaching portions 83 in the thickness direction Z. The attaching portions 83 overlap the four corners of the heat dissipation plate 70 as viewed in the thickness direction Z. Thus, the attaching holes 83a correspond to the support holes 71 of the heat dissipation plate 70 (refer to FIG. 6). The heat dissipation plate 70 is supported by the case 80 by fastening members such as pins that are fitted into the attaching holes 83a and the support holes 71.

As shown in FIGS. 1 and 2, the case 80 includes a top plate 86. The top plate 86 closes the inside of the power module 1A defined by the heat dissipation plate 70, the two side walls 81A and 81B, and the two terminal seats 82A and 82B. As shown in FIGS. 2 and 12, the top plate 86 is supported by the two side walls 81A and 81B in a state spaced apart from the heat dissipation plate 70 and the substrates 10 in the thickness direction Z.

With reference to FIGS. 7 and 9 to 25, the configuration inside the power module 1A will now be described in detail.

As shown in FIG. 12, the inside of the power module 1A is enclosed by the two side walls 81A and 81B and the two terminal seats 82A and 82B of the case 80 and has one end in the thickness direction Z closed by the heat dissipation plate 70. The substrates 10, the connecting members 20, the power semiconductor elements 30, the diodes 40, and the encapsulation resin 60 are accommodated inside the power module 1A.

The inside of the power module 1A, which is closed by the heat dissipation plate 70 and the top plate 86, is filled with the encapsulation resin 60 that is formed from an electrically insulative resin material. the encapsulation resin 60 encapsulates the substrates 10, the connecting members 20, the power semiconductor elements 30, and the diodes 40.

The substrates 10 are bonded to the heat dissipation main surface 70s of the heat dissipation plate 70 by, for example, a silver (Ag) paste, solder, or the like. The bonding material does not have to be a conductive bonding material such as a silver paste or solder and may be an electrically insulative bonding material. The substrates 10 include a first substrate 11 and a second substrate 12. The first substrate 11 and the second substrate 12 are aligned in the length direction Y and spaced apart in the width direction X. The first substrate 11 is located toward the input terminals 51A and 51B in the width direction X inside the power module 1A, and the second substrate 12 is located toward the output terminals 52A and 52B in the width direction X inside the power module 1A. The first substrate 11 includes a first substrate main surface 11s and a first substrate back surface 11r at opposite sides in the thickness direction Z. The second substrate 12 includes a second substrate main surface 12s and a second substrate back surface 12r at opposite sides in the thickness direction Z. Each of the first substrate main surface 11s and the second substrate main surface 12s is an example of the substrate main surface recited in the claims, and each of the first substrate back surface 11r and the second substrate back surface 12r is an example of the substrate back surface recited in the claims.

Each of the substrates 11 and 12 is an electrically insulative member including a mounting layer for mounting the power semiconductor elements 30 and the diodes 40 on the substrates 11 and 12 and a conductive layer electrically connected to the power semiconductor elements 30 and the diodes 40. The substrates 11 and 12 are each formed from, for example, a ceramic having excellent thermal conductivity. Examples of such a ceramic includes alumina ($Al_2O_3$), $Al_2O_3$ including zirconium oxide (ZrO), aluminum nitride (AlN), silicon nitride (SiN), and the like. The use of $Al_2O_3$ including ZrO as the ceramic increases the mechanical strength of the substrates 11 and 12 and lowers the cost for manufacturing the substrates 11 and 12. The substrates 11 and 12 may be formed from, for example, a resin material. Examples of the resin material include epoxy resin, an epoxy resin including a reinforcement material such as glass cloth, and the like. The substrates 11 and 12 may each be formed by a direct bonding copper (DBC) substrate that bonds a copper (Cu) foil on each of the substrate main surfaces 11s and 12s and the substrate back surfaces 11r and 12r. The use of DBC substrates allows for patterning of the copper foils bonded to the substrate main surfaces 11s and 12s and facilitates formation of the mounting layers and the conductive layers. The copper foils bonded to the substrate back surfaces 11r and 12r may serve as thermal conduction layers.

Figure 9:
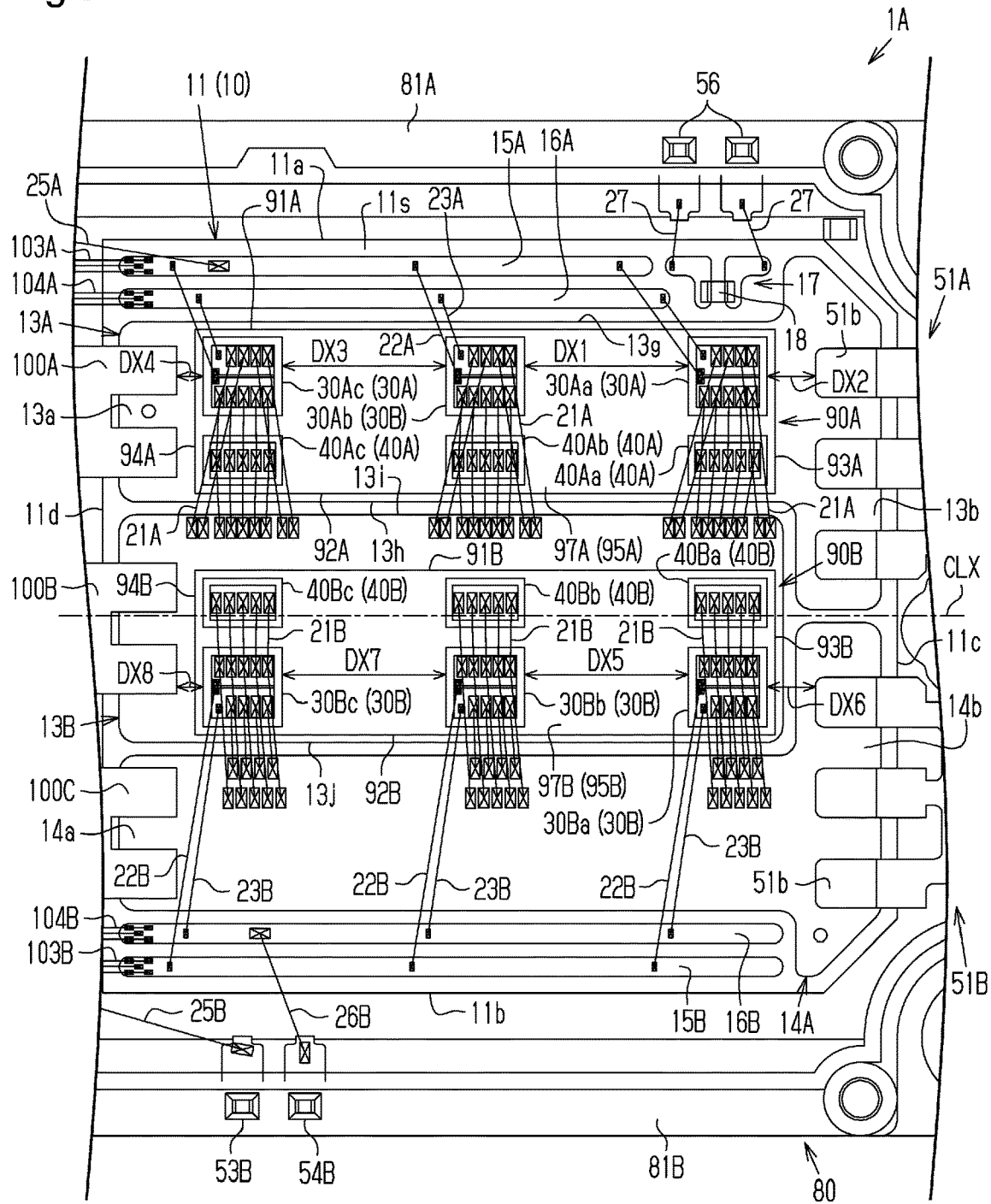
FIG. 9 is a partially enlarged view of FIG. 7.

As shown in FIGS. 7 and 9, the shape of the first substrate 11 in plan view is rectangular so that the width direction X is the long-side direction and the length direction Y is the short-side direction. As shown in FIG. 9, the first substrate 11 mainly includes a first side surface 11a, a second side surface 11b, a third side surface 11c, and a fourth side surface 11d. The first side surface 11a and the second side surface 11b are located at opposite sides in the length direction Y and extend in the width direction X. The first side surface 11a of the first substrate 11 is located toward the side wall 81A, and the second side surface 11b of the first substrate 11 is located toward the side wall 81B. The third side surface 11c and the fourth side surface 11d are located at opposite sides in the width direction X and extend in the length direction Y. The third side surface 11c of the first substrate 11 is located toward the terminal seat 82A, and the fourth side surface 11d of the first substrate 11 is located toward the terminal seat 82B (refer to FIG. 7).

As shown in FIG. 9, a first mounting layer 13A and second mounting layer 13B, each of which is an example of a mounting layer, a conductive layer 14A, a first control layer 15A and second control layer 15B, each of which is one example of a control layer, a first detection layer 16A and second detection layer 16B, and a thermistor mounting layer 17 are arranged on the first substrate main surface 11s of the first substrate 11.

The first mounting layer 13A, the second mounting layer 13B, and the conductive layer 14A are spaced apart in the length direction Y. The first mounting layer 13A is arranged toward the first side surface 11a of the first substrate 11 from the second mounting layer 13B and the conductive layer 14A in the length direction Y. The conductive layer 14A is arranged toward the second side surface 11b of the first substrate 11 from the first mounting layer 13A and the second mounting layer 13B in the length direction Y. The second mounting layer 13B is located between the first mounting layer 13A and the conductive layer 14A in the length direction Y.

The first mounting layer 13A includes a main mounting portion 13a, which has the form of a strip extending in the width direction X, and a connecting portion 13b, which extends from the end of the main mounting portion 13a that is located toward the third side surface 11c of the first substrate 11 in the width direction X. In the present embodiment, the first mounting layer 13A is a single component in which the main mounting portion 13a and the connecting portion 13b are formed integrally. The connecting portion 13b extends in the length direction Y and projects from opposite sides of the main mounting portion 13a in the length direction Y. The connecting portion 13b is arranged next to the terminal seat 82A (refer to FIG. 7), or the first input terminal 51A, in the width direction X. The connecting portions 51b of the first input terminal 51A are connected to the connecting portion 13b.

The conductive layer 14A includes a main conductive portion 14a, which has the form of a strip extending in the width direction X, and a connecting portion 14b, which extends from the end of the main conductive portion 14a located toward the third side surface 11c of the first substrate 11 in the width direction X. In the present embodiment, the conductive layer 14A is a single component in which the main conductive portion 14a and the connecting portion 14b are formed integrally. The connecting portion 14b extends in the length direction Y and projects from opposite sides of the main conductive portion 14a in the length direction Y. The width of the main conductive portion 14a (dimension of main conductive portion 14a in length direction Y) is less than the width of the main mounting portion 13a of the first mounting layer 13A (dimension of main mounting portion 13a) in the length direction Y. The connecting portion 14b is arranged next to the connecting portion 13b of the first mounting layer 13A in the length direction Y. Further, the connecting portion 14b is arranged next to the terminal seat 82A, or the second input terminal 51B, in the width direction X. The connecting portions 51b of the second input terminal 51B are connected to the connecting portion 14b.

The second mounting layer 13B is arranged toward the fourth side surface 11d of the first substrate 11 from the connecting portion 13b of the first mounting layer 13A and the connecting portion 14b of the conductive layer 14A in the width direction X. The second mounting layer 13B has the form of a strip extending in the width direction X in plan view. The second mounting layer 13B is located between the main mounting portion 13a of the first mounting layer 13A and the main conductive portion 14a of the conductive layer 14A in the length direction Y. In the present embodiment, the second mounting layer 13B is located toward the second side surface 1b of the first substrate 11 in the length direction Y. In detail, a middle portion of the second mounting layer 13B in the length direction Y is located toward the second side surface 1b in the length direction Y from a center line CLX that extends from a middle portion of the first substrate 11 in the width direction X. In the present embodiment, the edge of the second mounting layer 13B located toward the fourth side surface 11d in the width direction X, the edge of the main mounting portion 13a of the first mounting layer 13A located toward the fourth side surface 11d in the width direction X, and the edge of the main conductive portion 14a of the conductive layer 14A located toward the fourth side surface 11d in the width direction X are aligned in the length direction Y. The width of the second mounting layer 13B (dimension of second mounting layer 13B in length direction Y) is greater than the width of the main mounting portion 13a of the first mounting layer 13A (dimension of main mounting portion 13a in length direction Y) and the width of the main conductive portion 14a of the conductive layer 14A (dimension of main conductive portion 14a in length direction Y).

The first control layer 15A and the first detection layer 16A are each located toward the first side surface 11a of the first substrate 11 from the main mounting portion 13a of the first mounting layer 13A in the length direction Y Further, the first control layer 15A and the first detection layer 16A are each located toward the fourth side surface 11d of the first substrate 11 from the connecting portion 13b of the first mounting layer 13A in the width direction X. The first control layer 15A and the first detection layer 16A each have the form of a fine strip extending in the width direction X in plan view. The first control layer 15A and the first detection layer 16A are spaced apart in the length direction Y. The first detection layer 16A is located toward the main mounting portion 13a of the first mounting layer 13A from the first control layer 15A. In other words, the first control layer 15A is located toward the first side surface 11a of the first substrate 11 from the first detection layer 16A. The first control layer 15A overlaps the first detection layer 16A as viewed in the length direction Y. The length of the first detection layer 16A in the width direction X is greater than the length of the first control layer 15A in the width direction X. The end of the first detection layer 16A located toward the fourth side surface 11d of the first substrate 11 in the width direction X and the end of the first control layer 15A located toward the fourth side surface 11d of the first substrate 11 in the width direction X are aligned in the length direction Y. The end of the first detection layer 16A, which is located toward the third side surface 11c of the first substrate 11 in the width direction X, is located toward the third side surface 11c from the end of the first control layer 15A, which is located toward the third side surface 11c in the width direction X.

The second control layer 15B and the second detection layer 16B are each located toward the second side surface 11b of the first substrate 11 from the main conductive portion 14a of the conductive layer 14A in the length direction Y. Further, the second control layer 15B and the second detection layer 16B are each located toward the fourth side surface 11d of the first substrate 11 from the connecting portion 14b of the conductive layer 14A in the width direction X. In this manner, the main mounting portion 13a of the first mounting layer 13A, the second mounting layer 13B, and the main conductive portion 14a of the conductive layer 14A are sandwiched between the first control layer 15A and first detection layer 16A and the second control layer 15B and second detection layer 16B in the length direction Y in plan view. In other words, the first control layer 15A and first detection layer 16A and the second control layer 15B and second detection layer 16B are located at opposite sides of the main mounting portion 13a of the first mounting layer 13A, the second mounting layer 13B, and the main conductive portion 14a of the conductive layer 14A in the length direction Y. The second control layer 15B and the second detection layer 16B each have the form of a fine strip extending in the width direction X in plan view. The second control layer 15B and the second detection layer 16B are spaced apart in the length direction Y. The second detection layer 16B is located toward the main conductive portion 14a of the conductive layer 14A from the second control layer 15B. In other words, the second control layer 15B is located toward the second side surface 11b of the first substrate 11 from the second detection layer 16B. The second detection layer 16B overlaps the second control layer 15B as viewed in the length direction Y. The second detection layer 16B overlaps the main conductive portion 14a of the conductive layer 14A as viewed in the length direction Y. The end of the second detection layer 16B located toward the third side surface 11c of the first substrate 11 in the width direction X and the end of the second control layer 15B located toward the third side surface 11c of the first substrate 11 in the width direction X are aligned in the length direction Y. Further, the end of the second detection layer 16B located toward the fourth side surface 11d of the first substrate 11 in the width direction X and the end of the second control layer 15B located toward the fourth side surface 11d of the first substrate 11 in the width direction X are aligned in the length direction Y. The length of the second control layer 15B in the width direction X is equal to the length of the second detection layer 16B in the width direction X. The length of each of the second control layer 15B and the second detection layer 16B in the width direction X is greater than the length of each of the first control layer 15A and the first detection layer 16A in the width direction X.

The thermistor mounting layer 17 is located toward the first side surface 11a of the first substrate 11 from the main mounting portion 13a of the first mounting layer 13A in the length direction Y. Further, the thermistor mounting layer 17 overlaps the connecting portion 13b of the first mounting layer 13A, the first control layer 15A, and the first detection layer 16A as viewed in the width direction X. The thermistor mounting layer 17 is located between the first control layer 15A and first detection layer 16A and the connecting portion 13b of the first mounting layer 13A in the width direction X.

A thermistor 18, which is a temperature detection element, may be mounted on the thermistor mounting layer 17. In the present embodiment, the thermistor 18 is mounted on the thermistor mounting layer 17. The thermistor mounting layer 17 includes two portions spaced apart from each other in the width direction X. One portion is electrically connectable to a positive electrode of the thermistor 18, and the other portion is electrically connected to a negative electrode of the thermistor 18.

Figure 10:
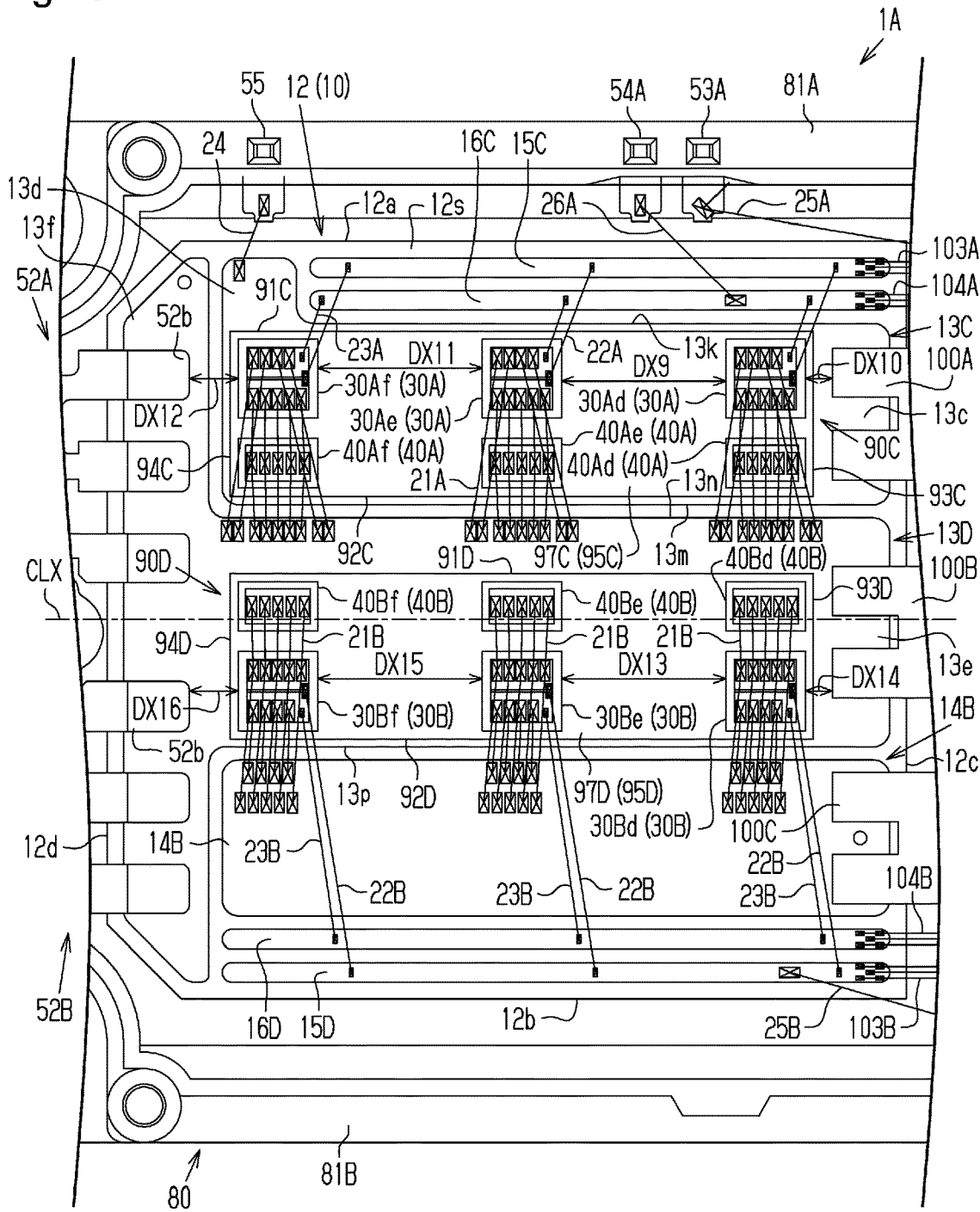
FIG. 10 is a partially enlarged view of FIG. 7.

As shown in FIGS. 7 and 10, the shape of the second substrate 12 in plan view is rectangular so that the width direction X is the long-side direction and the length direction Y is the short-side direction. In the present embodiment, the second substrate 12 is symmetric in shape to the first substrate 11 with respect to a center line extending in the length direction Y. The second substrate 12 and the first substrate 11 are sized equally in the width direction X, the length direction Y, and the thickness direction Z. The second substrate 12 mainly includes a first side surface 12a, a second side surface 12b, a third side surface 12c, and a fourth side surface 12d. The first side surface 12a and the second side surface 12b are located at opposite sides in the length direction Y and extend in the width direction X. The first side surface 12a of the second substrate 12 is located toward the side wall 81, and the second side surface 12b of the second substrate 12 is located toward the side wall 81B. The third side surface 12c and the fourth side surface 12d are located at opposite sides in the width direction X and extend in the length direction Y. The third side surface 12c of the second substrate 12 is located toward the terminal seat 82A (refer to FIG. 7), and the fourth side surface 12d of the second substrate 12 is located toward the terminal seat 82B (refer to FIG. 7). The second substrate 12 does not have to be symmetric in shape to the first substrate 11, and the second substrate 12 may differ in size from the first substrate 11.

As shown in FIG. 10, a first mounting layer 13C and second mounting layer 13D, each of which is an example of a mounting layer, a conductive layer 14B, a first control layer 15C and second control layer 15D, each of which is an example of a control layer, and a first detection layer 16C and second detection layer 16D are arranged on the second substrate main surface 12s of the second substrate 12.

the first mounting layer 13C, the second mounting layer 13D, and the conductive layer 14B are spaced apart in the length direction Y. The first mounting layer 13C is located toward the first side surface 12a of the second substrate 12 from the second mounting layer 13D and the conductive layer 14B in the length direction Y. The conductive layer 14B is located toward the second side surface 12b of the second substrate 12 from the first mounting layer 13C and the second mounting layer 13D in the length direction Y. The second mounting layer 13D is located between the first mounting layer 13C and the conductive layer 14B in the length direction Y.

The first mounting layer 13C includes a main mounting portion 13c, which has the form of a strip extending in the width direction X, and a connecting portion 13d, which extends from the end of the main mounting portion 13c that is located toward the fourth side surface 12d of the second substrate 12 in the width direction X. In the present embodiment, the first mounting layer 13C is a single component in which the main mounting portion 13c and the connecting portion 13d are formed integrally. The connecting portion 13d extends in the length direction Y and projects from the main mounting portion 13c toward the first side surface 12a of the second substrate 12 in the length direction Y. In this manner, the first mounting layer 13C is L-shaped in plan view.

The conductive layer 14B has the form of a strip extending in the width direction X in plan view. The width of the conductive layer 14B (dimension of conductive layer 14B in length direction Y) is less than the width of the main mounting portion 13c of the first mounting layer 13C (dimension of main mounting portion 13c in length direction Y).

The second mounting layer 13D includes a main mounting portion 13e, which has the form of a strip extending in the width direction X, and a connecting portion 13f, which extends from the end of the main mounting portion 13e that is located toward the fourth side surface 11d of the first substrate 11 in the width direction X. In the present embodiment, the second mounting layer 13D is a single component in which the main mounting portion 13e and the connecting portion 13f are formed integrally. The main mounting portion 13e is located between the conductive layer 14B and the main mounting portion 13c of the first mounting layer 13C in the length direction Y. In the present embodiment, the main mounting portion 13e is located toward the second side surface 12b of the second substrate 12 in the length direction Y. In further detail, the main mounting portion 13e is arranged on the second substrate 12 so that its middle portion in the length direction Y is located toward the second side surface 12b from the center line CLX. The edge of the main mounting portion 13e located toward the third side surface 12c of the second substrate 12 in the width direction X, the main mounting portion 13c of the first mounting layer 13C located toward the third side surface 12c of the second substrate 12 in the width direction X, and the edge of the conductive layer 14B located toward the third side surface 12c of the second substrate 12 in the width direction X are aligned in the length direction Y. The connecting portion 13f extends in the length direction Y and projects from opposite sides of the main mounting portion 13e in the length direction Y In this manner, the second mounting layer 13D is T-shaped in plan view. Further, the connecting portion 13f is located toward the fourth side surface 12d of the second substrate 12 from the first mounting layer 13C and the conductive layer 14B. The connecting portion 13f is arranged next to the terminal seat 82B, or the first output terminal 52A and the second output terminal 52B in the width direction X. The connecting portions 52b of the output terminals 52A and 52B are connected to the connecting portion 13f.

The first control layer 15C and the first detection layer 16C are each located toward the first side surface 12a of the second substrate 12 from the main mounting portion 13c of the first mounting layer 13C in the length direction Y. Further, the first control layer 15C and the first detection layer 16C are each located toward the third side surface 12c of the second substrate 12 from the connecting portion 13d of the first mounting layer 13C in the width direction X. The first control layer 15C and the first detection layer 16C each have the form of a fine strip extending in the width direction X in plan view. The first control layer 15C and the first detection layer 16C are spaced apart in the length direction Y. The first detection layer 16C is located toward the main mounting portion 13c of the first mounting layer 13C from the first control layer 15C. In other words, the first control layer 15C is located toward the first side surface 12a of the second substrate 12 from the first detection layer 16C. The first detection layer 16C overlaps the first control layer 15C as viewed in the length direction Y. The first detection layer 16C overlaps the main mounting portion 13c of the first mounting layer 13C as viewed in the length direction Y. The first control layer 15C and the first detection layer 16C each overlaps the connecting portion 13d of the first mounting layer 13C and the connecting portion 13f of the second mounting layer 13D as viewed in the width direction X. The length of the first control layer 15C in the width direction X is equal to the length of the first detection layer 16C in the width direction X. The end of the first detection layer 16C located toward the third side surface 12c of the second substrate 12 in the width direction X and the end of the first control layer 15C located toward the third side surface 12c of the second substrate 12 in the width direction X are aligned in the length direction Y. Further, the end of the first detection layer 16C located toward the fourth side surface 12d of the second substrate 12 in the width direction X and the end of the first control layer 15C located toward the fourth side surface 12d of the second substrate 12 in the width direction X are aligned in the length direction Y.

The second control layer 15D and the second detection layer 16D are each located toward the second side surface 12b of the second substrate 12 from the conductive layer 14B in the length direction Y. Further, the second control layer 15D and the second detection layer 16D are each located toward the third side surface 12c of the second substrate 12 from the connecting portion 13f of the second mounting layer 13D in the width direction X. In this manner, the main mounting portion 13c of the first mounting layer 13C, the main mounting portion 13e of the second mounting layer 13D, and the conductive layer 14B are sandwiched between the first control layer 15C and first detection layer 16C and the second control layer 15D and second detection layer 16D in the length direction Y in plan view. In other words, the first control layer 15C and first detection layer 16C and the second control layer 15D and second detection layer 16D are located at opposite sides of the main mounting portion 13c of the first mounting layer 13C, the main mounting portion 13e of the second mounting layer 13D, and the conductive layer 14B in the length direction Y. The second control layer 15D and the second detection layer 16D each have the form of a fine strip extending in the width direction X in plan view. The second control layer 15D and the second detection layer 16D are spaced apart in the length direction Y. The second detection layer 16D is located toward the conductive layer 14B from the second control layer 15D. In other words, the second control layer 15D is located toward the second side surface 12b of the second substrate 12 from the second detection layer 16D. The second detection layer 16D overlaps the second control layer 15D as viewed in the length direction Y. The second control layer 15D overlaps the conductive layer 14B as viewed in the length direction Y. The end of the second detection layer 16D located toward the third side surface 12c of the second substrate 12 in the width direction X and the end of the second control layer 15D located toward the third side surface 12c of the second substrate 12 in the width direction X are aligned in the length direction Y. Further, the end of the second detection layer 16D located toward the fourth side surface 12d of the second substrate 12 in the width direction X and the end of the second control layer 15D located toward the fourth side surface 12d of the second substrate 12 in the width direction X are aligned in the length direction Y. The length of the second control layer 15D in the width direction X is equal to the length of the second detection layer 16D in the width direction X. The length of each of the second control layer 15D and the second detection layer 16D in the width direction X is greater than the length of each of the first control layer 15C and the first detection layer 16C in the width direction X.

Figure 11:
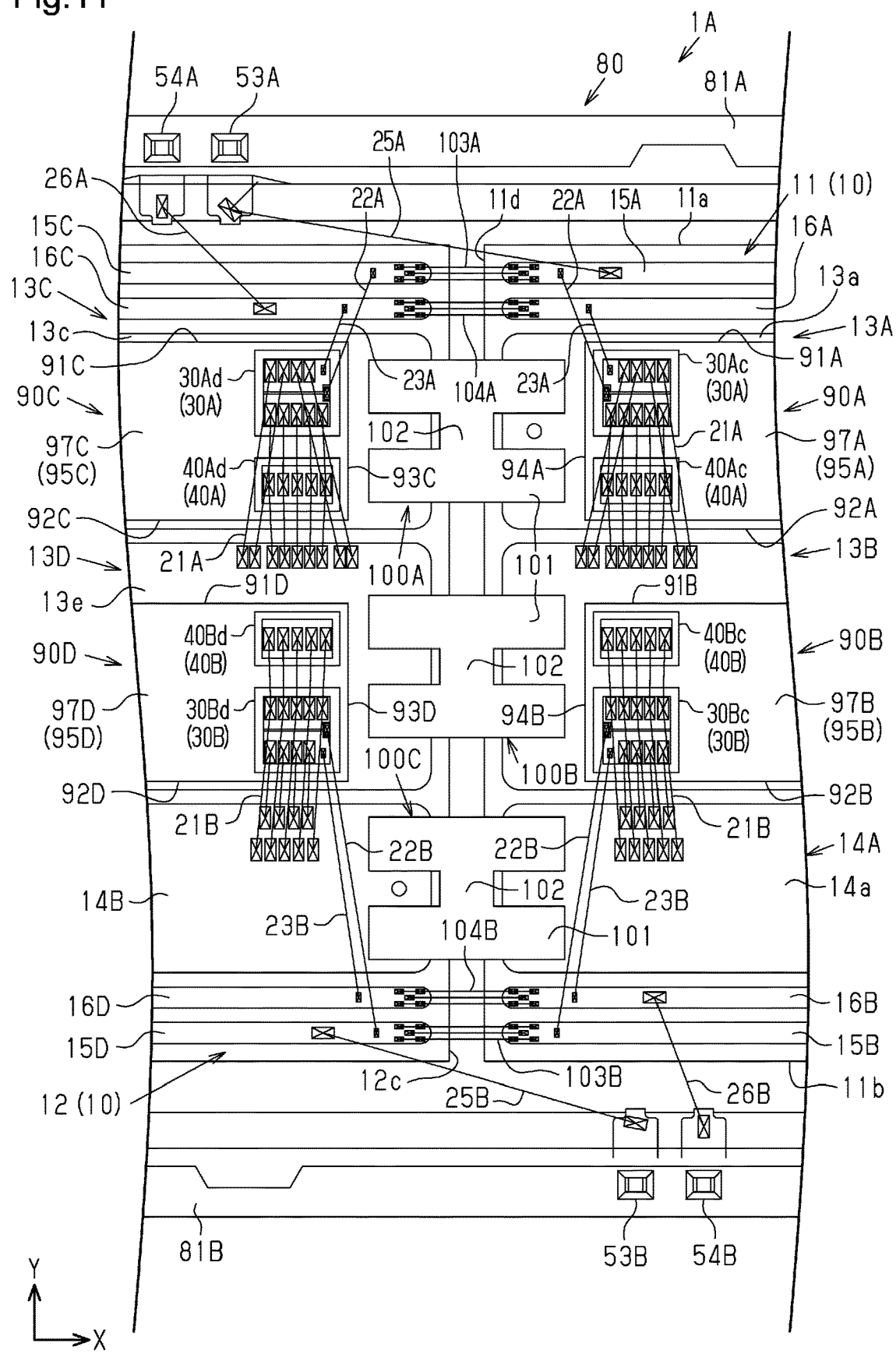
FIG. 11 is a partially enlarged view of FIG. 7.

As shown in FIG. 11, the main mounting portion 13a of the first mounting layer 13A and the main mounting portion 13c of the first mounting layer 13C are aligned in the length direction Y and spaced apart in the width direction X. The second mounting layer 13B and the main mounting portion 13e of the second mounting layer 13D are aligned in the length direction Y and spaced apart in the width direction X. The conductive layer 14B and the main conductive portion 14a of the conductive layer 14A are aligned in the length direction Y and spaced apart in the width direction X.

The main mounting portion 13a of the first mounting layer 13A and the main mounting portion 13c of the first mounting layer 13C are connected by a coupling member 100A having the form of a plate. The second mounting layer 13B and the main mounting portion 13e of the second mounting layer 13D are connected by a coupling member 100B having the form of a plate. The conductive layer 14B and the main conductive portion 14a of the conductive layer 14A are connected by a coupling member 100C having the form of a plate. The coupling member 100A is an example of the first coupling member recited in the claims, the coupling member 100B is an example of the second coupling member recited in the claims, and the coupling member 100C is an example of the third coupling member recited in the claims.

As shown in FIG. 11, the coupling members 100A to 100C are shaped identically in plan view. In one example, the coupling members 100A to 100C are each formed from Cu or a Cu alloy. The coupling members 100A to 100C each include two connection portions 101 extending in the width direction X and a coupling portion 102 connecting the two connection portions 101 in the length direction Y. In the present embodiment, each of the coupling members 100A to 100C is a single component in which the two connection portions 101 and the coupling portion 102 are formed integrally. The two connection portions 101 are spaced apart from each other in the length direction Y and each extend in the width direction X. The coupling portion 102 couples the middle parts of the two connection portions 101 in the width direction X. Accordingly, the coupling members 100A to 100C are each H-shaped in plan view.

The two connection portions 101 of the coupling member 100A are connected to the end of the main mounting portion 13a of the first mounting layer 13A that is located toward the fourth side surface 11d of the first substrate 11 in the width direction X (toward first mounting layer 13C) and the end of the main mounting portion 13c of the first mounting layer 13C that is located toward the third side surface 12c of the second substrate 12 (toward first mounting layer 13A) in the width direction X. The coupling portion 102 of the coupling member 100A is located between the main mounting portion 13a and the main mounting portion 13c in the width direction X. In this manner, the coupling member 100A electrically connects the first mounting layer 13A and the first mounting layer 13C.

The two connection portions 101 of the coupling member 100B are connected to the end of the second mounting layer 13B that is located toward the fourth side surface 11d of the first substrate 11 in the width direction X (toward second mounting layer 13D) and the end of the main mounting portion 13e of the second mounting layer 13D that is located toward the third side surface 12c of the second substrate 12 (toward second mounting layer 13B) in the width direction X. The coupling portion 102 of the coupling member 100B is located between the second mounting layer 13B and the main mounting portion 13e in the width direction X. In this manner, the coupling member 100B electrically connects the second mounting layer 13B and the second mounting layer 13D.

The two connection portions 101 of the coupling member 100C are connected to the end of the main conductive portion 14a of the conductive layer 14A that is located toward the fourth side surface 11d of the first substrate 11 in the width direction X (toward conductive layer 14B) and the end of the conductive layer 14B that is located toward the third side surface 12c of the second substrate 12 (toward conductive layer 14A) in the width direction X. The coupling portion 102 of the coupling member 100C is located between the main conductive portion 14a and the conductive layer 14B in the width direction X. In this manner, the coupling member 100C electrically connects the conductive layer 14A and the conductive layer 14B.

As shown in FIG. 11, the first control layer 15A and the first control layer 15C are aligned in the length direction Y and spaced apart in the width direction X. The first detection layer 16A and the first detection layer 16C are aligned in the length direction Y and spaced apart in the width direction X. The second control layer 15B and the second control layer 15D are aligned in the length direction Y and spaced apart in the width direction X. The second detection layer 16B and the second detection layer 16D are aligned in the length direction Y and spaced apart in the width direction X.

The first control layer 15A and the first control layer 15C are connected by a first control layer connecting member 103A. The first detection layer 16A and the first detection layer 16C are connected by a first detection layer connecting member 104A. The second control layer 15B and the second control layer 15D are connected by a second control layer connecting member 103B. The second detection layer 16B and the second detection layer 16D are connected by the second detection layer connecting member 104B. Each of the control layer connecting members 103A and 103B and the detection layer connecting members 104A and 104B is, for example, a wire formed through wire bonding.

The first control layer connecting member 103A is formed by wires and connects the end of the first control layer 15A that is located toward the fourth side surface 11d of the first substrate 11 (toward first control layer 15C) in the width direction X and the end of the first control layer 15C located toward the third side surface 12c of the second substrate 12 (toward first control layer 15A) in the width direction X. In this manner, the first control layer connecting member 103A electrically connects the first control layer 15A and the first control layer 15C.

The first detection layer connecting member 104A is formed by wires and connects the end of the first detection layer 16A that is located toward the fourth side surface 11d of the first substrate 11 (toward first detection layer 16C) in the width direction X and the end of the first detection layer 16C that is located toward the third side surface 12c of the second substrate 12 (toward first detection layer 16A) in the width direction X. In this manner, the first detection layer connecting member 104A electrically connects the first detection layer 16A and the first detection layer 16C.

The second control layer connecting member 103B is formed by wires and connects the end of the second control layer 15B that is located toward the fourth side surface 11d of the first substrate 11 (toward second control layer 15D) in the width direction X and the end of the second control layer 15D that is located toward the third side surface 12c of the second substrate 12 (toward second control layer 15B) in the width direction X. In this manner, the second control layer connecting member 103B electrically connects the second control layer 15B and the second control layer 15D.

The second detection layer connecting member 104B is formed by wires and connects the end of the second detection layer 16B located toward the fourth side surface 11d of the first substrate 11 (toward second detection layer 16D) in the width direction X and the end of the second detection layer 16D located toward the third side surface 12c of the second substrate 12 (toward second detection layer 16B) in the width direction X. In this manner, the second detection layer connecting member 104B electrically connects the second detection layer 16B and the second detection layer 16D.

As shown in FIG. 9, the side wall 81 of the case 80 is located next to the first control layers 15A and 15C and the thermistor mounting layer 17 in the length direction Y Thus, the first control terminal 53A, the first detection terminal 54A, the power current terminal 55, and the two temperature terminals 56 arranged in the side wall 81A are each located next to the first control layers 15A and 15C and the thermistor mounting layer 17 in the length direction Y.

In further detail, as shown in FIG. 11, the first control terminal 53A and the first detection terminal 54A are located toward the second substrate 12 from the first control layer 15A and arranged next to the first control layer 15C in the length direction Y. The first control terminal 53A and the first detection terminal 54A are arranged next to each other in the width direction X. As shown in FIG. 10, the first control terminal 53A and the first detection terminal 54A are located toward the third side surface 12c of the second substrate 12 in the width direction X. The first detection terminal 54A is located toward the terminal seat 82B (refer to FIG. 7) from the first control terminal 53A in the width direction X.

The power current terminal 55 is located toward the terminal seat 82B from the first control terminal 53A and the first detection terminal 54A in the width direction X. The power current terminal 55 is arranged next to the connecting portion 13d of the first mounting layer 13C in the length direction Y.

As shown in FIG. 9, the two temperature terminals 56 are located toward the third side surface 11c of the first substrate 11 from the first control layer 15A. The two temperature terminals 56 are arranged next to the thermistor mounting layer 17 in the length direction Y.

As shown in FIG. 11, the side wall 81B of the case 80 is located next to the second control layers 15B and 15D in the length direction Y. Thus, the second control terminal 53B and the second detection terminal 54B arranged in the side wall 81B are each located next to the second control layers 15B and 15D in the length direction Y.

In further detail, the second control terminal 53B and the second detection terminal 54B are located toward the first substrate 11 from the second control layer 15D and arranged next to the second control layer 15B in the length direction Y. The second control terminal 53B and the second detection terminal 54B are arranged next to each other in the width direction X. The second control terminal 53B and the second detection terminal 54B are located toward the fourth side surface 11d of the first substrate 11 in the width direction X. The second control terminal 53B is located toward the second substrate 12 from the second detection terminal 54B in the width direction X.

As shown in FIGS. 9 to 11, as connecting members formed by bonding wires, the connecting members 20 include first element connecting members 21A, each of which is an example of a first connecting member, second element connecting members 21B, each of which is an example of a second connecting member, first control connecting members 22A, second control connecting members 22B, first detection connecting members 23A, second detection connecting members 23B, a power current detection connecting member 24, a first control terminal connecting member 25A, a second control terminal connecting member 25B, a first detection terminal connecting member 26A, a second detection terminal connecting member 26B, and thermistor connecting member 27. The connecting members 21A, 21B, 22A, 22B, 23A, 23B, 24, 25A, 25B, 26A, 26B, and 27 are formed from, for example, aluminum (Al). The connecting members 21A, 21B, 22A, 22B, 23A, 23B, 24, 25A, 25B, 26A, 26B, and 27 may be formed from gold (Au).

The power current detection connecting member 24, the control terminal connecting members 25A and 25B, the detection terminal connecting members 26A and 26B, and the thermistor connecting member 27 will now be described. The element connecting members 21A and 21B, the control connecting members 22A and 22B, and the detection connecting members 23A and 23B will be described later.

As shown in FIG. 10, the power current detection connecting member 24 connects the connecting portion 13d of the first mounting layer 13C of the second substrate 12 to the power current terminal 55. The power current detection connecting member 24 electrically connects the first mounting layer 13C and the power current terminal 55.

As shown in FIG. 11, the first control terminal connecting member 25A connects the first control layer 15A and the first control terminal 53A. The first control terminal connecting member 25A is connected to a portion of the first control layer 15A located toward the fourth side surface 11d of the first substrate 11. The first control terminal connecting member 25A and the first control layer connecting member 103A electrically connect the first control layers 15A and 15C and the first control terminal 53A.

The first detection terminal connecting member 26A connects the first detection layer 16C and the first detection terminal 54A. The first detection terminal connecting member 26A is connected to a portion of the first detection layer 16C located toward the first substrate 11 from the first detection terminal 54A in the width direction X. The first detection terminal connecting member 26A and the first detection layer connecting member 104A electrically connect the first detection layers 16A and 16C and the first detection terminal 54A.

As shown in FIG. 9, the thermistor connecting member 27 includes two wires and connects the thermistor mounting layer 17 and the temperature terminals 56. One wire connects one of the two portions of the thermistor mounting layer 17 and one of the two temperature terminals 56. The other wire connects the other portion of the thermistor mounting layer 17 and the other one of the two temperature terminals 56. In this manner, the thermistor connecting member 27 electrically connects the thermistor 18 and the temperature terminals 56.

As shown in FIG. 11, the second control terminal connecting member 25B connects the second control layer 15D and the second control terminal 53B. The second control terminal connecting member 25B is connected to a portion of the second control layer 15D located toward the third side surface 12c of the second substrate 12 in the width direction X. The second control terminal connecting member 25B and the second control layer connecting member 103B electrically connect the second control layers 15B and 15D and the second control terminal 53B.

The second detection terminal connecting member 26B connects the second detection layer 16B and the second detection terminal 54B. The second detection terminal connecting member 26B is connected to a portion of the second detection layer 16B located toward the fourth side surface 11d of the first substrate 11 in the width direction X. The second detection terminal connecting member 26B and the second detection layer connecting member 104B electrically connect the second detection layers 16B and 16D and the second detection terminal 54B.

As shown in FIG. 12, three first power semiconductor elements 30A are electrically connected to the first substrate 11, and three first power semiconductor elements 30A are electrically connected to the second substrate 12. More specifically, in the present embodiment, six first power semiconductor elements 30A form an upper arm of an inverter circuit (first power semiconductor element group 30AT of FIG. 8). A first graphite plate 90A, which is an example of a graphite plate, is arranged on the first substrate 11, and three first power semiconductor elements 30A are arranged on the first graphite plate 90A. A first graphite plate 90C, which is an example of a graphite plate, is arranged on the second substrate 12, and three first power semiconductor elements 30A are arranged on the first graphite plate 90C. The graphite plates 90A and 90C and the first power semiconductor elements 30A will now be described in detail.

As shown in FIGS. 7 and 9, the first graphite plate 90A is arranged on the main mounting portion 13a of the first mounting layer 13A. The first graphite plate 90A is bonded by a conductive bonding material such as Ag paste or solder to the main mounting portion 13a. The shape of the first graphite plate 90A in plan view is rectangular so that the width direction X is the long-side direction and the length direction Y is the short-side direction. The dimension of the first graphite plate 90A in the length direction Y is less than the width of the main mounting portion 13a (dimension of main mounting portion 13a in length direction Y). The thickness of the first graphite plate 90A (dimension of first graphite plate 90A in thickness direction Z) is greater than the thickness of the first substrate 11 (dimension of first substrate 11 in thickness direction Z). In one example, the thickness of the first graphite plate 90A is approximately 2 mm.

As shown in FIG. 12, the first graphite plate 90A includes a first plate main surface 95A and a first plate back surface 96A at opposite sides in the thickness direction Z. The first plate main surface 95A is an example of a plate main surface and faces the same way as the first substrate main surface 11s of the first substrate 11 in the thickness direction Z. The first plate back surface 96A is an example of a plate back surface and faces the same way as the first substrate back surface 11r of the first substrate 11 in the thickness direction Z. A main surface conductive layer 97A is formed on the first plate main surface 95A. A back surface conductive layer 98A is formed on the first plate back surface 96A. Thus, when the first graphite plate 90A is mounted on the main mounting portion 13a, the back surface conductive layer 98A is bonded to the main mounting portion 13a by a conductive bonding material. In the present embodiment, the main surface conductive layer 97A is formed over the entire first plate main surface 95A. The back surface conductive layer 98A is formed over the entire first plate back surface 96A. The main surface conductive layer 97A may be formed on part of the first plate main surface 95A. The back surface conductive layer 98A may be formed on part of the first plate back surface 96A.

As shown in FIG. 9, the first graphite plate 90A includes a plate first side surface 91A and a plate second side surface 92A at opposite sides in the length direction Y and a plate third side surface 93A and a plate fourth side surface 94A at opposite sides in the width direction X. The plate first side surface 91A faces the same direction as the first side surface 11a of the first substrate 11, and the plate second side surface 92A faces the same direction as the second side surface 11b of the first substrate 11. The plate third side surface 93A faces the same direction as the third side surface 11c of the first substrate 11, and the plate fourth side surface 94A faces the same direction as the fourth side surface 11d of the first substrate 11.

In plan view, the plate first side surface 91A is located toward the second side surface 11b of the first substrate 11 from an edge 13g of the main mounting portion 13a of the first mounting layer 13A that is located toward the first side surface 11a of the first substrate 11 in the length direction Y and arranged next to the edge 13g in the length direction Y. In plan view, the plate second side surface 92A is located toward the first side surface 11a of the first substrate 11 from an edge 13h of the main mounting portion 13a that is located toward the second side surface 11b of the first substrate 11 in the length direction Y and arranged next to the edge 13h in the length direction Y. In this manner, the dimension of the first graphite plate 90A in the length direction Y is slightly less than the width of the main mounting portion 13a (dimension of main mounting portion 13a in length direction Y).

In plan view, the plate third side surface 93A is at the end of the main mounting portion 13a of the first mounting layer 13A that is located toward the third side surface 11c of the first substrate 11 in the width direction X. In detail, the plate third side surface 93A is located next to the connecting portion 51b of the first input terminal 51A, which is connected to the connecting portion 13b, in the width direction X. In plan view, the plate fourth side surface 94A is at the end of the main mounting portion 13a that is located toward the fourth side surface 11d of the first substrate 11. In detail, in plan view, the plate fourth side surface 94A is located next to the coupling member 100A, which is connected to the main mounting portion 13a, in the width direction X. In this manner, the length of the first graphite plate 90A in the width direction X is maximized on the first mounting layer 13A between the first input terminal 51A and the coupling member 100A in the width direction X.

A plurality of (three in the present embodiment) first power semiconductor elements 30A and a plurality of (three in the present embodiment) first diodes 40A are arranged on the first plate main surface 95A of the first graphite plate 90A. In further detail, the first power semiconductor elements 30A and the first diodes 40A are bonded by a conductive bonding material such as Ag paste or solder to the main surface conductive layer 97A. In the description hereafter, to aid understanding, the three first power semiconductor elements 30A are respectively referred to as the first power semiconductor elements 30Aa, 30Ab, and 30Ac, and the three first diodes 40A are respectively referred to as the first diodes 40Aa, 40Ab, and 40Ac.

In plan view, the first power semiconductor elements 30Aa, 30Ab, and 30Ac are aligned in the length direction Y and spaced apart from one another in the width direction X. The first power semiconductor elements 30Aa, 30Ab, and 30Ac are each located toward the plate first side surface 91A of the first graphite plate 90A in the length direction Y. In the present embodiment, the first power semiconductor elements 30Aa, 30Ab, and 30Ac are each arranged on the end of the first plate main surface 95A of the first graphite plate 90A (main surface conductive layer 97A) located toward the plate first side surface 91A in the length direction Y. In further detail, in plan view, the first power semiconductor elements 30Aa, 30Ab, and 30Ac are each arranged adjacent to the plate first side surface 91A in the length direction Y. In this manner, in plan view, the first power semiconductor elements 30Aa, 30Ab, and 30Ac are each arranged proximate to the first control layer 15A and the first detection layer 16A in the length direction Y.

The first power semiconductor element 30Aa is located toward the plate third side surface 93A of the first graphite plate 90A in the width direction X. In the present embodiment, the first power semiconductor element 30Aa is arranged on the end of the first plate main surface 95A of the first graphite plate 90A (main surface conductive layer 97A) located toward the plate third side surface 93A in the width direction X. In further detail, in plan view, the first power semiconductor element 30Aa is arranged adjacent to the plate third side surface 93A in the width direction X. In plan view, the first power semiconductor element 30Aa is located toward the third side surface 11c of the first substrate 11 from the first control layer 15A and the first detection layer 16A. The first power semiconductor element 30Aa overlaps the two thermistor mounting layers 17 as viewed in the length direction Y.

The first power semiconductor element 30Ab is arranged in the middle portion of the first plate main surface 95A of the first graphite plate 90A (main surface conductive layer 97A) in the width direction X.

The first power semiconductor element 30Ac is located toward the plate fourth side surface 94A of the first graphite plate 90A in the width direction X. In the present embodiment, the first power semiconductor element 30Ac is arranged on the end of the first plate main surface 95A of the first graphite plate 90A (main surface conductive layer 97A) located toward the plate fourth side surface 94A in the width direction X. In further detail, in plan view, the first power semiconductor element 30Ac is arranged adjacent to the plate fourth side surface 94A in the width direction X.

The distance DX1 between the first power semiconductor element 30Aa and the first power semiconductor element 30Ab in the width direction X is greater than the distance DX2 between the first power semiconductor element 30Aa and the connecting portion 51b of the first input terminal 51A in the width direction X. In one example, the distance DX1 is two times or greater than the distance DX2. Preferably, the distance DX1 is three times or greater than the distance DX2. Further preferably, the distance DX1 is four times of greater than the distance DX2. In the present embodiment, the distance DX1 is approximately 4.6 times the distance DX2.

The distance DX3 between the first power semiconductor element 30Ac and the first power semiconductor element 30Ab in the width direction X is greater than the distance DX4 between the first power semiconductor element 30Ac and the coupling member 100A in the width direction X. In one example, the distance DX3 is two times or greater than the distance DX4. Preferably, the distance DX3 is three times or greater than the distance DX4. Further preferably, the distance DX3 is four times or greater than the distance DX4. In the present embodiment, the distance DX3 is approximately 7.4 times the distance DX4. Further, in the present embodiment, the distance DX3 is equal to the distance DX1. Here, if the difference between the distance DX3 and the distance DX1 is within 5% of the distance DX1, this will mean that the distance DX3 is equal to the distance DX1.

In plan view, the first diodes 40Aa, 40Ab, and 40Ac are aligned in the length direction Y and spaced apart from one another in the width direction X. The first diodes 40Aa, 40Ab, and 40Ac are each located toward the plate second side surface 92A of the first graphite plate 90A in the length direction Y. In the present embodiment, the first diodes 40Aa, 40Ab, and 40Ac are each arranged on the end of the first plate main surface 95A of the first graphite plate 90A (main surface conductive layer 97A) that is located toward the plate second side surface 92A in the length direction Y. In further detail, in plan view, the first diodes 40Aa, 40Ab, and 40Ac are each arranged adjacent to the plate second side surface 92A in the length direction Y In this manner, in plan view, the first diodes 40Aa, 40Ab, and 40Ac are each arranged at the side opposite to the first control layer 15A and the first detection layer 16A in the length direction Y The first diodes 40Aa, 40Ab, and 40Ac are each located proximate to the second mounting layer 13B in the length direction Y.

The first diode 40Aa is aligned with the first power semiconductor element 30Aa in the width direction X and spaced apart from the first power semiconductor element 30Aa in the length direction Y. The first diode 40Ab is aligned with the first power semiconductor element 30Ab in the width direction X and spaced apart from the first power semiconductor element 30Ab in the length direction Y. The first diode 40Ac is aligned with the first power semiconductor element 30Ac in the width direction X and spaced apart from the first power semiconductor element 30Ac in the length direction Y.

Figure 13:
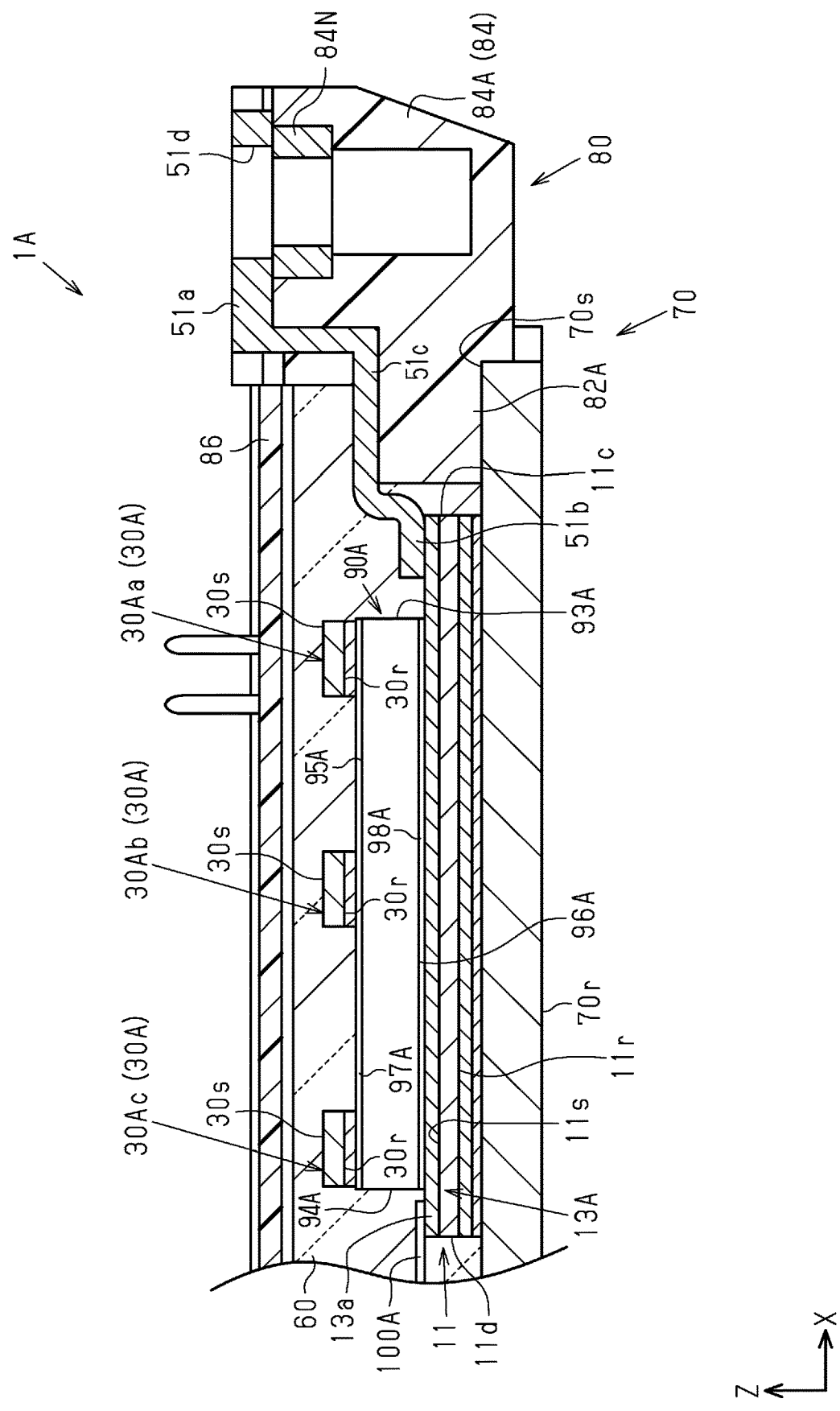
FIG. 13 is a partially enlarged view of FIG. 12.

The first power semiconductor elements 30Aa, 30Ab, and 30Ac are identical in structure and oriented in the same direction. As shown in FIG. 13, the first power semiconductor elements 30Aa, 30Ab, and 30Ac each include an element main surface 30s and an element back surface 30r at opposite sides in the thickness direction Z. The element main surface 30s of each of the first power semiconductor elements 30A is one example of a first element main surface, and the element back surface 30r of each first power semiconductor element 30A is one example of a first element back surface.

The drain electrode 31 (not shown in FIG. 13) is formed on the element back surface 30r of each of the first power semiconductor elements 30Aa, 30Ab, and 30Ac. In the present embodiment, the drain electrode 31 is formed over the entire element back surface 30r. The drain electrode 31 is bonded by a conductive bonding material to the main surface conductive layer 97A, which is formed on the first plate main surface 95A of the first graphite plate 90A. The electrically connects the drain electrode 31 of each of the first power semiconductor elements 30Aa, 30Ab, and 30Ac via the first graphite plate 90A to the first mounting layer 13A. The first mounting layer 13A is electrically connected to the first input terminal 51A. Thus, the drain electrode 31 of each of the first power semiconductor elements 30Aa, 30Ab, and 30Ac is electrically connected to the first input terminal 51A.

Figure 14:
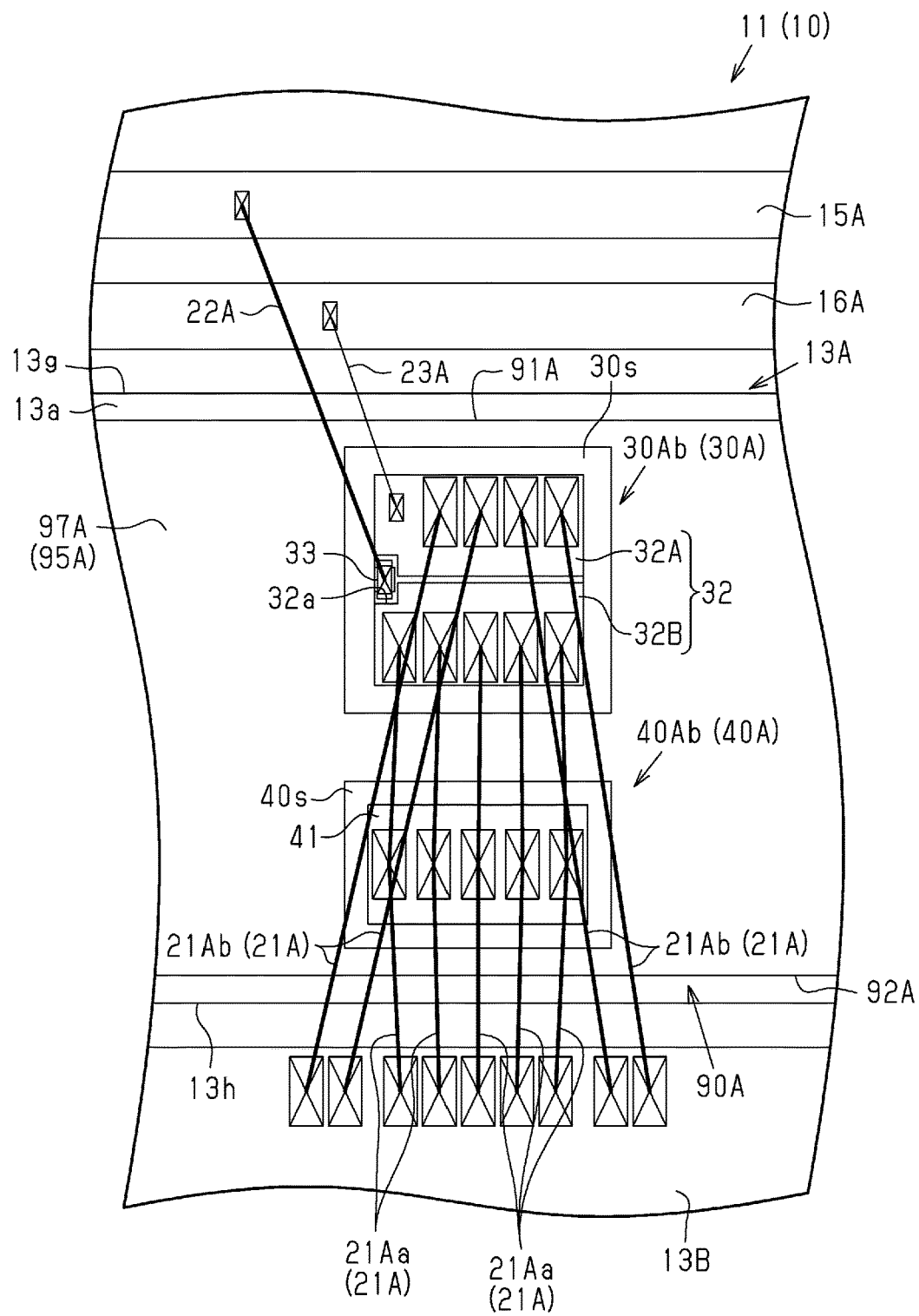
FIG. 14 is an enlarged view of a first power semiconductor element, a first diode, and their surroundings.

As shown in FIG. 14, the source electrode 32 and the gate electrode 33 are formed on the element main surface 30s of each of the first power semiconductor elements 30Ab. In the present embodiment, the source electrode 32 includes a first source electrode 32A and a second source electrode 32B. In plan view, the first source electrode 32A and the second source electrode 32B are spaced apart in the length direction Y. The first source electrode 32A is located toward the plate first side surface 91A of the first graphite plate 90A from the second source electrode 32B. In plan view, the gate electrode 33 is arranged in a recess 32a formed in the source electrode 32. Although not shown in FIG. 14, the source electrode 32 and the gate electrode 33 are formed on the element main surface 30s of each of the first power semiconductor elements 30Aa and 30Ac in the same manner as the element main surface of the first power semiconductor element 30Ab.

Figure 15:
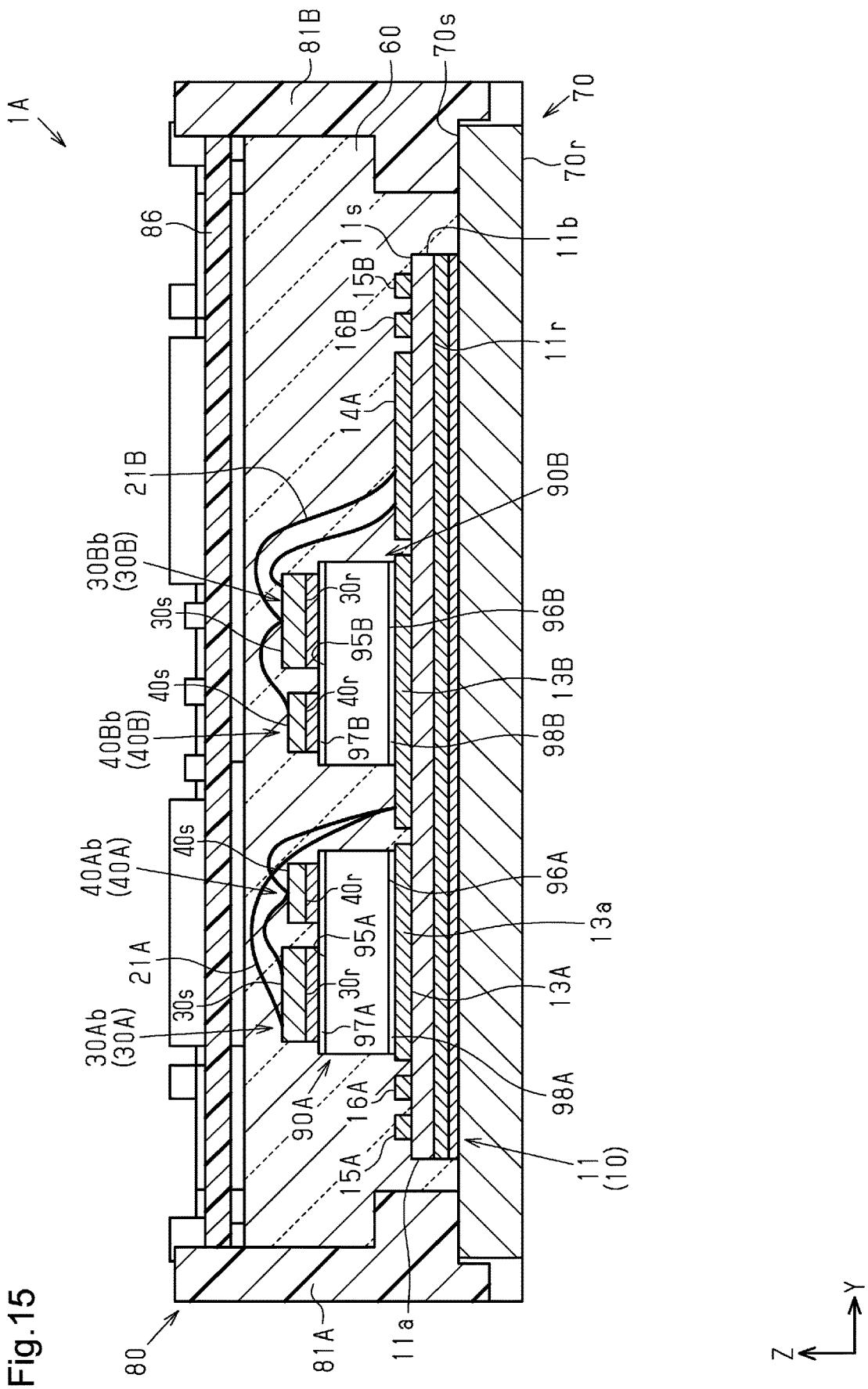
FIG. 15 is a cross-sectional view taken along line 15-15 in FIG. 7.
Figure 16:
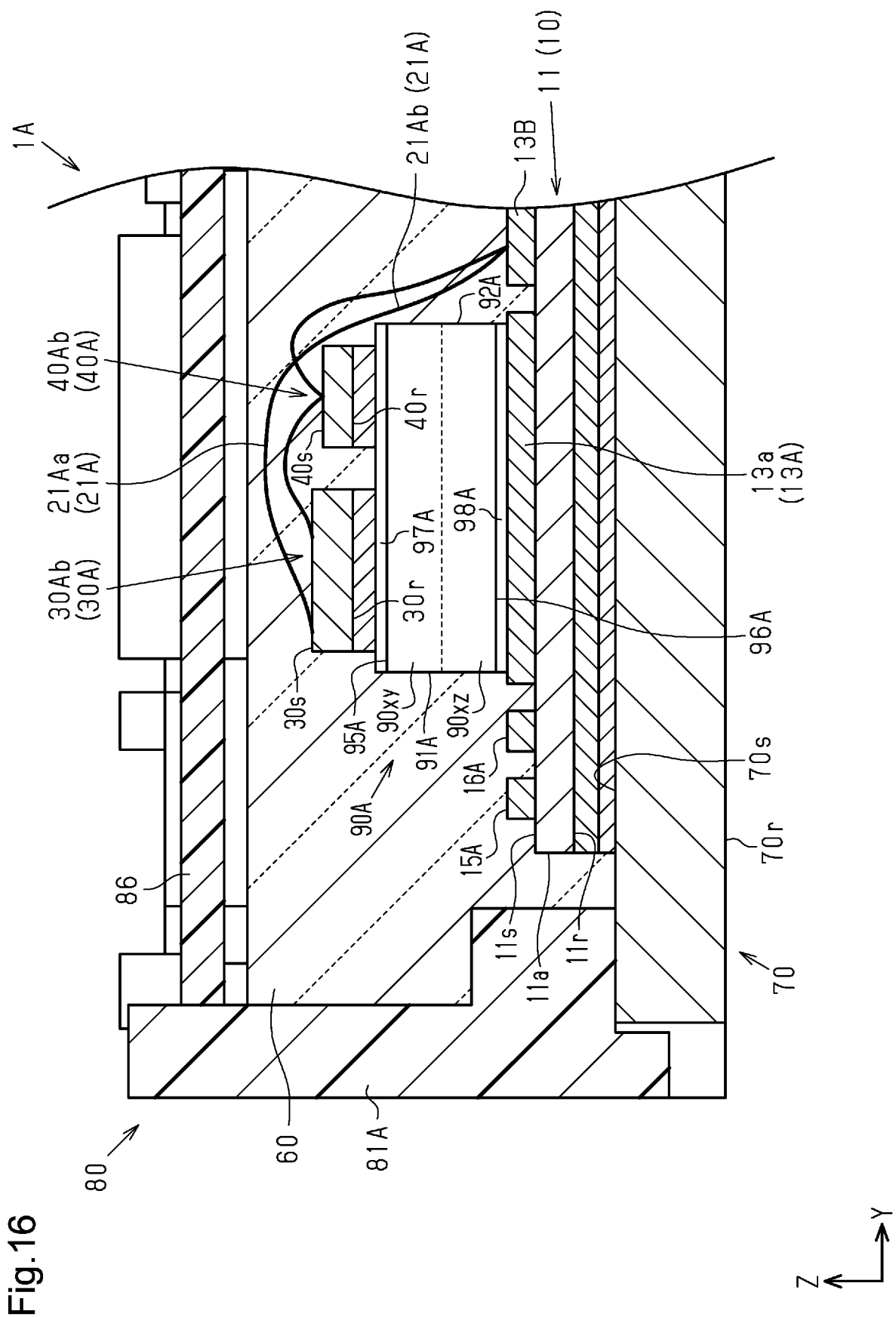
FIG. 16 is a partially enlarged view of FIG. 15.

The first diodes 40Aa, 40Ab, and 40Ac are identical in structure. As shown in FIGS. 15 and 16, the first diode 40Ab includes a main surface 40s and a back surface 40r at opposite sides in the thickness direction Z. The main surface 40s face the same way as the element main surface 30s in the thickness direction Z, and the back surface 40r face the same way as the element back surface 30r in the thickness direction Z. The main surface 40s is an example of the first main surface of the first diode recited in the claims. The back surface 40r is an example of the first back surface of the first diode recited in the claims.

The cathode electrode 42 (not shown in FIG. 16) is formed on the back surface 40r of each first diode 40Ab. The cathode electrode 42 is formed over, for example, the entire back surface 40r. The cathode electrode 42 is bonded by a conductive material to the main surface conductive layer 97A, which is formed on the first plate main surface 95A of the first graphite plate 90A. This electrically connects the cathode electrode 42 of the first diode 40Ab to the drain electrode 31 of each of the first power semiconductor elements 30Aa, 30Ab, and 30Ac.

As shown in FIG. 14, the anode electrode 41 is formed on the main surface 40s of each of the first diodes 40Aa, 40Ab, and 40Ac. The anode electrode 41 is formed over, for example, most of the main surface 40s. Although not shown in FIGS. 15 and 16, the first diodes 40Aa and 40Ac also include the main surface 40s and the back surface 40r n the same manner as the first diodes 40Ab. Further, in the first diodes 40Aa and 40Ac, the anode electrode 41 is formed on the main surface 40s, and the cathode electrode 42 is formed on the back surface 40r. This electrically connects the cathode electrode 42 of each of the first diodes 40Aa and 40Ac to the drain electrode 31 of each of the first power semiconductor elements 30Aa, 30Ab, and 30Ac.

The relationship of the first power semiconductor elements 30A and the first diodes 40A with respect to the first element connecting members 21A, the first control connecting members 22A, and the first detection connecting members 23A will now be described.

As shown in FIGS. 14 to 16, the source electrode 32 of the first power semiconductor element 30Ab, the anode electrode 41 of the first diode 40Ab, and the second mounting layer 13B are connected by the first element connecting members 21A. In further detail, the first element connecting members 21A include a plurality of (five in the present embodiment) first element connecting members 21Aa and a plurality of (four in the present embodiment) first element connecting members 21Ab. The first element connecting members 21Aa each connect the second source electrode 32B of the first power semiconductor element 30Ab, the anode electrode 41 of the first diode 40Ab, and the second mounting layer 13B. The first element connecting member 21Ab each connect the first source electrode 32A of the first power semiconductor element 30Ab and the second mounting layer 13B.

The first element connecting members 21Aa are connected to the second source electrode 32B in a state aligned in the length direction Y and spaced apart in the width direction X, connected to the anode electrode 41 in a state aligned in the length direction Y and spaced apart in the width direction X, and connected to the second mounting layer 13B in a state aligned in the length direction Y and spaced apart in the width direction X. In plan view, the first element connecting members 21Aa, which connect the second source electrode 32B, the anode electrode 41, and the second mounting layer 13B, extend in the length direction Y.

The first element connecting members 21Ab are connected to the portion of the first source electrode 32A located toward the plate third side surface 93A of the first graphite plate 90A (refer to FIG. 9) in the width direction X. The first element connecting members 21Ab are connected to the first source electrode 32A in a state aligned in the length direction Y and spaced apart in the width direction X. The first element connecting members 21Ab extend across the first element connecting members 21Aa. Two of the first element connecting members 21Ab are connected, adjacent to the first element connecting members 21Aa in the width direction X, to a portion of the second mounting layer 13B located toward the third side surface 11c of the first substrate 11 (refer to FIG. 9) from the first element connecting members 21Aa that are connected to the second mounting layer 13B. The other two first element connecting members 21Ab are connected, adjacent to the first element connecting members 21Aa in the width direction X, to a portion of the second mounting layer 13B located toward the fourth side surface 11d of the first substrate 11 (refer to FIG. 9) from the first element connecting members 21Aa connected to the second mounting layer 13B. In this manner, the first element connecting members 21Aa are formed so that the distance from two of the first element connecting members 21Aa to the other two first element connecting members 21Aa in the width direction X gradually increases from the first source electrode 32A toward the second mounting layer 13B.

The first source electrode 32A of the first power semiconductor element 30Ab is connected to the first detection layer 16A by the first detection connecting member 23A. The first detection connecting member 23A connects the portion of the first source electrode 32A located toward the fourth side surface 11d of the first substrate 11 from the first element connecting members 21Ab. The first detection connecting members 23A is connected to the middle portion of the first detection layer 16A in the width direction X. In this manner, the first detection connecting member 23A electrically connects the first source electrode 32A via the first detection layer 16A and 16C to the first detection terminal 54A.

The gate electrode 33 of the first power semiconductor element 30Ab is connected to the first control layer 15A by the first control connecting member 22A. The first control connecting members 22A is connected to the middle portion of the first control layer 15A in the width direction X. In this manner, the first control connecting member 22A electrically connects the gate electrode 33 via the first control layers 15A and 15C to the first control terminal 53A (refer to FIG. 11).

The configuration connecting the source electrode 32 of the first power semiconductor element 30Ac, the anode electrode 41 of the first diode 40Ac, and the second mounting layer 13B with the first element connecting members 21A (21Aa and 21Ab) is the same as the configuration connecting the source electrode 32 of the first power semiconductor element 30Ab, the anode electrode 41 of the first diode 40Ab, and the second mounting layer 13B with the first element connecting members 21A (21Aa and 21Ab).

The configuration connecting the source electrode 32 of the first power semiconductor element 30Aa, the anode electrode 41 of the first diode 40Aa, and the second mounting layer 13B with the first element connecting members 21A (21Aa and 21Ab) differs from the configuration connecting the source electrode 32 of the first power semiconductor element 30Ab, the anode electrode 41 of the first diode 40Ab, and the second mounting layer 13B with the first element connecting members 21A (21Aa and 21Ab). In detail, in plan view, the portion of each first element connecting member 21Aa connecting the anode electrode 41 of the first diode 40Aa and the second mounting layer 13B extend diagonally toward the fourth side surface 11d of the first substrate 11 from the anode electrode 41 to the second mounting layer 13B.

Further, the configuration connecting the gate electrode 33 of the first power semiconductor element 30Aa and the first control layer 15A with the first control connecting member 22A and the configuration connecting the gate electrode 33 of the first power semiconductor element 30Ac and the first control layer 15A with the first control connecting member 22A are the same as the configuration connecting the gate electrode 33 of the first power semiconductor element 30Ab and the first control layer 15A with the first control connecting member 22A.

As shown in FIG. 9, the first control connecting member 22A that is connected to the gate electrode 33 of the first power semiconductor element 30Aa is connected to the end of the first control layer 15A located toward the third side surface 11c of the first substrate 11 in the width direction X. The first control connecting member 22A that is connected to the gate electrode 33 of the first power semiconductor element 30Ac is connected to the end of the first control layer 15A located toward the fourth side surface 11d of the first substrate 11 in the width direction X. In further detail, the first control connecting member 22A that is connected to the gate electrode 33 of the first power semiconductor element 30Ac is connected to a portion of the first control layer 15A located between a portion of the first control layer 15A connected to the first control layer connecting member 103A and a portion of the first control layer 15A connected to the first control terminal connecting member 25A in the width direction X.

Further, the configuration connecting the source electrode 32 of the first power semiconductor element 30Aa and the first detection layer 16A with the first detection connecting member 23A and the configuration connecting the source electrode 32 of the first power semiconductor element 30Ac and the first detection layer 16A with the first detection connecting member 23A are the same as the configuration connecting the source electrode 32 of the first power semiconductor element 30Ab and the first detection layer 16A with the first detection connecting members 23A.

The first detection connecting member 23A that is connected to the source electrode 32 of the first power semiconductor element 30Aa is connected to the end of the first detection layer 16A located toward the third side surface 11c of the first substrate 11 in the width direction X. The first detection connecting member 23A that is connected to the source electrode 32 of the first power semiconductor element 30Ac is connected to a portion of the first detection layer 16A located toward the fourth side surface 11d of the first substrate 11 in the width direction X.

Figure 17:
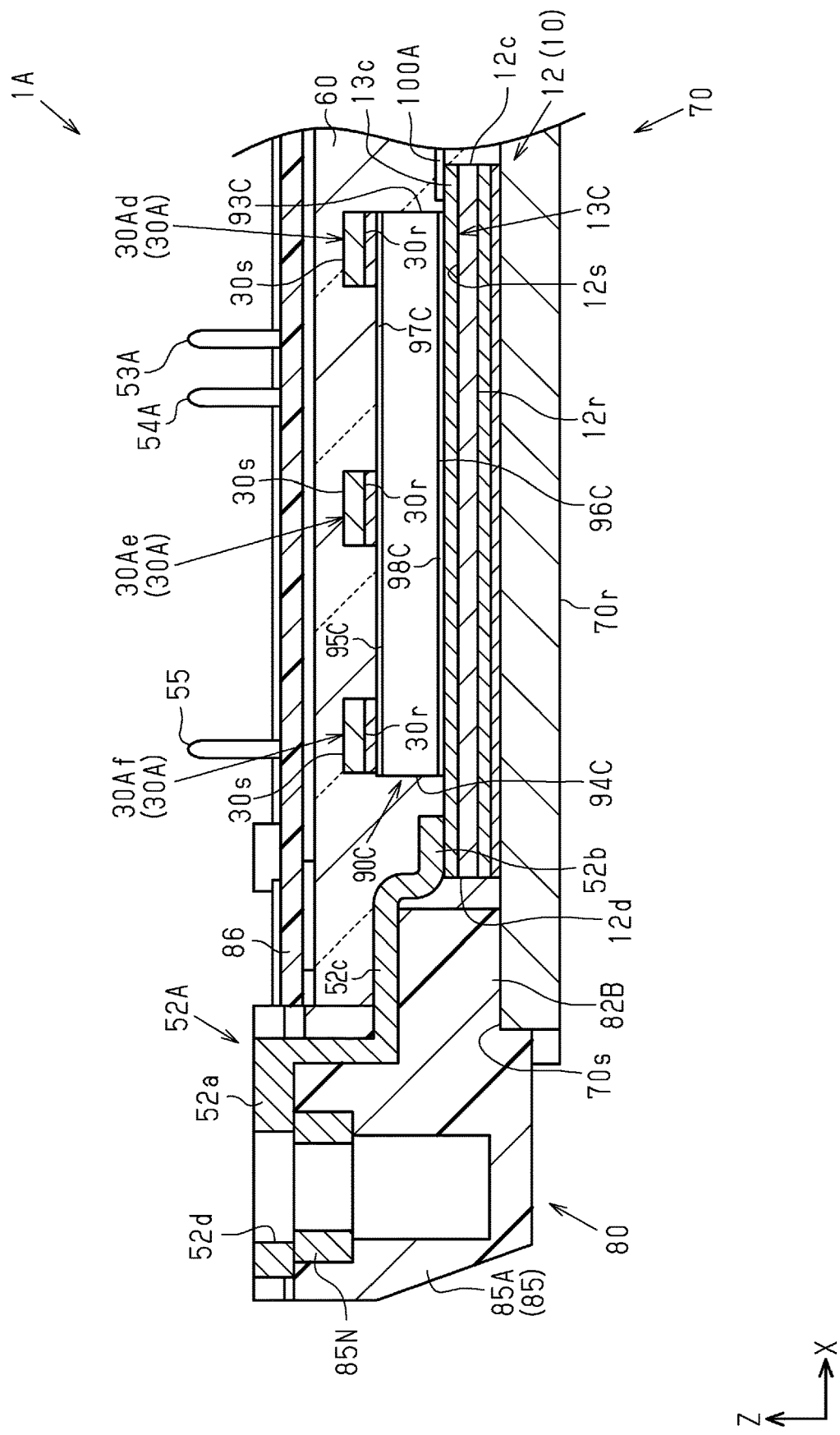
FIG. 17 is a partially enlarged view of FIG. 12.

As shown in FIGS. 10 and 17, the first graphite plate 90C is formed on the first mounting layer 13C of the second substrate 12. The first graphite plate 90C is bonded by a conductive bonding material such as Ag paste or solder to the main mounting portion 13c of the first mounting layer 13C. The shape of the first graphite plate 90C in plan view is rectangular so that the width direction X is the long-side direction and the length direction Y is the short-side direction. The dimension of the first graphite plate 90C in the length direction Y is less than the width of the main mounting portion 13c (dimension of main mounting portion 13c in length direction Y). The thickness of the first graphite plate 90C (dimension of first graphite plate 90C in thickness direction Z) is greater than the thickness of the second substrate 12 (dimension of second substrate 12 in thickness direction Z).

The first graphite plate 90C has the same size as the first graphite plate 90A. In further detail, the dimension of the first graphite plate 90C in the length direction Y is equal to the dimension of the first graphite plate 90A in the length direction Y. Further, the dimension of the first graphite plate 90C in the width direction X is equal to the dimension of the first graphite plate 90A in the width direction X. Further, the thickness of the first graphite plate 90C (dimension of first graphite plate 90 in thickness direction Z) is equal to the thickness of the first graphite plate 90A (dimension of first graphite plate 90A in thickness direction Z).

Here, as long as the difference in the dimension of the first graphite plate 90C in the length direction Y and the dimension of the first graphite plate 90A in the length direction Y is, for example, within 5% of the dimension of the first graphite plate 90A in the length direction Y, this will mean that the dimension of the first graphite plate 90C in the length direction Y is equal to the dimension of the first graphite plate 90A in the length direction Y. Further, as long as the difference in the dimension of the first graphite plate 90C in the width direction X and the dimension of the first graphite plate 90A in the width direction X is, for example, within 5% of the dimension of the first graphite plate 90A in the width direction X, this will mean that the dimension of the first graphite plate 90C in the width direction X is equal to the dimension of the first graphite plate 90A in the width direction X. Further, as long as the difference in the dimension of the first graphite plate 90C in the thickness direction Z and the dimension of the first graphite plate 90A in the thickness direction Z is, for example, within 5% of the dimension of the first graphite plate 90A in the thickness direction Z, this will mean that the thickness of the first graphite plate 90C is equal to the thickness of the first graphite plate 90A.

The first graphite plate 90C includes a first plate main surface 95C and a first plate back surface 96C at opposite sides in the thickness direction Z. The first plate main surface 95C faces the same way as the second substrate main surface 12s of the second substrate 12 in the thickness direction Z. The first plate back surface 96C faces the same way as the second substrate back surface 12r of the second substrate 12 in the thickness direction Z. A main surface conductive layer 97C is formed on the first plate main surface 95C. A back surface conductive layer 98C is formed on the first plate back surface 96C. Thus, when the first graphite plate 90C is mounted on the main mounting portion 13c, the back surface conductive layer 98C is bonded to the main mounting portion 13c by a conductive bonding material. In the present embodiment, the main surface conductive layer 97C is formed over the entire first plate main surface 95C. The back surface conductive layer 98C is formed over the entire first plate back surface 96C. The main surface conductive layer 97C may be formed on part of the first plate main surface 95C. The back surface conductive layer 98C may be formed on part of the first plate back surface 96C.

The first graphite plate 90C includes a plate first side surface 91C and a plate second side surface 92C at opposite sides in the length direction Y and a plate third side surface 93C and a plate fourth side surface 94C at opposite sides in the width direction X. The plate first side surface 91C faces the same direction as the first side surface 12a of the second substrate 12, and the plate second side surface 92C faces the same direction as the second side surface 12b of the second substrate 12. The plate third side surface 93C faces the same direction as the third side surface 12c of the second substrate 12, and the plate fourth side surface 94C faces the same direction as the fourth side surface 12d of the second substrate 12.

In plan view, the plate first side surface 91C is located toward the first side surface 12a of the second substrate 12 from an edge 13k of the main mounting portion 13c of the first mounting layer 13C that is located toward the second side surface 12b of the second substrate 12 in the length direction Y and arranged next to the edge 13k in the length direction Y. In plan view, the plate second side surface 92C is located toward the first side surface 12a of the second substrate 12 from an edge 13m of the main mounting portion 13c that is located toward the second side surface 12b of the second substrate 12 in the length direction Y and arranged next to the edge 13m in the length direction Y. In this manner, the dimension of the first graphite plate 90C in the length direction Y is slightly less than the width of the main mounting portion 13c (dimension of main mounting portion 13c in length direction Y).

In plan view, the plate third side surface 93C is at the end of the main mounting portion 13c of the first mounting layer 13C that is located toward the third side surface 12c of the second substrate 12 in the width direction X. In detail, in plan view, the plate third side surface 93C is located next to the coupling member 100A, which is connected to the main mounting portion 13c, in the width direction X. In plan view, the plate fourth side surface 94C is at the end of the main mounting portion 13c that is located toward the fourth side surface 12d of the second substrate 12. The first graphite plate 90C overlaps the connecting portion 13d of the first mounting layer 13C as viewed in the length direction Y. In this manner, the length of the first graphite plate 90C in the width direction X is maximized on the first mounting layer 13C between the edge located toward the fourth side surface 12d of the second substrate 12 and the coupling member 100A in the width direction X.

A plurality of (three in the present embodiment) first power semiconductor elements 30A and a plurality of (three in the present embodiment) first diodes 40A are arranged on the first plate main surface 95C of the first graphite plate 90C. In further detail, the first power semiconductor elements 30A and the first diodes 40A are bonded by a conductive bonding material such as Ag paste or solder to the main surface conductive layer 97A, which is formed on the first plate main surface 95C. In the description hereafter, to aid understanding, the three first power semiconductor elements 30A are respectively referred to as the first power semiconductor elements 30Ad, 30Ae, and 30Af, and the three first diodes 40A are respectively referred to as the first diodes 40Ad, 40Ae, and 40Af.

In plan view, the first power semiconductor elements 30Ad, 30Ae, and 30Af are aligned in the length direction Y and spaced apart from one another in the width direction X. The first power semiconductor elements 30Ad, 30Ae, and 30Af are each located toward the plate first side surface 91C of the first graphite plate 90C in the length direction Y. In the present embodiment, the first power semiconductor elements 30Ad, 30Ae, and 30Af are each arranged on the end of the first plate main surface 95C of the first graphite plate 90C (main surface conductive layer 97C) located toward the plate first side surface 91C in the length direction Y. In further detail, in plan view, the first power semiconductor elements 30Ad, 30Ae, and 30Af are each arranged adjacent to the plate first side surface 91C in the length direction Y. In this manner, in plan view, the first power semiconductor elements 30Ad, 30Ae, and 30Af are each arranged proximate to the first control layer 15C and the first detection layer 16C in the length direction Y.

The first power semiconductor element 30Ad is located toward the plate third side surface 93C of the first graphite plate 90C in the width direction X. In the present embodiment, the first power semiconductor element 30Ac is arranged on the end of the first plate main surface 95C of the first graphite plate 90C (main surface conductive layer 97C) located toward the plate third side surface 93C in the width direction X. In further detail, in plan view, the first power semiconductor element 30Ac is arranged adjacent to the plate third side surface 93C in the width direction X. The first power semiconductor element 30Ac overlaps the first control layer 15C and the first detection layer 16C as viewed in the length direction Y.

The first power semiconductor element 30Ae is arranged in the middle portion of the first plate main surface 95C of the first graphite plate 90C (main surface conductive layer 97C) in the width direction X.

The first power semiconductor elements 30Af is located toward the plate fourth side surface 94C of the first graphite plate 90C in the width direction X. In the present embodiment, the first power semiconductor element 30Af is arranged on the end of the first plate main surface 95C of the first graphite plate 90C (main surface conductive layer 97C) located toward the plate fourth side surface 94C in the width direction X. In further detail, in plan view, the first power semiconductor element 30Af is arranged adjacent to the plate fourth side surface 94C in the width direction X. Further, the first power semiconductor element 30Af is located toward the fourth side surface 12d of the second substrate 12 from the first control layer 15C and the first detection layer 16C in the width direction X. The first power semiconductor element 30Af overlaps the connecting portion 13d of the first mounting layer 13C as viewed in the length direction Y.

The distance DX9 between the first power semiconductor element 30Ad and the first power semiconductor element 30Ae in the width direction X is greater than the distance DX10 between the first power semiconductor element 30Ad and the coupling member 100A in the width direction X. In one example, the distance DX9 is two times or greater than the distance DX10. Preferably, the distance DX9 is three times or greater than the distance DX10. Further preferably, the distance DX9 is four times or greater than the distance DX10. In the present embodiment, the distance DX9 is approximately 7.4 times the distance DX10.

The distance DX11 between the first power semiconductor element 30Af and the first power semiconductor element 30Ae in the width direction X is greater than the distance DX12 between the first power semiconductor element 30Af and the connecting portion 52b of the output terminal 52A in the width direction X. In one example, the distance DX11 is two times or greater than the distance DX12. Preferably, the distance DX11 is three times or greater than the distance DX12. Further preferably, the distance DX11 is four times or greater than the distance DX12. In the present embodiment, the distance DX11 is approximately 4.6 times the distance DX12. Further, in the present embodiment, the distance DX11 is equal to the distance DX9. Here, if the difference between the distance DX11 and the distance DX9 is within 5% of the distance DX9, this will mean that the distance DX11 is equal to the distance DX9.

In plan view, the first diodes 40Ad, 40Ae, and 40Af are aligned in the length direction Y and spaced apart from one another in the width direction X. The first diodes 40Ad, 40Ae, and 40Af are each located toward the plate second side surface 92C of the first graphite plate 90C in the length direction Y. In the present embodiment, the first diodes 40Ad, 40Ae, and 40Af are each arranged on the end of the first plate main surface 95C of the first graphite plate 90C (main surface conductive layer 97C) that is located toward the plate second side surface 92C in the length direction Y. In further detail, in plan view, the first diodes 40Ad, 40Ae, and 40Af are each arranged adjacent to the plate second side surface 92C in the length direction Y In this manner, in plan view, the first diodes 40Ad, 40Ae, and 40Af are each arranged at the side opposite to the first control layer 15C and the first detection layer 16C in the length direction Y The first diodes 40Ad, 40Ae, and 40Af are each located proximate to the second mounting layer 13D in the length direction Y.

As shown in FIG. 10, the first diode 40Ad is aligned with the first power semiconductor element 30Ad in the width direction X and spaced apart from the first power semiconductor element 30Ad in the length direction Y. The first diode 40Ae is aligned with the first power semiconductor element 30Ae in the width direction X and spaced apart from the first power semiconductor element 30Ae in the length direction Y. The first diode 40Af is aligned with the first power semiconductor element 30Af in the width direction X and spaced apart from the first power semiconductor element 30Af in the length direction Y.

As shown in FIGS. 9, 10, and 12, the first power semiconductor elements 30Ad, 30Ae, and 30Af have the same structure and are oriented in the same direction. Further, the first power semiconductor elements 30Ad, 30Ae, and 30Af have the same structure as the first power semiconductor elements 30Aa, 30Ab, and 30Ac. Thus, same reference numerals are given to those elements of the first power semiconductor elements 30Ad, 30Ae, and 30Af that are the same as the corresponding elements of the first power semiconductor elements 30Aa, 30Ab, and 30Ac. Such elements will not be described in detail.

Figure 18:
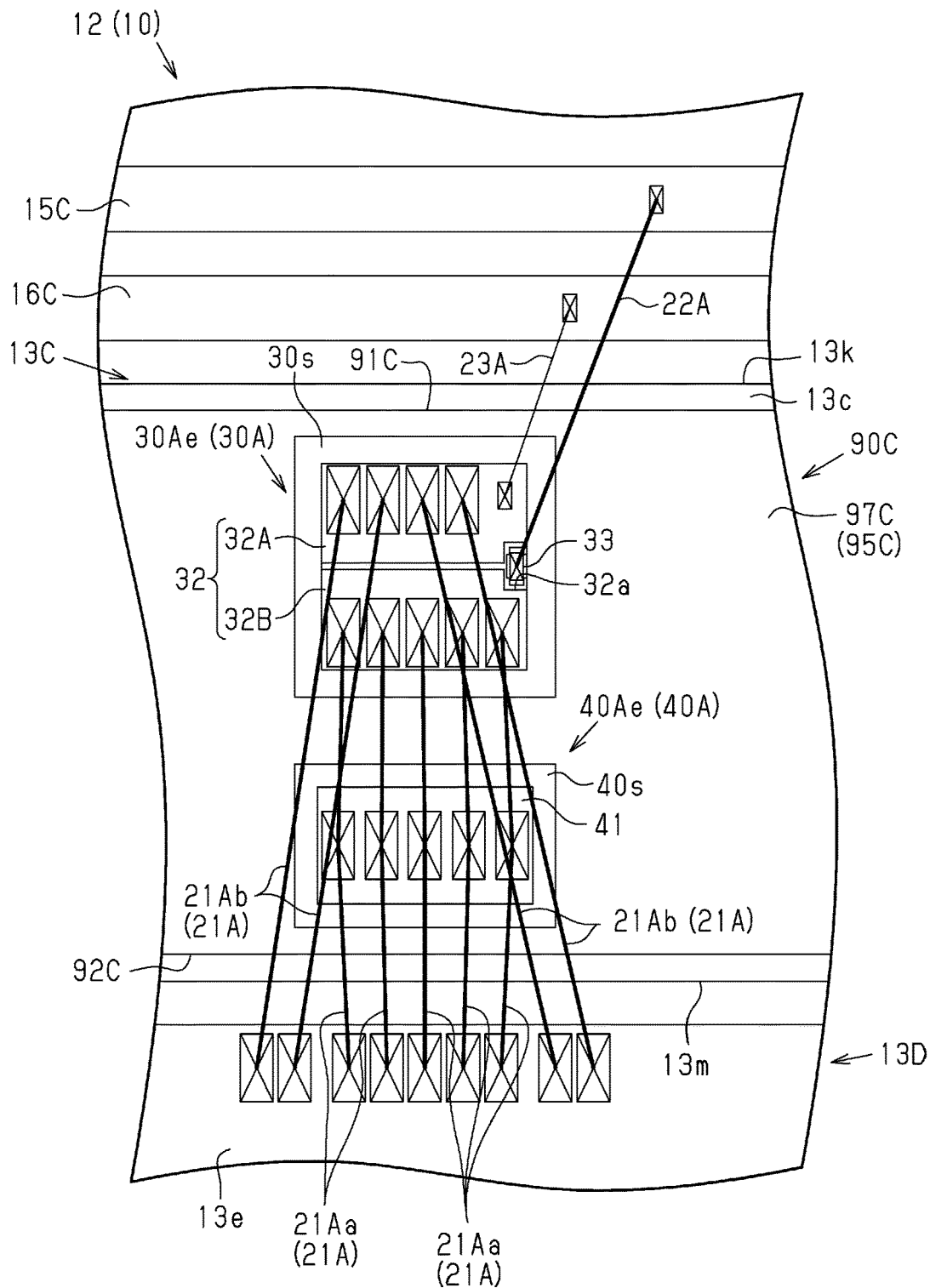
FIG. 18 is an enlarged view of a second power semiconductor element, a second diode, and their surroundings.

As shown in FIG. 18, in the present embodiment, the first power semiconductor elements 30Ad, 30Ae, and 30Af are oriented differently from the first power semiconductor elements 30Aa, 30Ab, and 30Ac. More specifically, the first power semiconductor elements 30Aa, 30Ab, and 30Ac are each oriented so that the gate electrode 33 is located toward the fourth side surface 11d of the first substrate 11, or the terminal seat 82B (refer to FIG. 14), whereas the first power semiconductor elements 30Ad, 30Ae, and 30Af are each oriented so that the gate electrode 33 is located toward the third side surface 12c of the second substrate 12, or the terminal seat 82A.

As shown in FIGS. 9, 10, 19, and 20, the first diodes 40Ad, 40Ae, and 40Af have the same structure. Further, the first diodes 40Ad, 40Ae, and 40Af have the same structure as the first diodes 40Aa, 40Ab, and 40Ac. Thus, same reference numerals are given to those elements of the first diodes 40Ad, 40Ae, and 40Af that are the same as the corresponding elements of the first diodes 40Aa, 40Ab, and 40Ac. Such elements will not be described in detail.

As shown in FIGS. 9, 10, and 18 to 20, the connection relationship of the first power semiconductor elements 30Ad, 30Ae, and 30Af and the first diodes 40Ad, 40Ae, and 40Af with respect to the first element connecting members 21A, the first control connecting members 22A, and the first detection connecting members 23A is the same as, for example, the connection relationship of the first power semiconductor elements 30Ab and the first diodes 40Ab with respect to the first element connecting members 21A, the first control connecting members 22A, and the first detection connecting members 23A.

Further, the relationship of where the first control connecting members 22A are connected to the gate electrodes 33 of the first power semiconductor elements 30Ad, 30Ae, and 30Af with respect to where the first control connecting members 22A are connected to the first control layer 15C in the width direction X differs from the relationship of where the first control connecting members 22A are connected to the gate electrodes 33 of the first power semiconductor elements 30Aa, 30Ab, and 30Ac with respect to where the first control connecting members 22A are connected to the first control layer 15A in the width direction X. In one example, as shown in FIGS. 10 and 18, a first control connecting member 22A is connected to the first control layer 15C at a position located toward the third side surface 12c of the second substrate 12 from where the first control connecting member 22A is connected to the gate electrode 33 of the first power semiconductor element 30Ae in the width direction X.

The first control connecting member 22A that is connected to the gate electrode 33 of the first power semiconductor element 30Ad is connected to the end of the first control layer 15C located toward the third side surface 12c of the second substrate 12. The first control connecting member 22A that is connected to the gate electrode 33 of the first power semiconductor element 30Ae is connected to the middle portion of the first control layer 15C in the width direction X. The first control connecting member 22A that is connected to the gate electrode 33 of the first power semiconductor element 30Af is connected to the end of the first control layer 15C located toward the fourth side surface 12d of the second substrate 12 in the width direction X.

Further, the relationship of where the first detection connecting members 23A are connected to the source electrodes 32 of the first power semiconductor elements 30Ad, 30Ae, and 30Af with respect to where the first detection connecting members 23A are connected to the first detection layer 16C in the width direction X differs from the relationship of where the first detection connecting members 23A are connected to the source electrodes 32 of the first power semiconductor elements 30Aa, 30Ab, and 30Ac with respect to where the first detection connecting members 23A are connected to the first detection layer 16A in the width direction X. In one example, as shown in FIGS. 10 and 18, a first detection connecting member 23A is connected to the first detection layer 16C at a position located toward the third side surface 12c of the second substrate 12 from where the first detection connecting member 23A is connected to the source electrode 32 of the first power semiconductor element 30Ae in the width direction X.

Further, each first detection connecting member 23A is connected to a portion of the first source electrode 32A of the corresponding one of the first power semiconductor elements 30Ad, 30Ab, and 30Ac that is located toward the third side surface 12c of the second substrate 12 in the width direction X.

The first detection connecting member 23A that is connected to the first source electrode 32A of the first power semiconductor element 30Ad is connected to the end of the first detection layer 16C located toward the third side surface 12c of the second substrate 12 in the width direction X. In further detail, the first detection connecting member 23A that is connected to the first source electrode 32A of the first power semiconductor element 30Ad is connected to a portion of the first detection layer 16C located between a portion of the first detection layer 16C connected to the first detection terminal connecting member 26A and a portion of the first detection layer 16C connected to the first detection layer connecting member 104A in the width direction X.

The first detection connecting member 23A that is connected to the first source electrode 32A of the first power semiconductor element 30Ae is connected to the middle portion of the first detection layer 16C in the width direction X. The first detection connecting member 23A that is connected to the first source electrode 32A of the first power semiconductor element 30Af is connected to the end of the first detection layer 16C located toward the fourth side surface 12d of the second substrate 12 in the width direction X.

Figure 21:
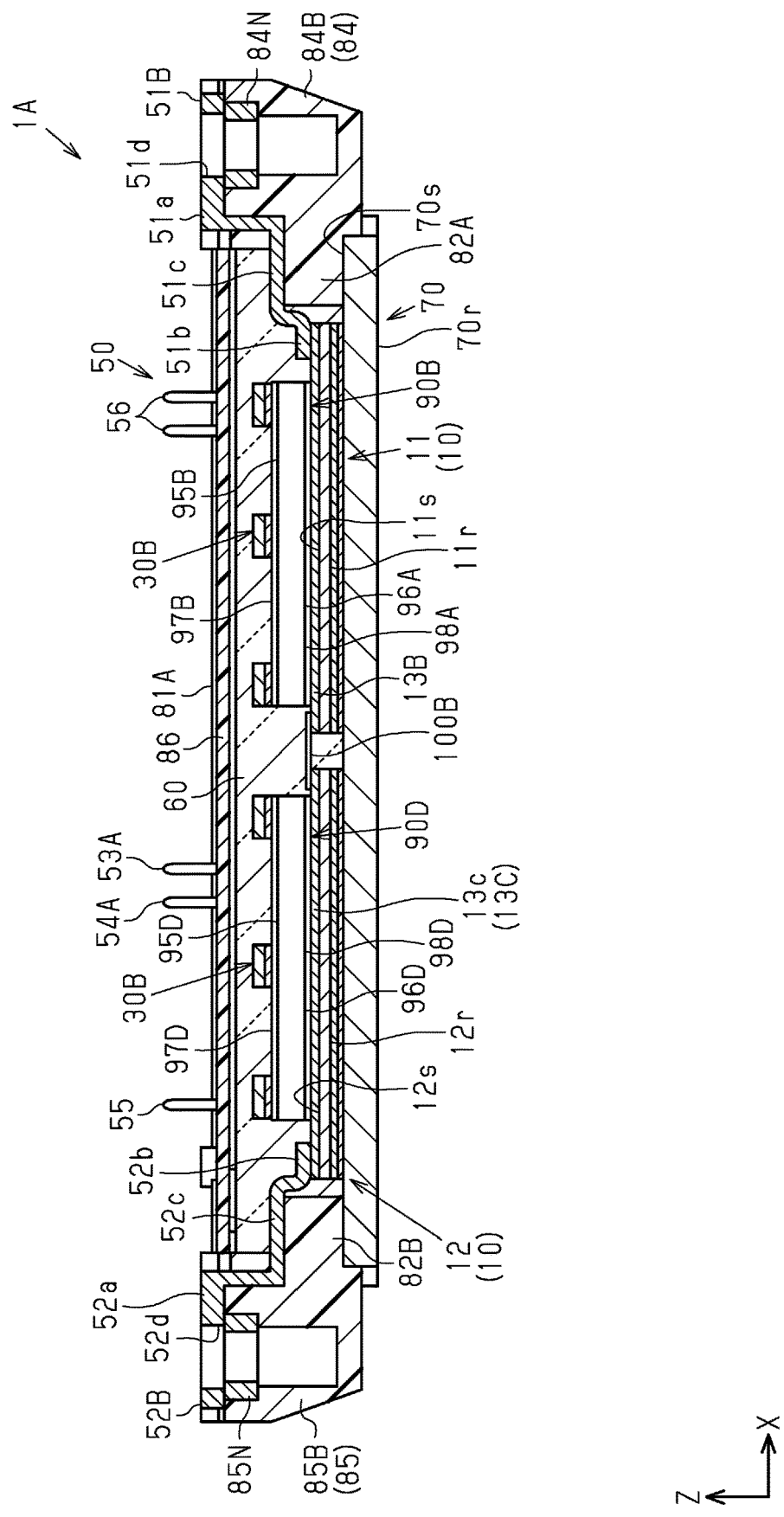
FIG. 21 is a cross-sectional view taken along line 21-21 in FIG. 7.

As shown in FIG. 21, three second power semiconductor elements 30B are electrically connected to the first substrate 11 and three second power semiconductor elements 30B are electrically connected to the second substrate 12. More specifically, in the present embodiment, six second power semiconductor elements 30B form a lower arm of the inverter circuit (second power semiconductor element group 30BT of FIG. 8). A second graphite plate 90B, which is an example of a graphite plate, is arranged on the first substrate 11, and three second power semiconductor elements 30B are arranged on the second graphite plate 90B. A second graphite plate 90D, which is an example of a graphite plate, is arranged on the second substrate 12, and three second power semiconductor elements 30B are arranged on the second graphite plate 90D. The graphite plates 90B and 90D and the second power semiconductor elements 30B will now be described in detail.

As shown in FIG. 9, the second graphite plate 90B is arranged on the second mounting layer 13B. The second graphite plate 90B is bonded by a conductive bonding material such as Ag paste or solder to the second mounting layer 13B. The shape of the second graphite plate 90B in plan view is rectangular so that the width direction X is the long-side direction and the length direction Y is the short-side direction. The dimension of the second graphite plate 90B in the length direction Y is less than the width of the second mounting layer 13B (dimension of second mounting layer 13B in length direction Y). The thickness of the second graphite plate 90B (dimension of second graphite plate 90B in thickness direction Z) is greater than the thickness of the first substrate 11 (dimension of first substrate 11 in thickness direction Z).

The second graphite plate 90B has the same size as the first graphite plate 90A. In further detail, the dimension of the second graphite plate 90B in the length direction Y is equal to the dimension of the first graphite plate 90A in the length direction Y. Further, the dimension of the second graphite plate 90B in the width direction X is equal to the dimension of the first graphite plate 90A in the width direction X. The thickness of the second graphite plate 90B (dimension of second graphite plate 90B in thickness direction Z) is equal to the thickness of the first graphite plate 90A (dimension of first graphite plate 90A in thickness direction Z).

Here, as long as the difference in the dimension of the second graphite plate 90B in the length direction Y and the dimension of the first graphite plate 90A in the length direction Y is, for example, within 5% of the dimension of the first graphite plate 90A in the length direction Y, this will mean that the dimension of the second graphite plate 90B in the length direction Y is equal to the dimension of the first graphite plate 90A in the length direction Y. Further, as long as the difference in difference of the second graphite plate 90B in the width direction X and the dimension of the first graphite plate 90A in the width direction X is, for example, within 5% of the dimension of the first graphite plate 90A in the width direction X, this will mean that the dimension of the second graphite plate 90B in the width direction X is equal to the dimension of the first graphite plate 90A in the width direction X. Further, as long as the difference in the dimension of the second graphite plate 90B in the thickness direction Z and the dimension of the first graphite plate 90A in the thickness direction Z is, for example, within 5% of the dimension of the first graphite plate 90A in the thickness direction Z, this will mean that the thickness of the second graphite plate 90B is equal to the thickness of the first graphite plate 90A.

Figure 20:
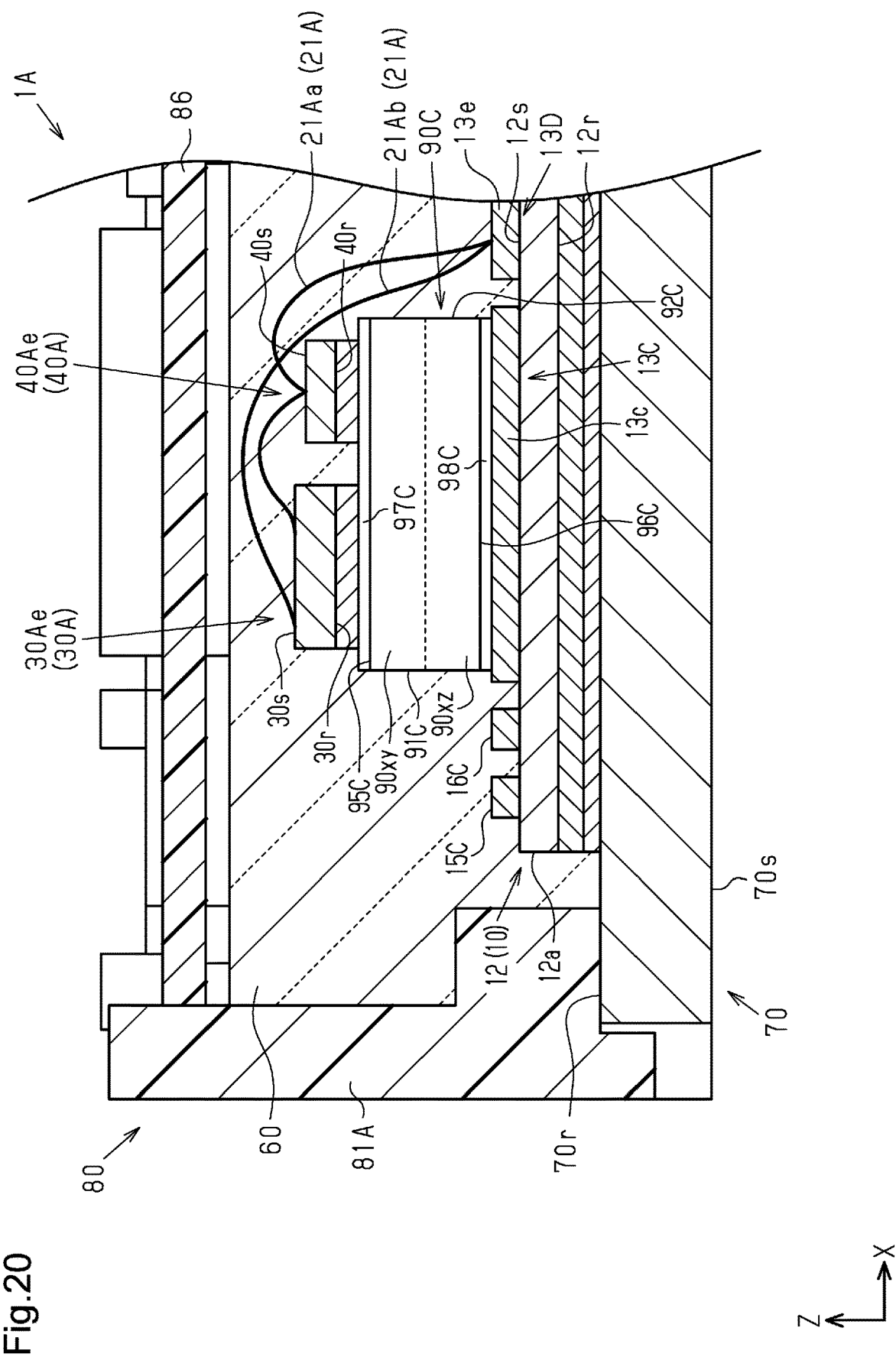
FIG. 20 is a partially enlarged view of FIG. 19.
Figure 22:
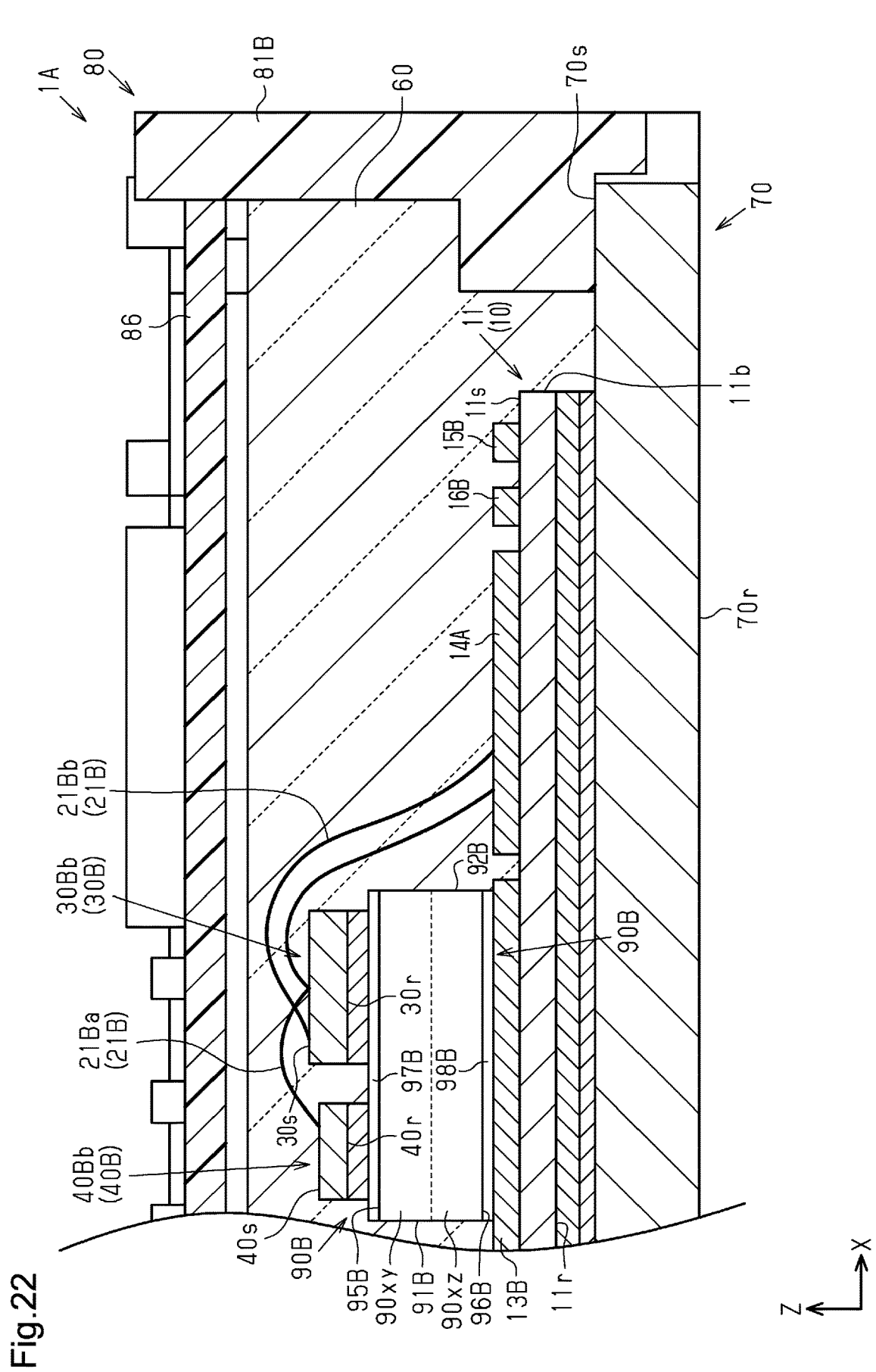
FIG. 22 is a partially enlarged view of FIG. 15.

As shown in FIGS. 15, 20, and 22, the second graphite plate 90B includes a second plate main surface 95B and a second plate back surface 96B at opposite sides in the thickness direction Z. The second plate main surface 95B is an example of a plate main surface and faces the same way as the first substrate main surface 11s of the first substrate 11 in the thickness direction Z. The second plate back surface 96B is an example of a plate back surface and faces the same way as the first substrate back surface 11r of the first substrate 11 in the thickness direction Z. A main surface conductive layer 97B is formed on the second plate main surface 95B. A back surface conductive layer 98B is formed on the second plate back surface 96B. Thus, when the second graphite plate 90B is mounted on the second mounting layer 13B, the back surface conductive layer 98B is bonded to the second mounting layer 13B by a conductive material. In the present embodiment, the main surface conductive layer 97B is formed over the entire second plate main surface 95B. The back surface conductive layer 98B is formed over the entire second plate back surface 96B. The main surface conductive layer 97B may be formed on part of the second plate main surface 95B. The back surface conductive layer 98B may be formed on part of the second plate back surface 96B.

As shown in FIG. 9, the second graphite plate 90B includes a plate first side surface 91B and a plate second side surface 92B at opposite sides in the length direction Y and a plate third side surface 93B and a plate fourth side surface 94B in the width direction X. The plate first side surface 91B faces the same direction as the first side surface 11a of the first substrate 11, and the plate second side surface 92B faces the same direction as the second side surface 11b of the first substrate 11. The plate third side surface 93B faces the same direction as the third side surface 11c of the first substrate 11, and the plate fourth side surface 94B faces the same direction as the fourth side surface 11d of the first substrate 11.

In plan view, the plate first side surface 91B is located toward the second side surface 11b of the first substrate 11 from an edge 13i of the second mounting layer 13B that is located toward the first side surface 11a of the first substrate 11 in the length direction Y and spaced apart from the edge 13i in the length direction Y. In plan view, the plate second side surface 92B is located toward the first side surface 11a of the first substrate 11 from an edge 13j of the second mounting layer 13B located toward the second side surface 11b of the first substrate 11 in the length direction Y and arranged next to the edge 13j in the length direction Y. The dimension of the second graphite plate 90B in the length direction Y is less than the dimension of the second mounting layer 13B (dimension of main mounting portion 13a in length direction Y). Further, the second graphite plate 90B is arranged on the second mounting layer 13B toward the second side surface 11b of the first substrate 11 in the length direction Y. This obtains connection space on the second mounting layer 13B allowing the first element connecting members 21A, which are connected to the first power semiconductor elements 30A and the first diodes 40A, to be connected to the second mounting layer 13B.

in plan view, the plate third side surface 93B is at the end of the second mounting layer 13B that is located toward the third side surface 11c of the first substrate 11 in the width direction X. In plan view, the plate fourth side surface 94B is at the end of the second mounting layer 13B that is located toward the fourth side surface 11d of the first substrate 11. In detail, in plan view, the plate fourth side surface 94B is located next to the coupling member 100B, which is connected to the second mounting layer 13B, in the width direction X. In this manner, the length of the second graphite plate 90B in the width direction X is maximized on the second mounting layer 13B between the edge located toward the third side surface 11c of the first substrate 11 and the coupling member 100B in the width direction X.

A plurality of (three in the present embodiment) second power semiconductor elements 30B and a plurality of (three in the present embodiment) second diodes 40B are arranged on the second plate main surface 95B of the second graphite plate 90B. In further detail, the second power semiconductor elements 30B and the second diodes 40B are bonded by a conductive bonding material such as Ag paste or solder to the main surface conductive layer 97B, which is formed on the second plate main surface 95B. In the description hereafter, to aid understanding, the three second power semiconductor elements 30B are respectively referred to as the second power semiconductor elements 30Ba, 30Bb, and 30Bc, and the three second diodes 40B are respectively referred to as the second diodes 40Ba, 40Bb, and 40Bc.

In plan view, the second power semiconductor elements 30Ba, 30Bb, and 30Bc are aligned in the length direction Y and spaced apart from one another in the width direction X. The second power semiconductor elements 30Ba, 30Bb, and 30Bc are each located toward the plate second side surface 92B of the second graphite plate 90B in the length direction Y. In the present embodiment, the second power semiconductor elements 30Ba, 30Bb, and 30Bc are each arranged on the end of the second plate main surface 95B of the second graphite plate 90B (main surface conductive layer 97B)

located toward the plate second side surface 92B in the length direction Y. In further detail, in plan view, the second power semiconductor elements 30Ba, 30Bb, and 30Bc are each arranged adjacent to the plate second side surface 92B in the length direction Y. In this manner, in plan view, the second power semiconductor elements 30Ba, 30Bb, and 30Bc are each arranged proximate to the conductive layer 14A in the length direction Y.

The second power semiconductor element 30Ba is located toward the plate third side surface 93B of the second graphite plate 90B in the width direction X. In the present embodiment, the second power semiconductor element 30Ba is arranged on the end of the second plate main surface 95B of the second graphite plate 90B (main surface conductive layer 97B) located toward the plate third side surface 93B in the width direction X. In further detail, in plan view, the second power semiconductor element 30Ba is arranged adjacent to the plate third side surface 93B in the width direction X. The second power semiconductor element 30Ba overlaps the second control layer 15B and the second detection layer 16B as viewed in the length direction Y. Further, the second power semiconductor element 30Ba overlaps the first power semiconductor element 30Aa and the first diode 40Aa as viewed in the length direction Y. That is, the second power semiconductor element 30Ba is aligned with the first power semiconductor element 30Aa and the first diode 40Aa in the width direction X and spaced apart from the first power semiconductor element 30Aa and the first diode 40Aa in the length direction Y.

The second power semiconductor element 30Bb is arranged in the middle portion of the second plate main surface 95B of the second graphite plate 90B (main surface conductive layer 97B) in the width direction X. Further, the second power semiconductor element 30Bb overlaps the first power semiconductor element 30Ab and the first diode 40Ab as viewed in the length direction Y. That is, the second power semiconductor element 30Bb is aligned with the first power semiconductor element 30Ab and the first diode 40Ab in the width direction X and spaced apart from the first power semiconductor element 30Ab and the first diode 40Ab in the length direction Y.

The second power semiconductor element 30Bc is located toward the plate fourth side surface 94B of the second graphite plate 90B in the width direction X. In the present embodiment, the second power semiconductor element 30Bc is arranged on the end of the second plate main surface 95B of the second graphite plate 90B (main surface conductive layer 97B) located toward the plate fourth side surface 94B in the width direction X. In further detail, in plan view, the second power semiconductor element 30Bc is arranged adjacent to the plate fourth side surface 94B in the width direction X. Further, the second power semiconductor element 30Bc overlaps the first power semiconductor element 30Ac and the first diode 40Ac as viewed in the length direction Y. That is, the second power semiconductor element 30Bc is aligned with the first power semiconductor element 30Ac and the first diode 40Ac in the width direction X and spaced apart from the first power semiconductor element 30Ac and the first diode 40Ac in the length direction Y.

The distance DX5 between the second power semiconductor element 30Ba and the second power semiconductor element 30Bb in the width direction X is greater than the distance DX6 between the second power semiconductor element 30Ba and the connecting portion 51b of the second input terminal 51B in the width direction X. In one example, the distance DX5 is two times or greater than the distance DX6. Preferably, the distance DX5 is three times or greater than the distance DX6. Further preferably, the distance DX5 is four times or greater than the distance DX6. In the present embodiment, the distance DX5 is approximately 4.6 times the distance DX6.

The distance DX7 between the second power semiconductor element 30Bc and the second power semiconductor element 30Bb in the width direction X is greater than the distance DX8 between the second power semiconductor element 30Bc and the coupling member 100B in the width direction X. In one example, the distance DX7 is two times or greater than the distance DX8. Preferably, the distance DX7 is three times or greater than the distance DX8. Further preferably, the distance DX7 is four times or greater than the distance DX8. In the present embodiment, the distance DX7 is approximately 7.4 times the distance DX8. Further, in the present embodiment, the distance DX7 is equal to the distance DX5. Here, if the difference between the distance DX7 and the distance DX5 is within 5% of the distance DX5, this will mean that the distance DX7 is equal to the distance DX5.

In plan view, the second diodes 40Ba, 40Bb, and 40Bc are aligned in the length direction Y and spaced apart from one another in the width direction X. The second diodes 40Ba, 40Bb, and 40Bc are each located toward the plate first side surface 91B of the second graphite plate 90B in the length direction Y. In the present embodiment, the second diodes 40Ba, 40Bb, and 40Bc are each arranged on the end of the second plate main surface 95B of the second graphite plate 90B (main surface conductive layer 97B) that is located toward the plate first side surface 91B in the length direction Y. In further detail, in plan view, the second diodes 40Ba, 40Bb, and 40Bc are each arranged adjacent to the plate first side surface 91B in the length direction Y. In further detail, in plan view, the second diodes 40Ba, 40Bb, and 40Bc are each arranged adjacent to the plate first side surface 91B in the length direction Y. In this manner, in plan view, the second diodes 40Ba, 40Bb, and 40Bc are each arranged at the side opposite to the second control layer 15B and the second detection layer 16B in the length direction Y. The second diodes 40Ba, 40Bb, and 40Bc are each located proximate to the first mounting layer 13A (first graphite plate 90A) in the length direction Y.

The second diode 40Ba is aligned with the second power semiconductor element 30Ba in the width direction X and spaced apart from the second power semiconductor element 30Ba in the length direction Y. The second diode 40Bb is aligned with the second power semiconductor element 30Bb in the width direction X and spaced apart from the second power semiconductor element 30Bb in the length direction Y. The second diode 40Bc is aligned with the second power semiconductor element 30Bc in the width direction X and spaced apart from the second power semiconductor element 30Bc in the length direction Y.

The second power semiconductor elements 30Ba, 30Bb, and 30Bc are identical in structure and oriented in the same direction. More specifically, the element back surface 30r of each of the second power semiconductor elements 30Ba, 30Bb, and 30Bc is bonded to the main surface conductive layer 97B of the second graphite plate 90B, and the element main surface 30s is located at the side opposite to the second graphite plate 90B in the thickness direction Z. In the present embodiment, the second power semiconductor elements 30Ba, 30Bb, and 30Bc have the same structure as the first power semiconductor elements 30Aa, 30Ab, and 30Ac. Thus, same reference numerals are given to those elements of the second power semiconductor elements 30Ba, 30Bb, and 30Bc that are the same as the corresponding elements of the first power semiconductor elements 30Aa, 30Ab, and 30Ac. Such elements will not be described in detail. The element main surface of each second power semiconductor element 30B is one example of the second element main surface recited in the claims, and the element back surface of each second power semiconductor element 30B is one example of the second element back surface recited in the claims.

The second diodes 40Ba, 40Bb, and 40Bc are identical in structure. In the present embodiment, the second diodes 40Ba, 40Bb, and 40Bc have the same structure as the first diodes 40Aa, 40Ab, and 40Ac. Thus, same reference numerals are given to those elements of the second diodes 40Ba, 40Bb, and 40Bc that are the same as the corresponding elements of the first diodes 40Aa, 40Ab, and 40Ac. Such elements will not be described in detail. In the same manner as the first diodes 40A, the second diodes 40Ba, 40Bb, and 40Bc each include the main surface 40s and the back surface 40r. The main surface 40s is an example of the second main surface of the second diode recited in the claims, and the back surface 40r is an example of the second back surface of the second diode recited in the claims.

The relationship of the second power semiconductor elements 30B and the second diodes 40B with respect to the second element connecting members 21B, the second control connecting members 22B, and the second detection connecting members 23B will now be described.

Figure 23:
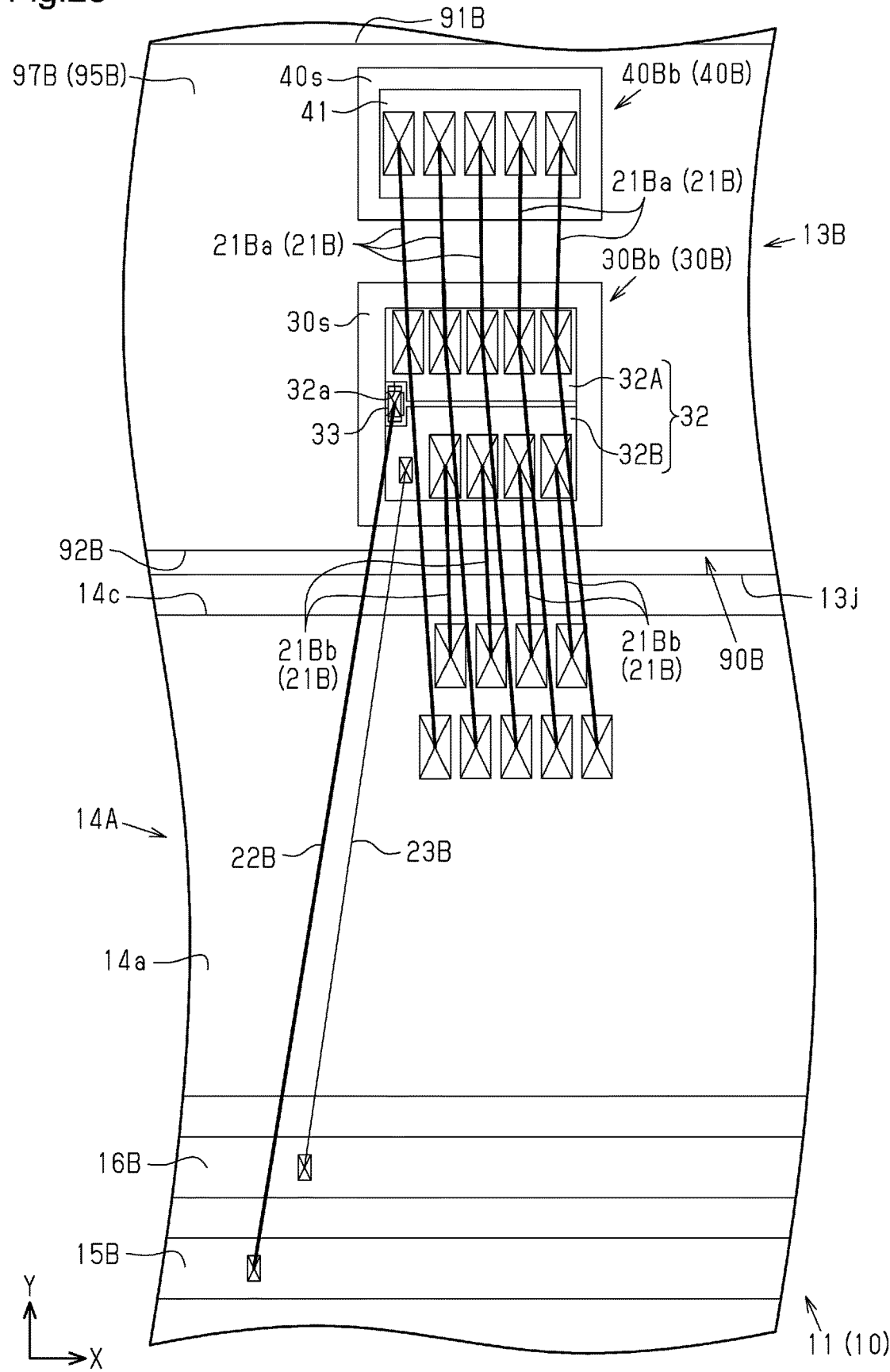
FIG. 23 is an enlarged view of the first power semiconductor element, the first diode, and their surroundings.

As shown in FIG. 23, the source electrode 32 of the second power semiconductor element 30Bb, the anode electrode 41 of the second diode 40Bb, and the conductive layer 14A are connected by the second element connecting members 21B. In further detail, the second element connecting members 21B include a plurality of (five in the present embodiment) second element connecting members 21Ba and a plurality of (four in the present embodiment) second element connecting members 21Bb. The second element connecting members 21Ba each connect the first source electrode 32A of the second power semiconductor element 30Bb, the anode electrode 41 of the second diode 40Bb, and the conductive layer 14A. The second element connecting members 21Bb each connect the second source electrode 32B of the second power semiconductor element 30Bb and the conductive layer 14A.

The second element connecting members 21Bb are connected to the portion of the second source electrode 32B located toward the plate third side surface 93B of the second graphite plate 90B (refer to FIG. 9) in the width direction X. The second element connecting members 21Bb are connected to the second source electrode 32B in a state aligned in the length direction Y and spaced apart in the width direction X. The second element connecting members 21Bb are connected to the conductive layer 14A in a state aligned in the length direction Y and spaced apart in the width direction X. The second element connecting members 21Bb are each arranged next to an edge 14c of the conductive layer 14A located toward the first side surface 11a of the first substrate 11 (refer to FIG. 9) in the length direction Y. In plan view, the second element connecting members 21Bb extend diagonally toward the third side surface 11c of the first substrate 11 (refer to FIG. 9) from the second source electrode 32B to the conductive layer 14A.

The second element connecting members 21Ba are connected to the second source electrode 32B in a state aligned in the length direction Y and spaced apart in the width direction X, connected to the anode electrode 41 in a state aligned in the length direction Y and spaced apart in the width direction X, and connected to the conductive layer 14A in a state aligned in the length direction Y and spaced apart in the width direction X. In plan view, the portion of each second element connecting member 21Ba connecting the second source electrode 32B and the anode electrode 41 extends in the length direction Y. In plan view, the portion of each second element connecting member 21Ba connecting the second source electrode 32B and the conductive layer 14A extends diagonally toward the third side surface 11c of the first substrate 11 from the second source electrode 32B to the conductive layer 14A. The portion of each second element connecting member 21Ba connecting the anode electrode 41 and the conductive layer 14A extend beyond the second element connecting members 21Bb. Thus, the second element connecting members 21Ba are connected to the portion of the conductive layer 14A located toward the second side surface 11b of the first substrate 11 from the second element connecting members 21Bb in the length direction Y. As a result, the second element connecting members 21Ba do not overlap the second control connecting members 22B and the second detection connecting members 23B in plan view. Further, the second element connecting members 21Bb also extend diagonally in the same manner as the second element connecting members 21Ba. Thus, the second element connecting members 21Bb do not overlap the second element connecting members 21Ba in plan view.

In this manner, the second power semiconductor element 30Bb and the second diode 40Bb are connected in antiparallel. Further, the drain electrode 31 of the second power semiconductor element 30Bb and the cathode electrode 42 of the second diodes 40Bb are electrically connected to the source electrode 32 of the first power semiconductor element 30Ab and the anode electrode 41 of the first diode 40Ab. Further, the source electrode 32 of the second power semiconductor element 30Bb and the anode electrode 41 of the second diode 40Bb are electrically connected to the second input terminal 51B.

The second source electrode 32B of the second power semiconductor element 30Bb is connected to the second detection layer 16B by the second detection connecting member 23B. The second detection connecting member 23B is connected to a portion of the second source electrode 32B located toward the fourth side surface 11d of the first substrate 11 (refer to FIG. 9) from the second element connecting members 21Bb. The second detection connecting members 23B is connected to the middle portion of the second detection layer 16B in the width direction X. In this manner, the second detection connecting member 23B electrically connects the second source electrode 32B via the second detection layer 16B to the second detection terminal 54B.

The gate electrode 33 of the second power semiconductor element 30Bb is connected to the second control layer 15B by the second control connecting member 22B. The second control connecting member 22B is connected to the middle portion of the second control layer 15B in the width direction X. In this manner, the second control connecting member 22B electrically connects the gate electrode 33 via the second control layers 15B and 15D (refer to FIG. 11) to the second control terminal 53B.

As shown in FIG. 9, the configuration connecting the source electrode 32 of the second power semiconductor element 30Bc, the anode electrode 41 of the second diode 40Bc, and the conductive layer 14A with the second connecting members 21B (21Ba and 21Bb) and the configuration connecting the source electrode 32 of the second power semiconductor element 30Ba, the anode electrode 41 of the second diode 40Ba, and the conductive layer 14A with the second element connecting members 21B (21Ba and 21Bb) are the same as the configuration connecting the source electrode 32 of the second power semiconductor element 30Bb, the anode electrode 41 of the second diode 40Bb, and the conductive layer 14A with the second element connecting members 21B (21Ba, 21Bb).

Further, the configuration connecting the gate electrode 33 of the second power semiconductor element 30Ba and the second control layer 15B with the second control connecting member 22B and the configuration connecting the gate electrode 33 of the second power semiconductor element 30Bc and the second control layer 15B with the second control connecting member 22B are the same as the configuration connecting the gate electrode 33 of the second power semiconductor element 30Bb and the second control layer 15B with the second control connecting member 22B.

The second control connecting member 22B that is connected to the gate electrode 33 of the second power semiconductor element 30Ba is connected to a portion of the second control layer 15B located toward the third side surface 11c of the first substrate 11 in the width direction X. The second control connecting member 22B that is connected to the gate electrode 33 of the second power semiconductor element 30Bc is connected to the end of the second control layer 15B located toward the fourth side surface 11d of the first substrate 11 in the width direction X. In further detail, the second control connecting member 22B that is connected to the gate electrode 33 of the second power semiconductor element 30Bc is connected to a portion of the second control layer 15B adjacent to a portion of the second control layer 15B connected to the second control layer connecting member 103B in the width direction X.

Further, the configuration connecting the source electrode 32 of the second power semiconductor element 30Ba and the second detection layer 16B with the second detection connecting member 23B and the configuration connecting the source electrode 32 of the second power semiconductor element 30Bc and the second detection layer 16B with the second detection connecting member 23B are the same as the configuration connecting the source electrode 32 of the second power semiconductor element 30Bb and the second detection layer 16B with the second detection connecting member 23B.

The second detection connecting member 23B that is connected to the source electrode 32 of the second power semiconductor element 30Ba is connected to a portion of the second detection layer 16B located toward the third side surface 11c of the first substrate 11 in the width direction X. The second detection connecting member 23B that is connected to the source electrode 32 of the second power semiconductor element 30Bc is connected to the end of the second detection layer 16B located toward the fourth side surface 11d of the first substrate 11 in the width direction X. In further detail, the second detection connecting member 23B that is connected to the source electrode 32 of the second power semiconductor element 30Bc is connected to a portion of the second detection layer 16B adjacent to a portion of the second detection layer 16B connected to the second detection layer connecting member 104B in the width direction X.

Figure 24:
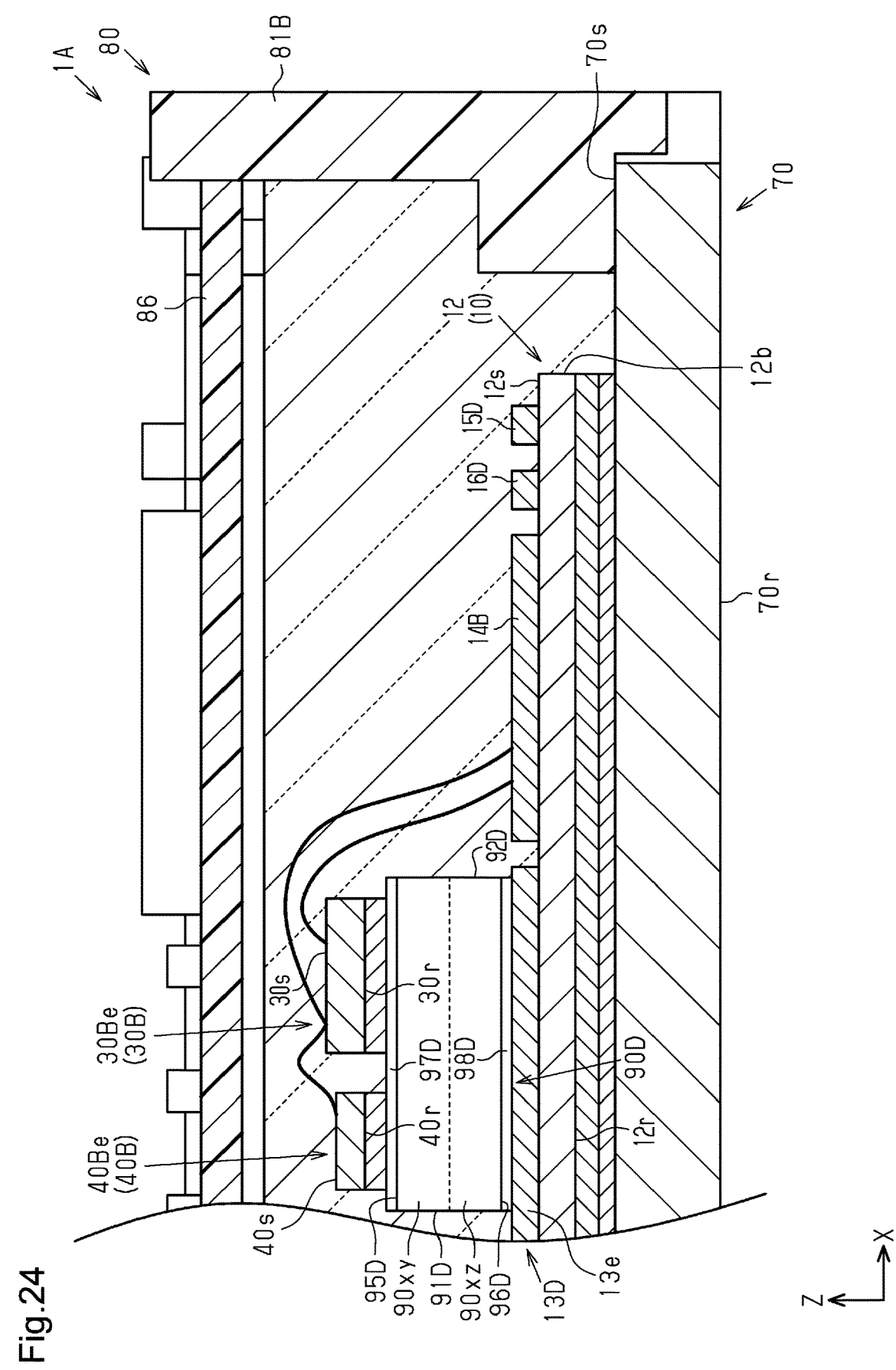
FIG. 24 is a partially enlarged view of FIG. 21.

As shown in FIGS. 10 and 24, the second graphite plate 90D is arranged on the second mounting layer 13D. The second graphite plate 90D is bonded by a conductive bonding material such as Ag paste or solder to the main mounting portion 13e of the second mounting layer 13D. The shape of the second graphite plate 90D in plan view is rectangular so that the width direction X is the long-side direction and the length direction Y is the short-side direction. The dimension of the second graphite plate 90D in the length direction Y is less than the dimension of the main mounting portion 13e of the second mounting layer 13D (dimension of main mounting portion 13e in length direction Y). The dimension of the second graphite plate 90D (dimension of second graphite plate 90D in thickness direction Z) is greater than the thickness of the second substrate 12 (dimension of second substrate 12 in thickness direction Z).

The second graphite plate 90D has the same size as the first graphite plate 90A. In further detail, the dimension of the second graphite plate 90D in the length direction Y is equal to the dimension of the first graphite plate 90A in the length direction Y. Further, the dimension of the second graphite plate 90D in the width direction X is equal to the dimension of the first graphite plate 90A in the width direction X. The thickness of the second graphite plate 90D (dimension of second graphite plate 90D in thickness direction Z) is equal to the thickness of the first graphite plate 90A (dimension of first graphite plate 90C in thickness direction Z).

Here, as long as the difference in the dimension of the second graphite plate 90D in the length direction Y and the dimension of the first graphite plate 90A in the length direction Y is, for example, within 5% of the dimension of the first graphite plate 90A in the length direction Y, this will mean that the dimension of the second graphite plate 90D in the length direction Y is equal to the dimension of the first graphite plate 90A in the length direction Y. Further, as long as the difference in difference of the second graphite plate 90D in the width direction X and the dimension of the first graphite plate 90A in the width direction X is, for example, within 5% of the dimension of the first graphite plate 90A in the width direction X, this will mean that the dimension of the second graphite plate 90D in the width direction X is equal to the dimension of the first graphite plate 90A in the width direction X. Further, as long as the difference in the dimension of the second graphite plate 90D in the thickness direction Z and the dimension of the first graphite plate 90A in the thickness direction Z is, for example, within 5% of the dimension of the first graphite plate 90A in the thickness direction Z, this will mean that the thickness of the second graphite plate 90D is equal to the thickness of the first graphite plate 90A.

Figure 19:
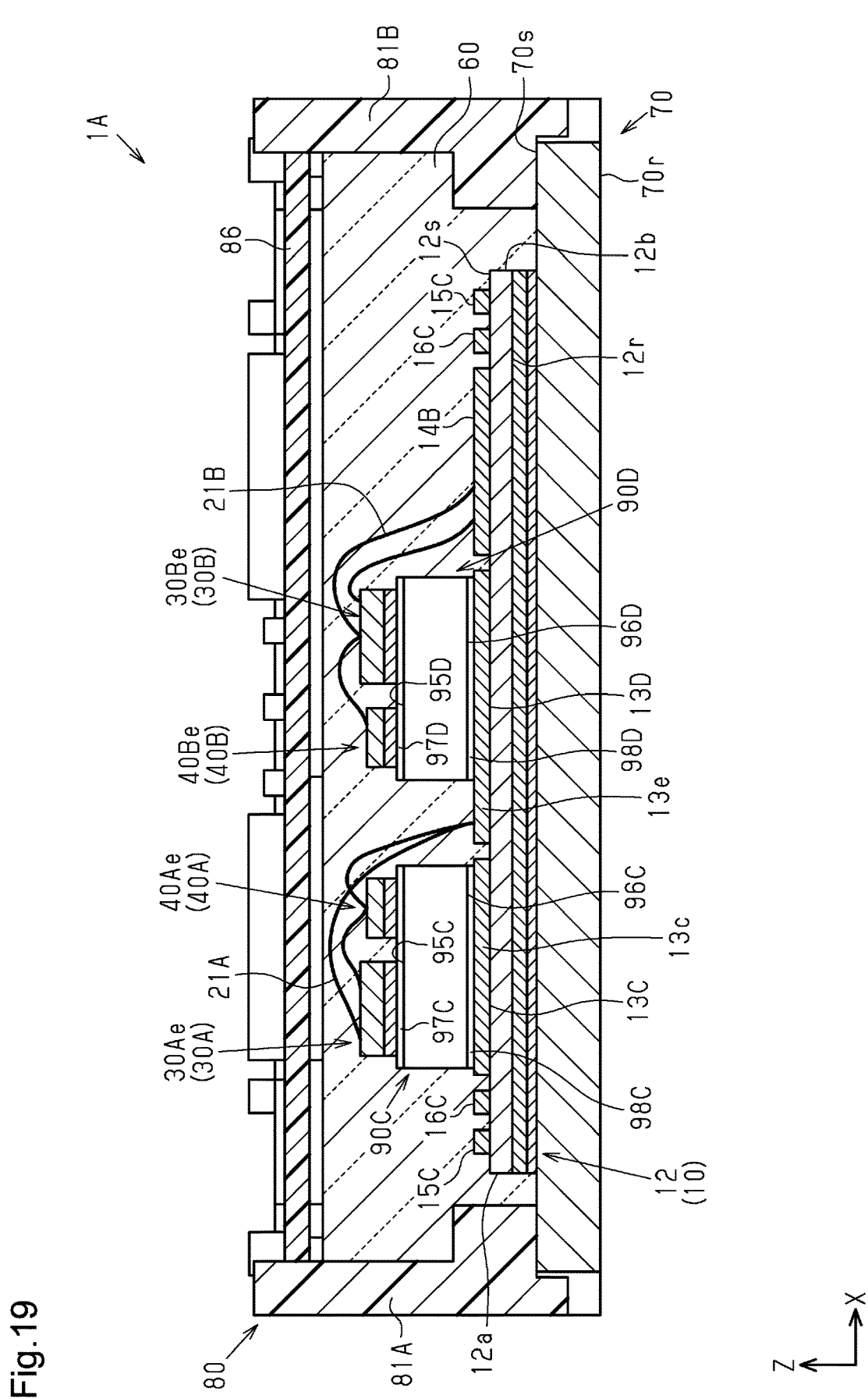
FIG. 19 is a cross-sectional view taken along line 19-19 in FIG. 7.

As shown in FIGS. 19 and 24, the second graphite plate 90D includes a second plate main surface 95D and a second plate back surface 96D at opposite sides in the thickness direction Z. The second plate main surface 95D faces the same direction as the second substrate main surface 12s of the second substrate 12 in the thickness direction Z. The second plate back surface 96D faces the same direction as the second substrate back surface 12r of the second substrate 12 in the thickness direction Z. A main surface conductive layer 97D is formed on the second plate main surface 95D. A back surface conductive layer 98D is formed on the second plate back surface 96D. Thus, when the second graphite plate 90D is mounted on the second mounting layer 13D, the back surface conductive layer 98D is bonded to the second mounting layer 13D by a conductive material. In the present embodiment, the main surface conductive layer 97D is formed over the entire second plate main surface 95D. The back surface conductive layer 98D is formed over the entire second plate back surface 96D. The main surface conductive layer 97D may be formed on part of the second plate main surface 95D. The back surface conductive layer 98D may be formed on part of the second plate back surface 96D.

As shown in FIG. 10, the second graphite plate 90D includes a plate first side surface 91D and a plate second side surface 92D at opposite sides in the length direction Y and a plate third side surface 93D and a plate fourth side surface 94D at opposite sides in the width direction X. The plate first side surface 91D faces the same direction as the first side surface 12a of the second substrate 12, and the plate second side surface 92D faces the same direction as the second side surface 12b of the second substrate 12. The plate third side surface 93D faces the same direction as the third side surface 12c of the second substrate 12, and the plate fourth side surface 94B faces the same direction as the fourth side surface 12d of the second substrate 12.

In plan view, the plate first side surface 91D is located toward the second side surface 12b of the second substrate 12 from an edge 13n of the second mounting layer 13D that is located toward the first side surface 12a of the second substrate 12 in the length direction Y and spaced apart from the edge 13n in the length direction Y. In plan view, the plate second side surface 92D is located toward the first side surface 12a of the second substrate 12 from an edge 13p of the second mounting layer 13D located toward the second side surface 12b of the second substrate 12 in the length direction Y and arranged next to the edge 13p in the length direction Y. The dimension of the second graphite plate 90D in the length direction Y is less than the dimension of the second mounting layer 13D (dimension of main mounting portion 13e in length direction Y). Further, the second graphite plate 90D is arranged on the main mounting portion 13e toward the second side surface 12b of the second substrate 12 in the length direction Y. This obtains a connection space on the main mounting portion 13e allowing the first element connecting members 21A, which are connected to the first power semiconductor elements 30A and the first diodes 40A, to be connected to the second mounting layer 13D.

In plan view, the plate third side surface 93D is at the end of the main mounting portion 13e of the second mounting layer 13D that is located toward the third side surface 12c of the second substrate 12 in the width direction X. In detail, in plan view, the plate third side surface 93D is located next to the coupling member 100B, which is connected to the second mounting layer 13D, in the width direction X. In plan view, the plate fourth side surface 94D is at the end of the main mounting portion 13e that is located toward the fourth side surface 12d of the second substrate 12. In detail, in plan view, the plate fourth side surface 94D is located next to the connecting portion 52b of the output terminal 52B in the width direction X. In this manner, the length of the second graphite plate 90B in the width direction X is maximized on the second mounting layer 13D between the connecting portion 52b of the output terminal 52B and the coupling member 100B in the width direction X.

A plurality of (three in the present embodiment) second power semiconductor elements 30B and a plurality of (three in the present embodiment) second diodes 40B are arranged on the second plate main surface 95D of the second graphite plate 90D. In further detail, the second power semiconductor elements 30B and the second diodes 40B are bonded by a conductive bonding material such as Ag paste or solder to the main surface conductive layer 97D, which is formed on the second plate main surface 95D. In the description hereafter, to aid understanding, the three second power semiconductor elements 30B are respectively referred to as the second power semiconductor elements 30Bd, 30Be, and 30Bf, and the three second diodes 40B are respectively referred to as the second diodes 40Bd, 40Be, and 40Bf.

In plan view, the second power semiconductor elements 30Bd, 30Be, and 30Bf are aligned in the length direction Y and spaced apart from one another in the width direction X. The second power semiconductor elements 30Bd, 30Be, and 30Bf are each located toward the plate second side surface 92D of the second graphite plate 90D in the length direction Y. In the present embodiment, the second power semiconductor elements 30Bd, 30Be, and 30Bf are each arranged on the end of the second plate main surface 95D of the second graphite plate 90D (main surface conductive layer 97D) located toward the plate second side surface 92D in the length direction Y. In further detail, in plan view, the second power semiconductor elements 30Bd, 30Be, and 30Bf are each arranged adjacent to the plate second side surface 92D in the length direction Y. In this manner, in plan view, the second power semiconductor elements 30Bd, 30Be, and 30Bf are each arranged proximate to the conductive layer 14B in the length direction Y.

The second power semiconductor element 30Bd is located toward the plate third side surface 93D of the second graphite plate 90D in the width direction X. In the present embodiment, the second power semiconductor element 30Bd is arranged on the end of the second plate main surface 95D of the second graphite plate 90D (main surface conductive layer 97D) located toward the plate third side surface 93D in the width direction X. In further detail, in plan view, the second power semiconductor element 30Bd is arranged adjacent to the plate third side surface 93D in the width direction X. The second power semiconductor element 30Bd overlaps the second control layer 15D and the second detection layer 16D as viewed in the length direction Y. Further, the second power semiconductor element 30Bd overlaps the first power semiconductor element 30Ad and the first diode 40Ad as viewed in the length direction Y. That is, the second power semiconductor element 30Bd is aligned with the first power semiconductor element 30Ad and the first diode 40Ad in the width direction X and spaced apart from the first power semiconductor element 30Ad and the first diode 40Ad in the length direction Y.

The second power semiconductor element 30Be is arranged in the middle portion of the second plate main surface 95D of the second graphite plate 90D (main surface conductive layer 97D) in the width direction X. Further, the second power semiconductor element 30Be overlaps the first power semiconductor element 30Ae and the first diode 40Ae as viewed in the length direction Y. That is, the second power semiconductor element 30Be is aligned with the first power semiconductor element 30Ae and the first diode 40Ae in the width direction X and spaced apart from the first power semiconductor element 30Ae and the first diode 40Ae in the length direction Y.

The second power semiconductor element 30Bf is located toward the plate fourth side surface 94D of the second graphite plate 90D in the width direction X. In the present embodiment, the second power semiconductor element 30Bf is arranged on the end of the second plate main surface 95D of the second graphite plate 90D (main surface conductive layer 97D) located toward the plate fourth side surface 94D in the width direction X. In further detail, in plan view, the second power semiconductor element 30Bf is arranged adjacent to the plate fourth side surface 94D in the width direction X. Further, the second power semiconductor element 30Bf overlaps the first power semiconductor element 30Af and the first diode 40Af as viewed in the length direction Y. That is, the second power semiconductor element 30Bf is aligned with the first power semiconductor element 30Af and the first diode 40Af in the width direction X and spaced apart from the first power semiconductor element 30Af and the first diode 40Af in the length direction Y.

The distance DX13 between the second power semiconductor element 30Bd and the second power semiconductor element 30Be in the width direction X is greater than the distance DX14 between the second power semiconductor element 30Bd and the coupling member 100B in the width direction X. In one example, the distance DX13 is two times or greater than the distance DX14. Preferably, the distance DX13 is three times or greater than the distance DX14. Further preferably, the distance DX13 is four times or greater than the distance DX14. In the present embodiment, the distance DX13 is approximately 4.6 times the distance DX14.

The distance DX15 between the second power semiconductor element 30Bf and the second power semiconductor element 30Be in the width direction X is greater than the distance DX16 between the second power semiconductor element 30Bf and the connecting portion 52b of the output terminal 52B in the width direction X. In one example, the distance DX15 is two times or greater than the distance DX16. Preferably, the distance DX15 is three times or greater than the distance DX16. Further preferably, the distance DX15 is four times or greater than the distance DX16. In the present embodiment, the distance DX15 is approximately 7.4 times the distance DX16. Further, in the present embodiment, the distance DX15 is equal to the distance DX13. Here, if the difference between the distance DX15 and the distance DX13 is within 5% of the distance DX13, this will mean that the distance DX15 is equal to the distance DX13.

In plan view, the second diodes 40Bd, 40Be, and 40Bf are aligned in the length direction Y and spaced apart from one another in the width direction X. The second diodes 40Bd, 40Be, and 40Bf are each located toward the plate first side surface 91D of the second graphite plate 90D in the length direction Y. In the present embodiment, the second diodes 40Bd, 40Be, and 40Bf are each arranged on the end of the second plate main surface 95D of the second graphite plate 90D (main surface conductive layer 97D) that is located toward the plate first side surface 91D in the length direction Y. In further detail, in plan view, the second diodes 40Bd, 40Be, and 40Bf are each arranged adjacent to the plate first side surface 91D in the length direction Y In this manner, in plan view, the second diodes 40Bd, 40Be, and 40Bf are each arranged at the side opposite to the second control layer 15D and the second detection layer 16D in the length direction Y. The second diodes 40Bd, 40Be, and 40Bf are each located proximate to the first mounting layer 13C (first graphite plate 90C) in the length direction Y.

The second diode 40Bd is aligned with the second power semiconductor element 30Bd in the width direction X and spaced apart from the second power semiconductor element 30Bd in the length direction Y. The second diode 40Be is aligned with the second power semiconductor element 30Be in the width direction X and spaced apart from the second power semiconductor element 30Be in the length direction Y. The second diode 40Bf is aligned with the second power semiconductor element 30Bf in the width direction X and spaced apart from the second power semiconductor element 30Bf in the length direction Y.

The second power semiconductor elements 30Bd, 30Be, and 30Bf are identical in structure and oriented in the same direction. In the present embodiment, the second power semiconductor elements 30Bd, 30Be, and 30Bf have the same structure as the first power semiconductor elements 30Aa, 30Ab, and 30Ac. Thus, same reference numerals are given to those elements of the second power semiconductor elements 30Ba, 30Bb, and 30Bc that are the same as the corresponding elements of the first power semiconductor elements 30Aa, 30Ab, and 30Ac. Such elements will not be described in detail.

The second diodes 40Bd, 40Be, and 40Bf are identical in structure. In the present embodiment, the second diodes 40Bd, 40Be, and 40Bf have the same structure as the first diodes 40Aa, 40Ab, and 40Ac. Thus, same reference numerals are given to those elements of the second diodes 40Bd, 40Be, and 40Bf that are the same as the corresponding elements of the first diodes 40Aa, 40Ab, and 40Ac. Such elements will not be described in detail The connection relationship of the second power semiconductor elements 30Bd, 30Be, and 30Bf and the second diodes 40Bd, 40Be, and 40Bf with respect to the second element connecting members 21B, the second control connecting members 22B, and the second detection connecting members 23B is the same as the connection relationship of the second power semiconductor elements 30Ba, 30Bb, and 30Bc and the second diodes 40Ba, 40Bb, and 40Bc with respect to the second element connecting members 21B, the second control connecting members 22B, and the second detection connecting members 23B.

Figure 25:
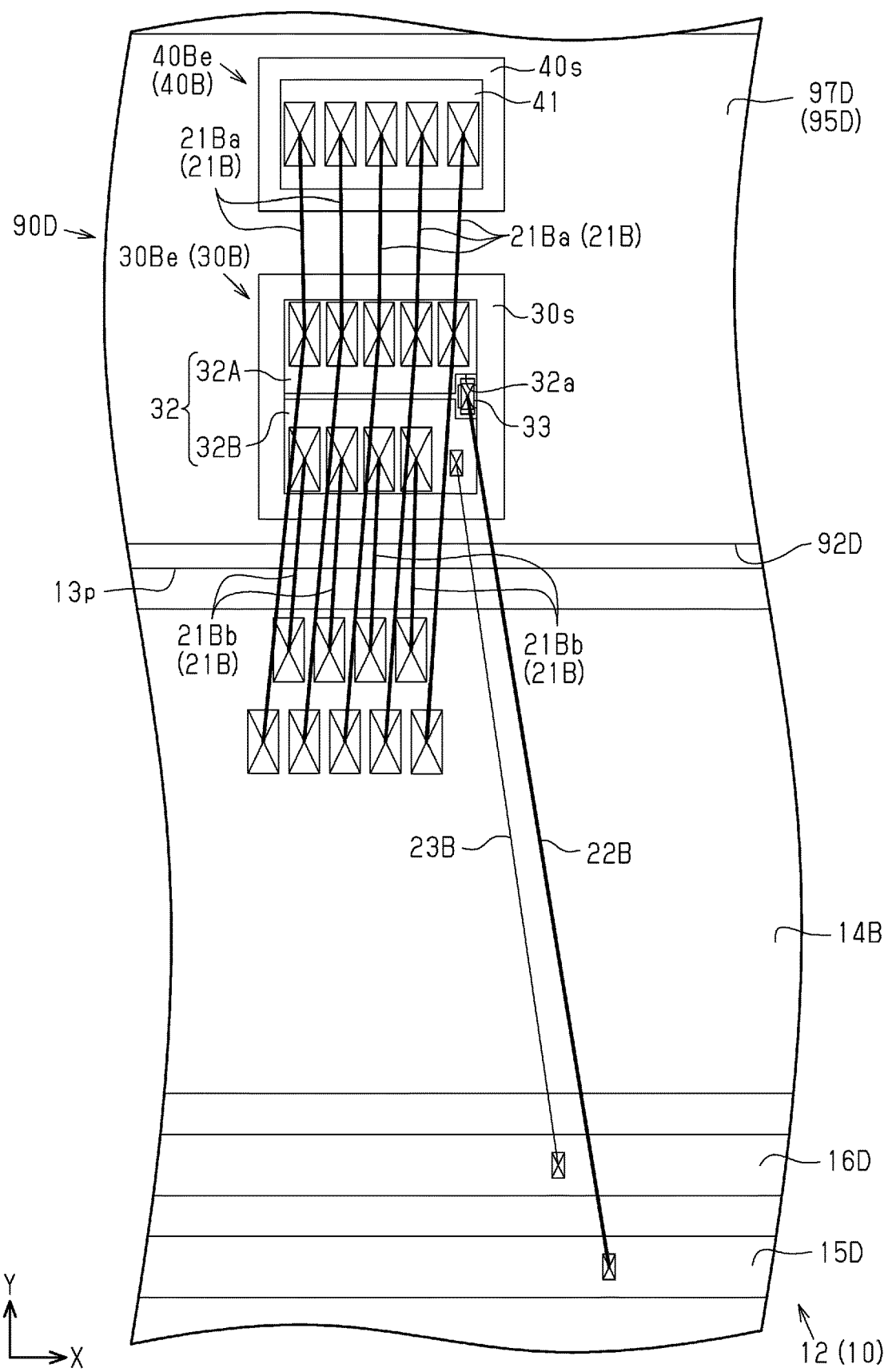
FIG. 25 is an enlarged view of the second power semiconductor element, the second diode, and their surroundings.

The difference in the connection relationships will now be described. As shown in FIG. 25, in plan view, the second element connecting members 21Bb extend diagonally toward the fourth side surface 12d of the second substrate 12 (refer to FIG. 10) from the second source electrode 32B of the second power semiconductor element 30Be to the conductive layer 14B. As a result, the second element connecting members 21Bb do not overlap the second control connecting members 22B and the second detection connecting members 23B in plan view.

In plan view, the portion of each second element connecting member 21Ba connecting the second source electrode 32B and the conductive layer 14B extends diagonally toward the third side surface 11c of the second substrate 12 from the second source electrode 32B to the conductive layer 14B. The second element connecting members 21Ba are connected to the portion of the conductive layer 14B located toward the second side surface 12b of the second substrate 12 from the second element connecting members 21Bb in the length direction Y. As a result, the second element connecting members 21Ba do not overlap the second control connecting members 22B and the second detection connecting members 23B in plan view. Further, the second element connecting members 21Bb also extend diagonally in the same manner as the second element connecting members 21Ba. Thus, the second element connecting members 21Bb do not overlap the second element connecting members 21Ba in plan view. The connection relationship of the second power semiconductor elements 30Bd and 30Bf with respect to the second element connecting members 21B, the second control connecting members 22B, and the second detection connecting members 23B is the same as the connection relationship of the second power semiconductor element 30Be with respect to the second element connecting members 21B, the second control connecting member 22B, and the second detection connecting member 23B.

Further, the relationship of where the second control connecting members 22B are connected to the gate electrodes 33 of the second power semiconductor elements 30Bd, 30Be, and 30Bf with respect to where the second control connecting members 22B are connected to the second control layer 15D in the width direction X differs from where the second control connecting members 22B are connected to the gate electrodes 33 of the second power semiconductor elements 30Ba, 30Bb, and 30Bc with respect to where the second control connecting members 22B are connected the second control layer 15D in the width direction X. In one example, as shown in FIGS. 10 and 25, the second control connecting member 22B is connected to the second control layer 15D at a position located toward the third side surface 12c of the second substrate 12 from where the second control connecting members 22B is connected to the gate electrode 33 of the second power semiconductor element 30Be in the width direction X.

The second control connecting member 22B that is connected to the gate electrode 33 of the second power semiconductor element 30Bd is connected to the end of the second control layer 15D located toward the third side surface 12c of the second substrate 12. In further detail, the second control connecting member 22B that is connected to the gate electrode 33 of the second power semiconductor element 30Bd is connected to a portion of the second control layer 15D located between a portion of the second control layer 15D connected to the second control layer connecting member 103B and a portion of the second control layer 15D connected to the second control terminal connecting member 25B in the width direction X.

The second control connecting member 22B that is connected to the gate electrode 33 of the second power semiconductor element 30Be is connected to the middle portion of the second control layer 15D in the width direction X. The second control connecting member 22B that is connected to the gate electrode 33 of the second power semiconductor element 30Bf is connected to the end of the second control layer 15D located toward the fourth side surface 12d of the second substrate 12 in the width direction X.

Further, the relationship of where the second detection connecting members 23B are connected to the source electrodes 32 of the second power semiconductor elements 30Bd, 30Be, and 30Bf with respect to where the second detection connecting members 23B are connected to the second detection layer 16D in the width direction X differs from the relationship of where the second detection connecting members 23B are connected to the source electrodes 32 of the second power semiconductor elements 30Ba, 30Bb, and 30Bc with respect to where the second detection connecting members 23B are connected to the second detection layer 16B in the width direction X. In one example, as shown in FIG. 10, a second detection connecting member 23B is connected to the second detection layer 16D at a position located toward the third side surface 12c of the second substrate 12 from where the second detection connecting member 23B is connected to the source electrode 32 of the second power semiconductor element 30Be in the width direction X.

Further, each second detection connecting member 23B is connected to a portion of the first source electrode 32A of the corresponding one of the second power semiconductor elements 30Bd, 30Bb, and 30Bc that is located toward the third side surface 12c of the second substrate 12 in the width direction X.

The second control connecting member 22B that is connected to the gate electrode 33 of the second power semiconductor element 30Bd is connected to the end of the second control layer 15D located toward the third side surface 12c of the second substrate 12 in the width direction X. In further detail, the second control connecting member 22B that is connected to the gate electrode 33 of the second power semiconductor element 30Bd is connected to a portion of the second control layer 15D located between a portion of the second control layer 15D connected to the second control terminal connecting member 25B and a portion of the second control layer 15D connected to the second control layer connecting member 103B in the width direction X.

The second detection connecting member 23B that is connected to the first source electrode 32A of the second power semiconductor element 30Be is connected to the middle portion of the second detection layer 16B in the width direction X. The second detection connecting member 23B that is connected to the first source electrode 32A of the second power semiconductor element 30Bf is connected to the end of the second detection layer 16D located toward the fourth side surface 12d of the second substrate 12 in the width direction X.

The configuration of each of the graphite plates 90A to 90D will now be described in detail. The graphite plates 90A to 90D have the same configuration. Thus, the configuration of only the first graphite plate 90A will be described. The graphite plates 90B to 90D will not be described.

Figure 26A:
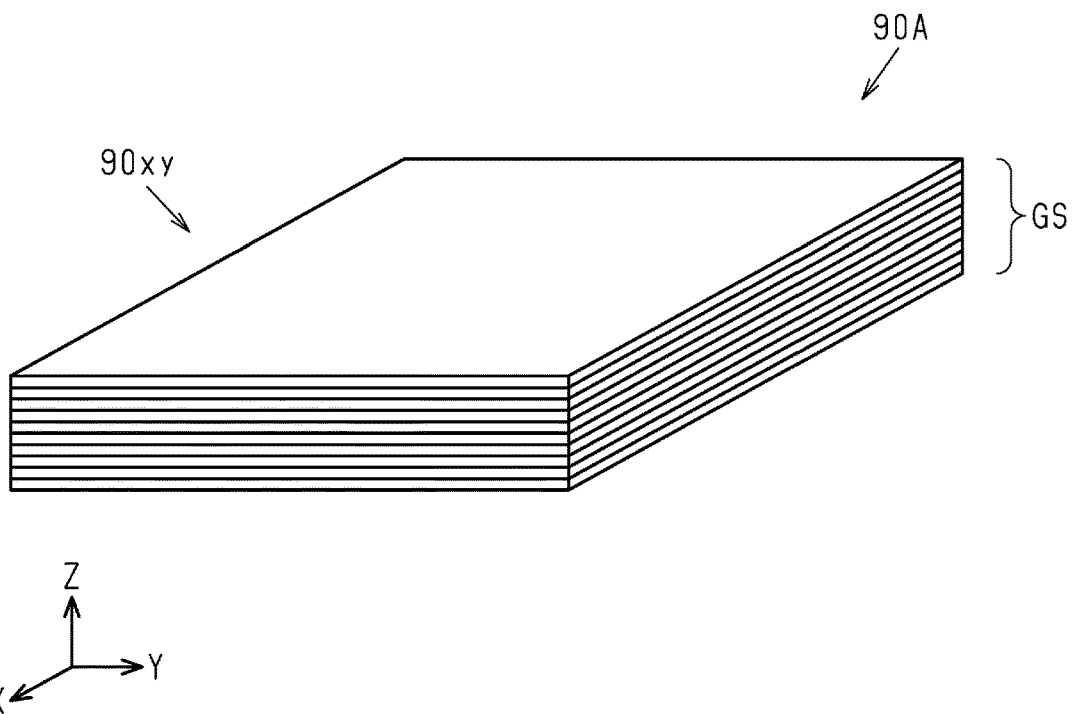
FIG. 26A is a perspective view showing a graphite plate applicable to the power module in accordance with the first embodiment taken in an XY orientation.
Figure 26B:
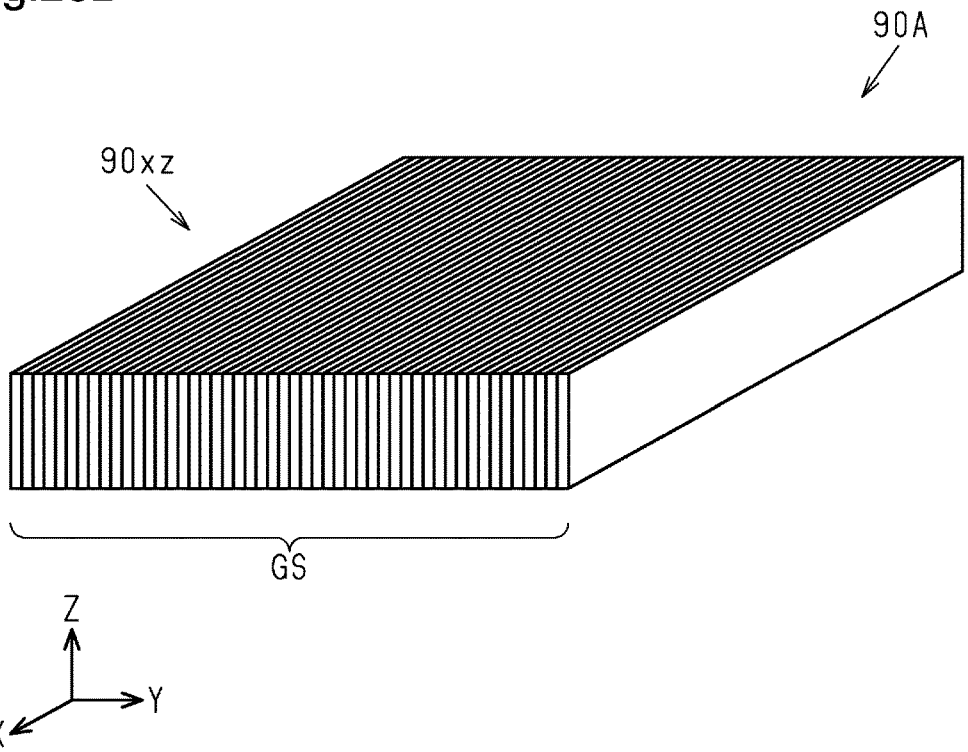
FIG. 26B is a perspective view of the graphite plate taken in the XZ orientation.
Figure 27:
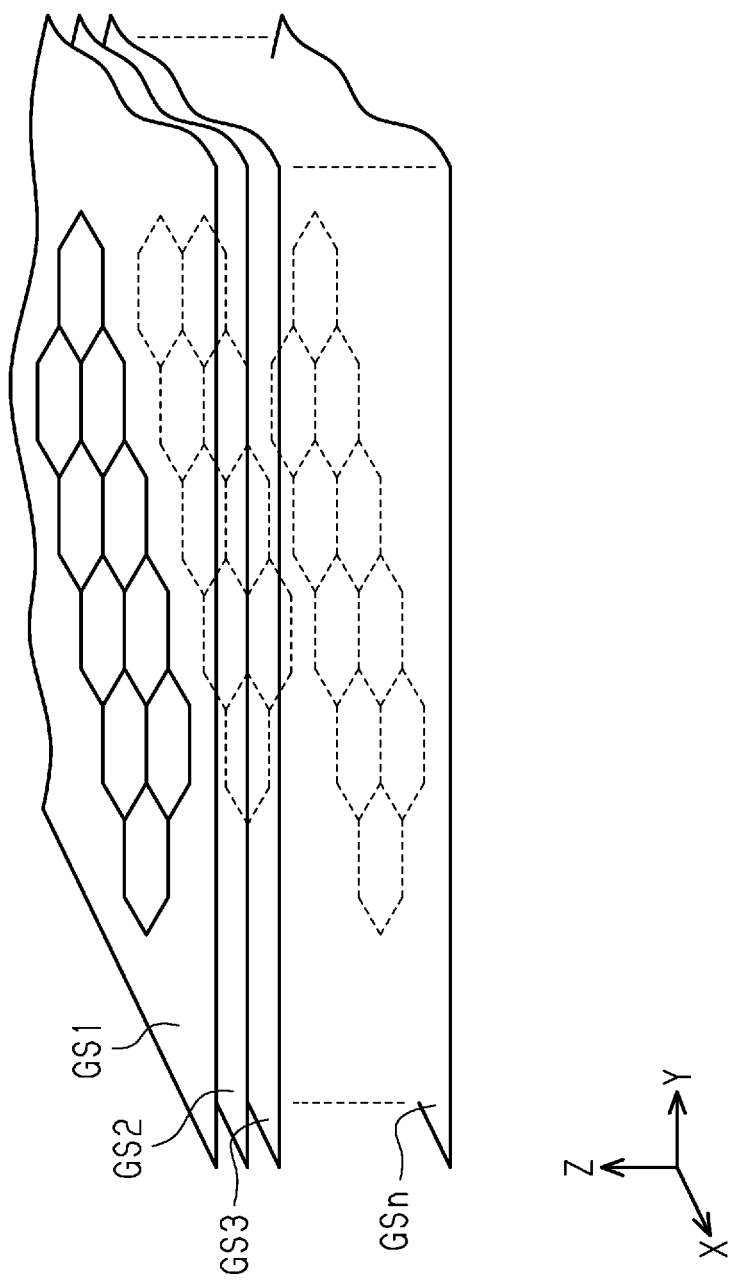
FIG. 27 is a perspective view of a stacked construction of graphite sheets forming a graphite plate applicable to the power module in accordance with the first embodiment.
Figure 28:
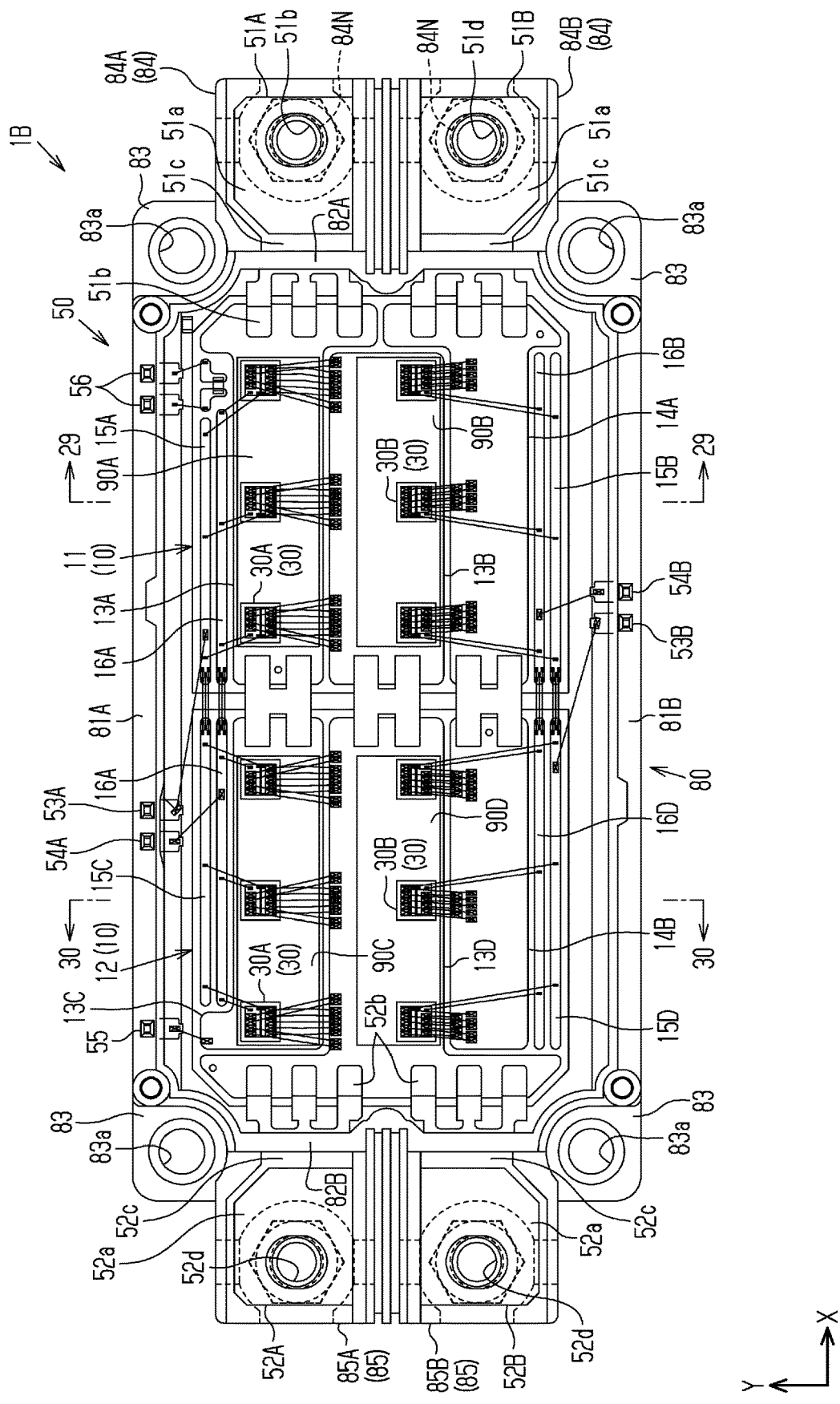
FIG. 28 is a plan view illustrating the internal structure of a power module in accordance with a second embodiment.
Figure 29:
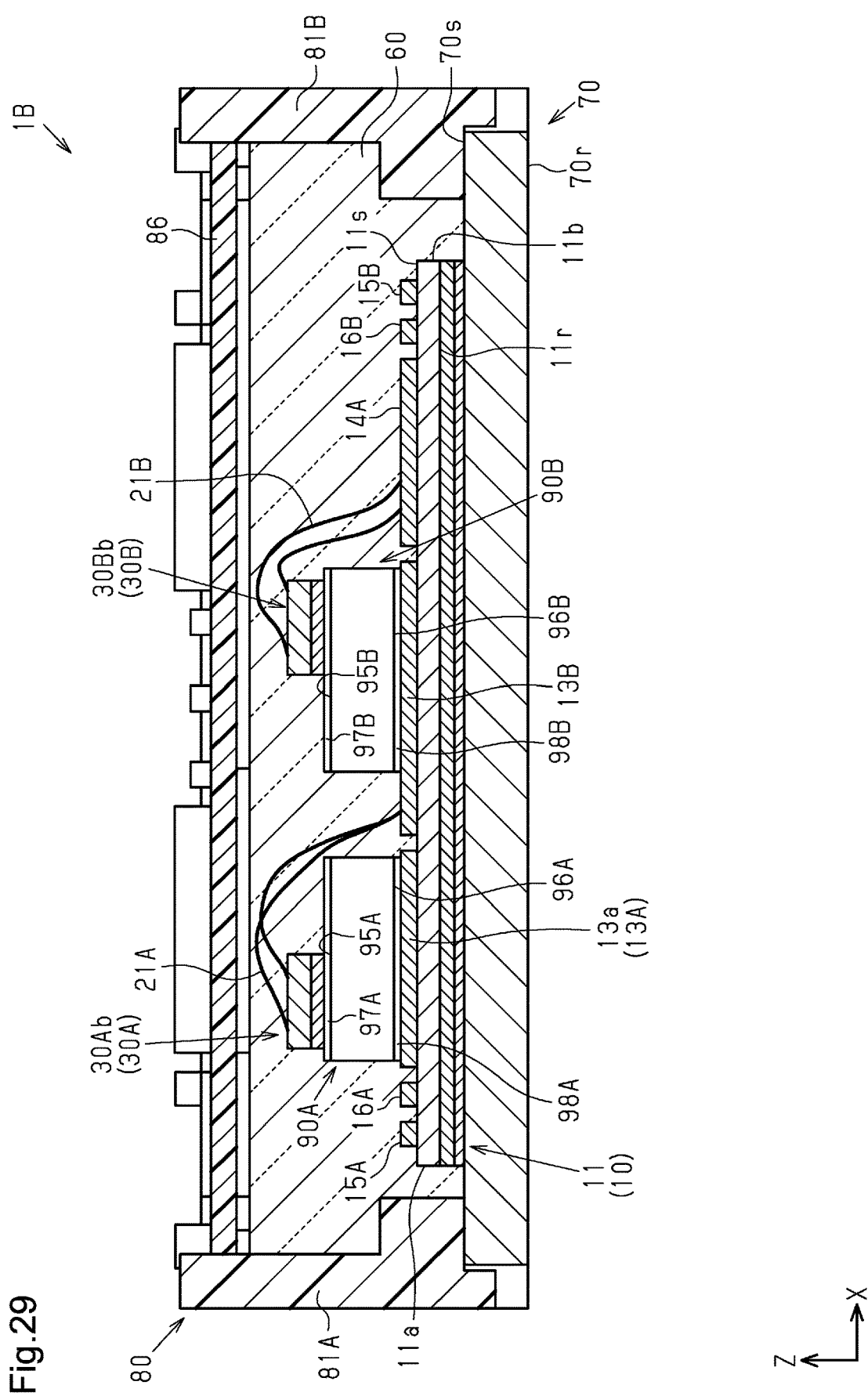
FIG. 29 is a cross-sectional view taken along line 29-29 in FIG. 28.
Figure 30:
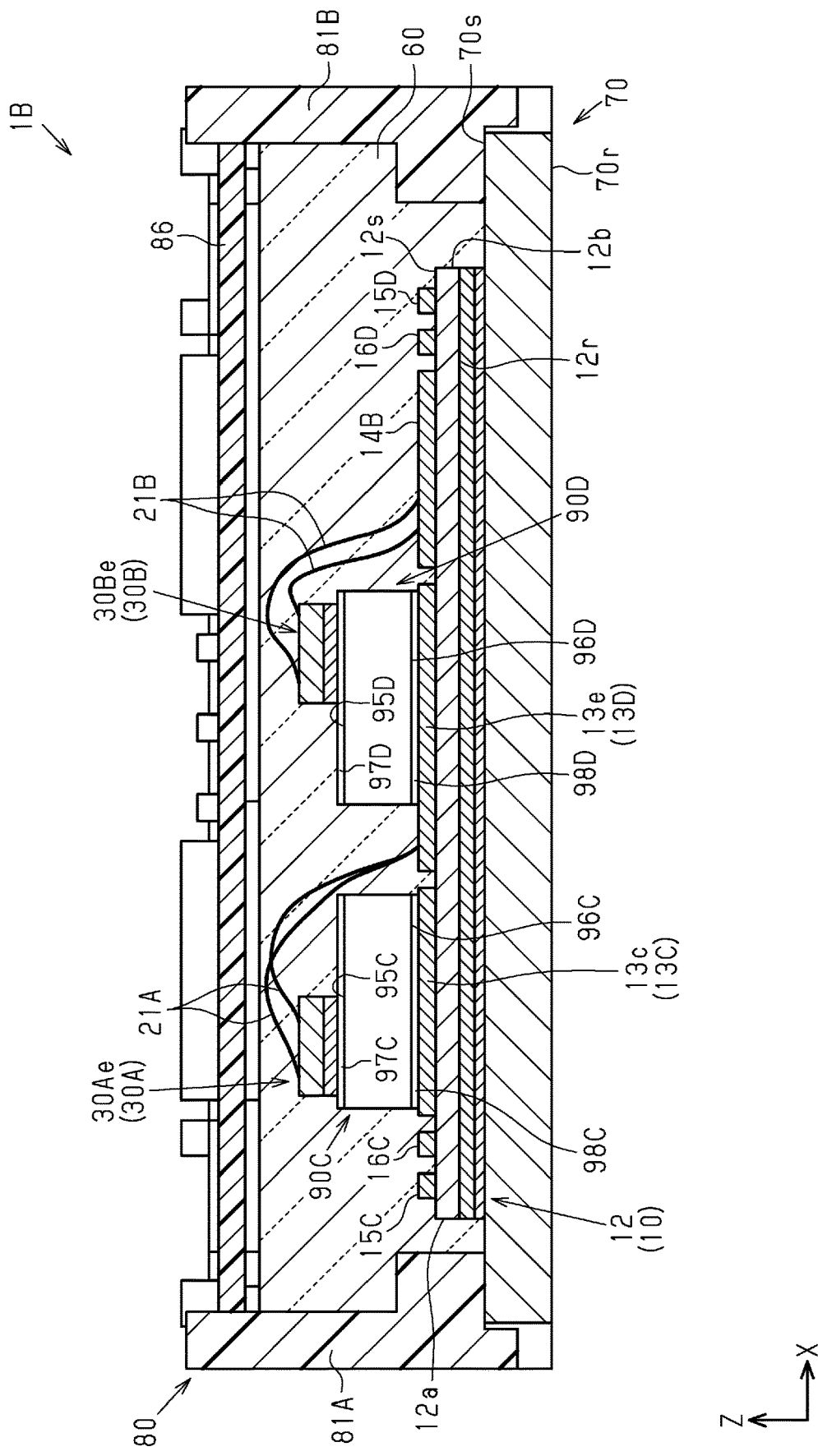
FIG. 30 is a cross-sectional view taken along line 30-30 in FIG. 28.
Figure 31:
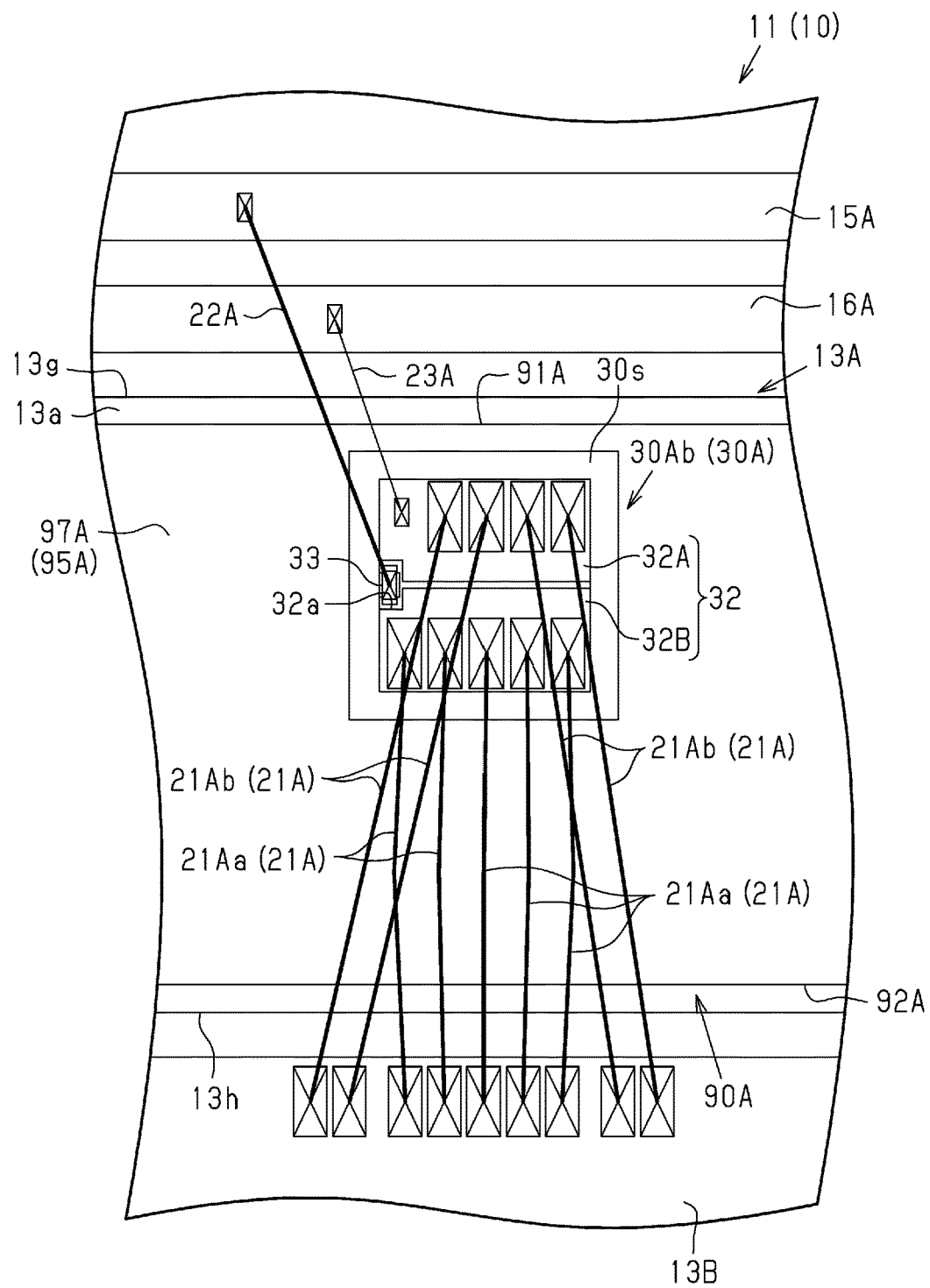
FIG. 31 is an enlarged view of a first power semiconductor element and its surrounding.
Figure 32:
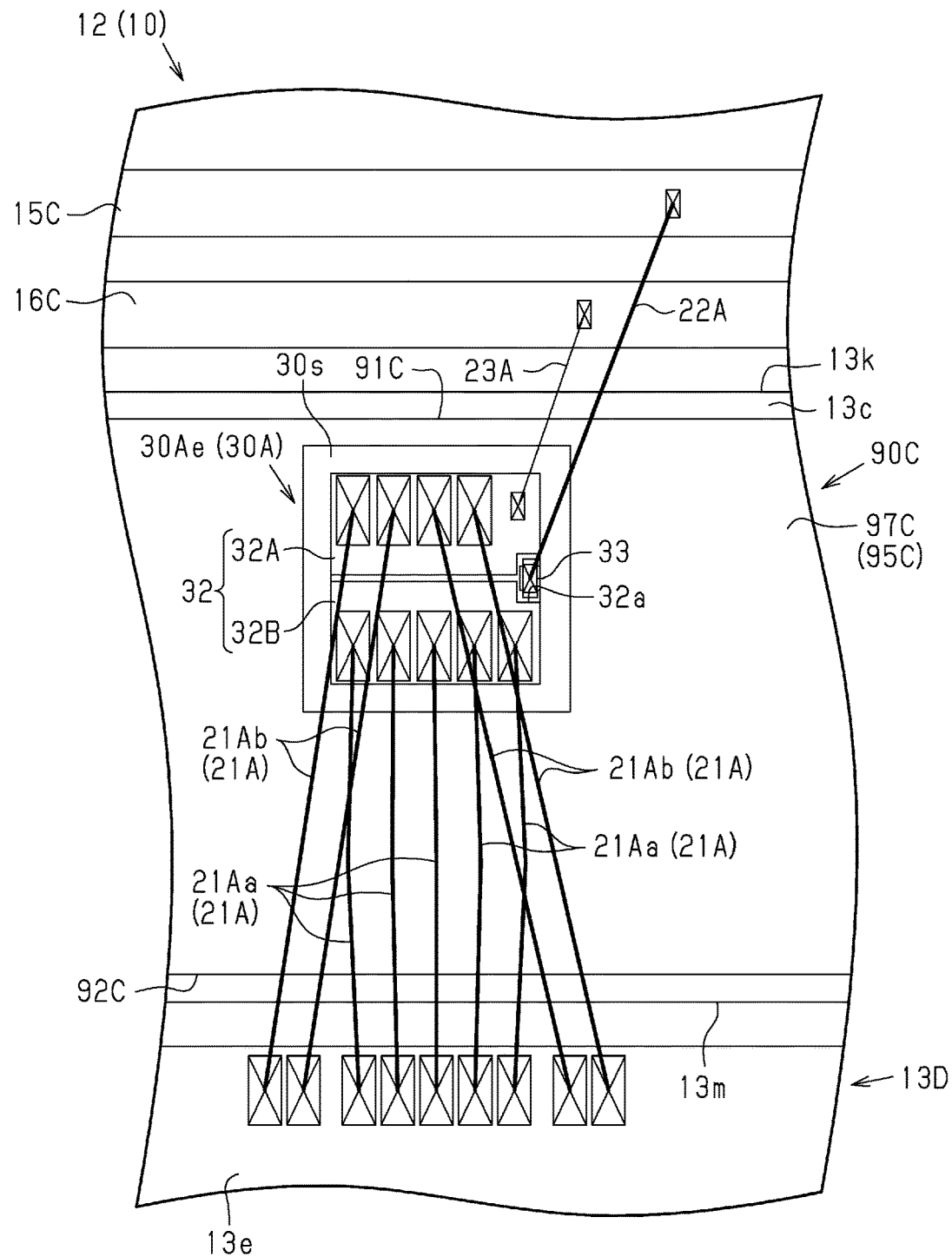
FIG. 32 is an enlarged view of the first power semiconductor element and its surrounding.
Figure 33:
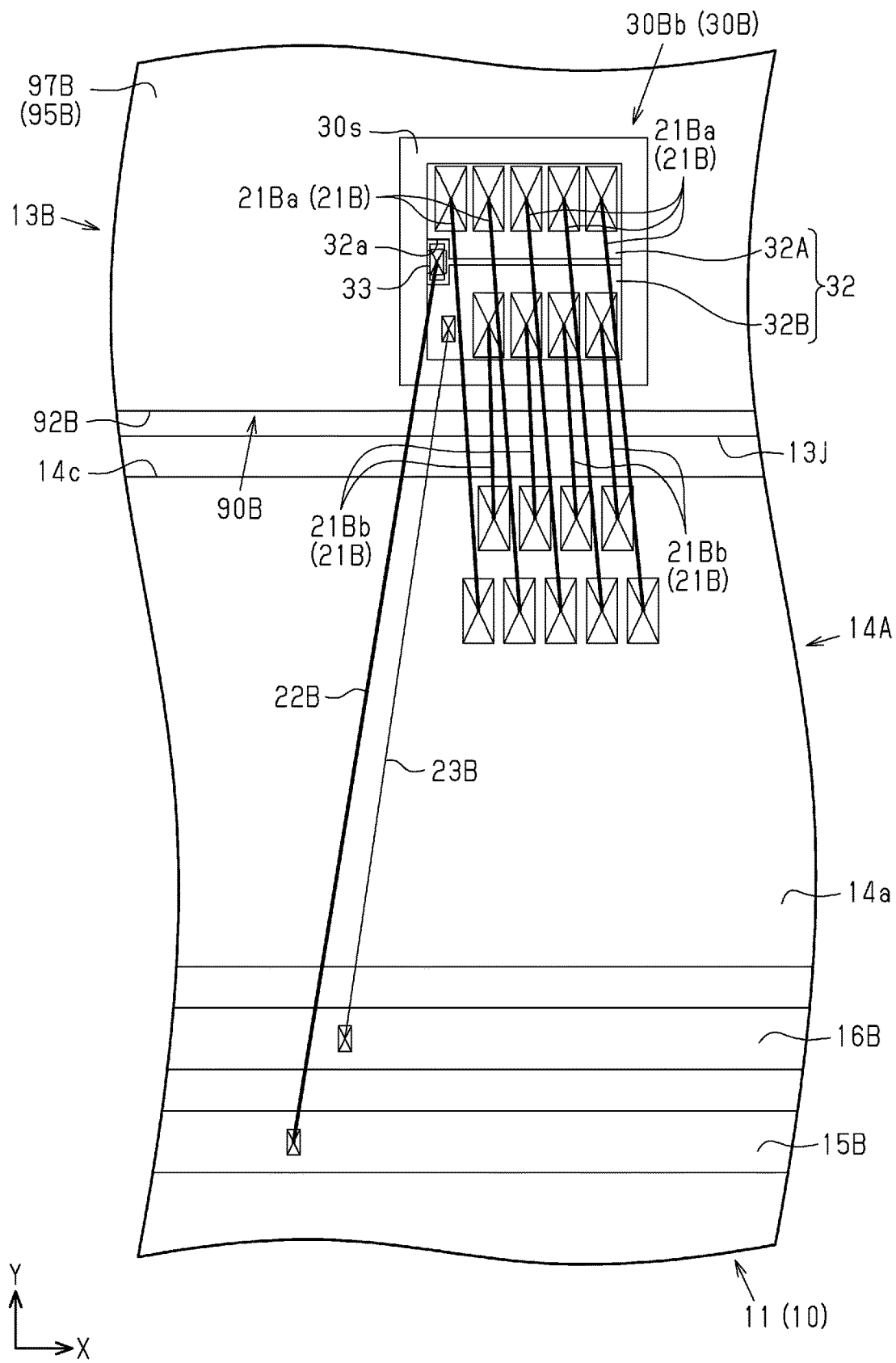
FIG. 33 is an enlarged view of a second power semiconductor element and its surrounding.
Figure 34:
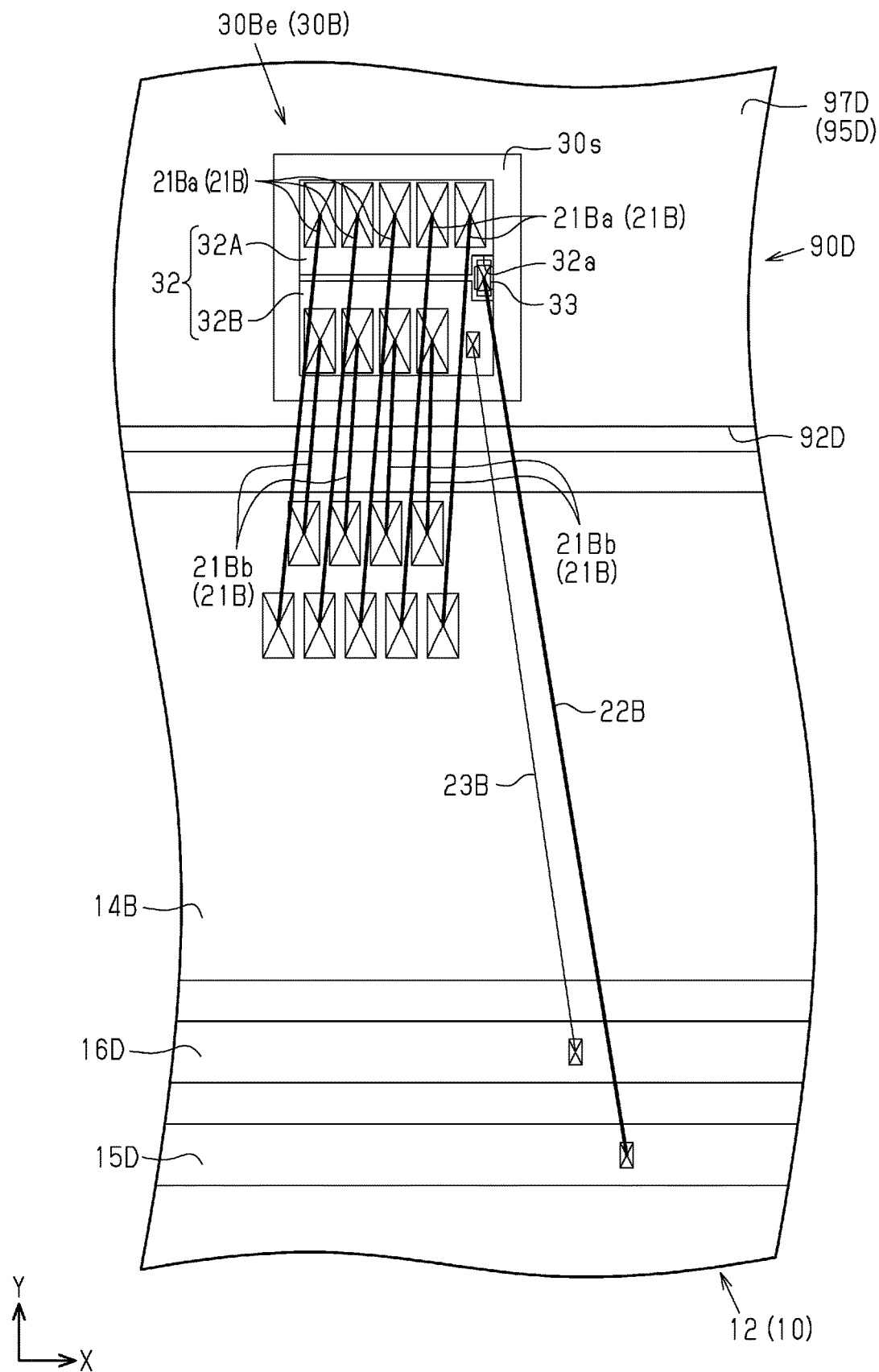
FIG. 34 is an enlarged view of the second power semiconductor element and its surrounding.

Referring to FIGS. 26A and 26B, two types of graphite plates that differ in the orientation of thermal conductivity are used as the first graphite plate 90A. FIG. 27 schematically shows the configuration (stacked construction example) of graphite sheets GS (graphene) forming the first graphite plate 90A.

The first graphite plate 90A may be a graphite plate 90xy that is one example of a first thermal conductor having an XY orientation (first orientation) in which the thermal conductivity is high in a planar direction, which is orthogonal to the thickness direction Z, rather than the thickness direction Z. Alternatively, the first graphite plate 90A may be a graphite plate 90xz that is one example of a second thermal conductor having an XZ orientation (second orientation) in which the thermal conductivity is high in the thickness direction Z rather than the planar direction. FIG. 26A shows the graphite plate 90xy, and FIG. 26B shows the graphite plate 90xz. In this manner, the width direction X and the length direction Y are each a planar direction that is orthogonal to the thickness direction Z.

As shown in FIG. 27, each plane of the n layers of graphite sheets GS1, GS2, GS3, GSn have many hexagonal crystal covalent bonds in a single stacked crystal structure, and the planes of the graphite sheets GS1, GS2, GS3, GSn are bonded by the Van der Waals force.

More specifically, graphite, which is a carbon anisotropic heat-transmitting material, is a layered crystalline body having a hexagonal meshed structure of carbon atoms and anisotropic thermal conductivity. The graphite sheets GS1, GS2, GS3, GSn shown in FIG. 27 have a greater thermal conductance (higher thermal conductivity) in the crystal plane direction (XY plane) than the thickness direction Z of the Z axis Accordingly, referring to FIG. 26A, the graphite plate 90xy of the XY orientation has a thermal conductivity of, for example, X=1500 (W/mK), Y=1500 (W/mK), and Z=5 (W/mK).

Referring to FIG. 26B, the graphite plate 90xz of the XZ orientation has a thermal conductivity of, for example, X=1500 (W/mK), Y=5 (W/mK), and Z=1500 (W/mK). The graphite plates 90xy and 90xz both have a density of 2.2 (g/cm$^3$), a thickness of 2 mm to 10 mm, and a size of 40 mm×40 mm.

In the present embodiment, as shown in FIG. 16, the graphite plate 90xy forms the first plate main surface 95A of the first graphite plate 90A. The graphite plate 90xz forms the first plate back surface 96A of the first graphite plate 90A. More specifically, the first graphite plate 90A is formed by arranging the graphite plate 90xy on the graphite plate 90xz in the thickness direction Z. As shown in FIG. 20, in the same manner as the first graphite plate 90A, in the first graphite plate 90C, the graphite plate 90xy forms the first plate main surface 95C of the first graphite plate 90C, and the graphite plate 90xz forms the first plate back surface 96C of the first graphite plate 90C. As shown in FIG. 22, in the same manner as the first graphite plate 90A, in the second graphite plate 90B, the graphite plate 90xy forms the second plate main surface 95B of the second graphite plate 90B, and the graphite plate 90xz forms the second plate back surface 96B of the second graphite plate 90B. As shown in FIG. 24, in the same manner as the first graphite plate 90A, in the second graphite plate 90D, the graphite plate 90xy forms the second plate main surface 95D of the second graphite plate 90D, and the graphite plate 90xz forms the second plate back surface 96D of the second graphite plate 90D.

Operation

The operation of the power module 1A in accordance with the present embodiment will now be described.

In a power module, SiC power semiconductor elements perform, for example, high-speed switching actions to supply power with high precision and reduce power consumption. Nevertheless, large currents flow through the power semiconductor element that perform high-speed switching. This increases the amount of heat generated by the power semiconductor elements. Thus, the temperature of the power semiconductor elements tends to become high.

In this respect, power modules use heat dissipators that are arranged on the substrates including power semiconductor elements so that the heat of the power semiconductor elements are transferred to the heat dissipators. In this case, the heat of the power semiconductor elements is transferred via the substrate to the heat dissipators. However, the heat is mainly transferred from the back surfaces of the power semiconductor element to the heat dissipators in the thickness direction Z. This may hinder effecting heat dissipation.

Further, aluminum nitride (AlN) may be used to improve the heat dissipation performance of the substrate. In this case, although the efficiency for transferring the heat of the power semiconductor elements increases and the heat dissipation performance of the power semiconductor elements is improved, the heat of the power semiconductor elements is mainly transferred in the thickness direction Z. Further, a substrate of AlN has superior heat dissipation capacity but low mechanical strength. Thus, the substrate may deform if the size of the substrate is increased to mount a multiple number of power semiconductor elements.

The power module 1A in accordance with the present embodiment includes the graphite plates 90A to 90D located between the substrates 10 and the power semiconductor elements 30A and 30B. The graphite plates 90A to 90D include graphite plates of which thermal conductivity in the planar direction (width direction X and length direction Y), which is orthogonal to the thickness direction Z, is greater than the thermal conductivity in the thickness direction Z. Thus, heat is transferred from the power semiconductor elements 30A and 30B in the planar direction of the graphite plates 90A to 90D. In this manner, the heat of the power semiconductor elements 30A and 30B is transferred over a wide area in the graphite plates 90A to 90D. Thus, heat is efficiently dissipated from the power semiconductor elements 30A and 30B.

Advantages

The power module 1A in accordance with the present embodiment has the advantages described below.

(1-1) The power module 1A includes the graphite plates 90A to 90D, of which the thermal conductivity in the planar direction that is orthogonal to the thickness direction Z is greater than the thermal conductivity in the thickness direction Z, and the power semiconductor elements 30A and 30B, which are spaced apart from the plate main surfaces 95A to 95D of the graphite plates 90A to 90D in the width direction X. This enlarges the dissipation area of the power semiconductor elements 30A and 30B and efficiently dissipates heat from the power semiconductor elements 30A and 30B.

(1-2) The first power semiconductor elements 30A are spaced apart on the first graphite plate 90A and 90C in the width direction X. This hinders heat interference between adjacent ones of the first power semiconductor elements 30A in the width direction X. Further, the second power semiconductor elements 30 are spaced part on the second graphite plates 90B and 90D in the width direction X. This hinders heat interference between adjacent ones of the second power semiconductor elements 30B in the width direction X. In this manner, heat is dissipated further efficiently from the power semiconductor elements 30A and 30B.

(1-3) The plate main surfaces 95A to 95D of the graphite plates 90A to 90D are each shaped so that the width direction X is the long-side direction and the length direction Y is the short-side direction. The first power semiconductor elements 30A are spaced apart on the first plate main surfaces 95A and 95C in the width direction X. The second power semiconductor elements 30B are spaced apart on the second plate main surfaces 95B and 95D in the width direction X. This increases the distance between adjacent ones of the first power semiconductor elements 30A in the width direction X and increases the distance between adjacent ones of the second power semiconductor elements 30B in the width direction X. Accordingly, heat interference is further hindered between adjacent ones of the first power semiconductor elements 30A in the width direction X, and heat interference is further hindered between adjacent ones of the second power semiconductor elements 30B in the width direction X.

(1-4) The first plate main surface 95A and 95C of the first graphite plate 90A and 90C are each formed by the graphite plate 90xy. This allows the heat of the first power semiconductor elements 30A to spread over a wider area in the planar direction. The second plate main surface 95B and 95D of the second graphite plate 90B and 90D are each formed by the graphite plate 90xy. This allows the heat of the second power semiconductor elements 30B to spread over a wider area in the planar direction.

(1-5) The thickness of each of the graphite plates 90A to 90D (dimension of each of the graphite plates 90A to 90D in thickness direction Z) is greater than the thickness of each substrate 10 (dimension of substrate 10 in thickness direction Z). This increases the volume of each of the graphite plates 90A to 90D. Thus, heat is efficiently dissipated from each of the power semiconductor elements 30A and 30B.

(1-6) The first substrate 11 and the second substrate 12 are formed from alumina. Since the first substrate 11 and the second substrate 12 are formed from alumina that has higher mechanical strength that AlN, deformation is limited in the first substrate 11 and the second substrate 12.

Further, the power module 1A includes the graphite plates 90A to 90D. This efficiently dissipates heat from the power semiconductor elements 30A and 30B. Thus, even though the first substrate 11 and the second substrate 12 use alumina, which has a lower heat dissipation capacity than AlN or SiN, the decrease in the capacity for dissipating heat from the power semiconductor elements 30A and 30B will not cause the temperature of the power semiconductor elements 30A and 30B to become excessively high. In this manner, the first substrate 11 and the second substrate 12 may be formed from alumina in addition to AlN and SiN. This increases the degree of freedom for selection of the material of the first substrate 11 and the second substrate 12.

(1-7) The heat dissipation plate 70 is arranged on the first substrate back surface 11r of the first substrate 11 and the second substrate back surface 12r of the second substrate 12. This increases the capacity for dissipating heat from the first substrate 11 and the second substrate 12 out of the power module 1A.

(1-8) The first power semiconductor elements 30A are arranged on each of the first plate main surfaces 95A and 95C of the graphite plates 90A and 90C at the two ends in the width direction X and the middle portion in the width direction X. This increases the distance between adjacent ones of the first power semiconductor elements 30A in the width direction X and further hinders heat interference between the adjacent ones of the first power semiconductor elements 30A. Further, the second power semiconductor elements 30B are arranged on each of the second plate main surfaces 95B and 95D of the graphite plates 90B and 90D at the two ends in the width direction X and the middle portion in the width direction X. This increases the distance between adjacent ones of the second power semiconductor elements 30B in the width direction X and further hinders heat interference between the adjacent ones of the second power semiconductor elements 30B.

(1-9) The first diodes 40A arranged on the first plate main surfaces 95A and 95C of the first graphite plates 90A and 90C are spaced apart from one another in the width direction X. The second diodes 40B arranged on the second plate main surfaces 95B and 95D of the second graphite plates 90B and 90D are spaced apart from one another in the width direction X. This increases the distance between adjacent ones of the first diodes 40A in the width direction X and increases the distance between adjacent ones of the second diodes 40B in the width direction X. Accordingly, heat interference is further hindered between adjacent ones of the first diodes 40A in the width direction X, and heat interference is hindered between adjacent ones of the second diodes 40B in the width direction X.

(1-10) The first power semiconductor elements 30A are located toward the first control layer 15A from the first diodes 40A in the length direction Y. The second power semiconductor elements 30B are located toward the second control layer 15B from the second diodes 40B in the length direction Y. Thus, the length of the first control connecting member 22A connecting the gate electrode 33 of each first power semiconductor element 30A and the first control layer 15A is decreased. This reduces the inductance resulting from the first control connecting member 22A. Further, the length of the second control connecting member 22B connecting the gate electrode 33 of each second power semiconductor element 30B and the second control layer 15B is decreased. This reduces the inductance resulting from the second control connecting member 22B.

(1-11) The first power semiconductor elements 30A are located toward the first detection layer 16A from the first diodes 40A in the length direction Y. The second power semiconductor elements 30B are located toward the second detection layer 16B from the second diodes 40B in the length direction Y. Thus, the length of the first detection connecting member 23A connecting the source electrode 32 of each first power semiconductor element 30A and the first detection layer 16A is decreased. This reduces the inductance resulting from the first detection connecting member 23A. Further, the length of the second detection connecting member 23B connecting the source electrode 32 of each second power semiconductor element 30B and the second detection layer 16B is decreased. This reduces the inductance resulting from the second detection connecting member 23B.

(1-12) The second graphite plate 90B is arranged on the second mounting layer 13B toward the conductive layer 14A in the length direction Y. This decreases the distance between the second power semiconductor elements 30B, which are arranged on the second plate main surface 95B of the second graphite plate 90B, and the conductive layer 14A in plan view. Thus, the length of the second element connecting members 21B connecting the second power semiconductor elements 30B and the conductive layer 14A is decreased. This reduces the inductance resulting from the second element connecting members 21B.

Further, the second graphite plate 90D is arranged on the main mounting portion 13e of the second mounting layer 13D toward the conductive layer 14B in the length direction Y. This decreases the distance between the second power semiconductor elements 30B, which are arranged on the second plate main surface 95D of the second graphite plate 90D, and the conductive layer 14B in plan view. Thus, the length of the second element connecting members 21B connecting the second power semiconductor elements 30B and the conductive layer 14B is decreased. This reduces the inductance resulting from the second element connecting members 21B.

(1-13) The second power semiconductor elements 30B on the second plate main surface 95B of the second graphite plate 90B are each arranged at the end of the second plate main surface 95B located toward the conductive layer 14A in the length direction Y. This decreases the distance between the second power semiconductor elements 30B and the conductive layer 14A in the length direction Y in plan view. Thus, the length of the second element connecting members 21B connecting the second power semiconductor elements 30B and the conductive layer 14A is decreased. This reduces the inductance resulting from the second element connecting members 21B.

Further, the second power semiconductor elements 30B on the second plate main surface 95D of the second graphite plate 90D are each arranged at the end of the second plate main surface 95D located toward the conductive layer 14B in the length direction Y. This decreases the distance between the second power semiconductor elements 30B and the conductive layer 14B in the length direction Y in plan view. Thus, the length of the second element connecting members 21B connecting the second power semiconductor elements 30B and the conductive layer 14B is decreased. This reduces the inductance resulting from the second element connecting members 21B.

Second Embodiment

With reference to FIGS. 28 to 34, a power module 1B in accordance with a second embodiment will now be described. The power module 1B in accordance with the present embodiment differs from the power module 1A in accordance with the first embodiment in that the diodes 40 are omitted. In the description hereafter, same reference numerals are given to those components that are the same as the corresponding components in the power module 1A of the first embodiment. Such components will not be described in detail.

As shown in FIGS. 28 to 34, since the first diodes 40Aa, 40Ab, and 40Ac are omitted, the first element connecting members 21Ab connect the second source electrodes 32B of the first power semiconductor elements 30Aa, 30Ab, and 30Ac to the second mounting layer 13B.

In the present embodiment, in the same manner as the first embodiment, the first power semiconductor elements 30Aa, 30Ab, and 30Ac are each arranged on the end of the first plate main surface 95A of the first graphite plate 90A (main surface conductive layer 97A) located toward the plate first side surface 91A in the length direction Y. Nevertheless, there is no limitation to where the first power semiconductor elements 30Aa, 30Ab, and 30Ac are arranged in the length direction Y. In one example, the first power semiconductor elements 30Aa, 30Ab, and 30Ac are arranged in the middle portion of the first plate main surface 95A of the first graphite plate 90A (main surface conductive layer 97A) in the length direction Y. Further, the width of the first graphite plate 90A (dimension of first graphite plate 90A in the length direction Y) may be less than the width of the first graphite plate 90A of the first embodiment.

Since the second diodes 40Ba, 40Bb, and 40Bc are omitted, the first element connecting members 21Aa extend from the first source electrodes 32A of the second power semiconductor elements 30Ba, 30Bb, and 30Bc to the conductive layer 14A. Further, the width of the second graphite plate 90B (dimension of second graphite plate 90B in length direction Y) may be less than the width of the second graphite plate 90B of the first embodiment.

Since the first diodes 40Ad, 40Ae, and 40Af are omitted, the first element connecting members 21Ab connect the second source electrodes 32B of the first power semiconductor elements 30Ad, 30Ae, and 30Af to the main mounting portion 13e of the second mounting layer 13D.

In the same manner as the first embodiment, in the present embodiment, the first power semiconductor elements 30Ad, 30Ae, and 30Af are each arranged on the end of the first plate main surface 95C of the first graphite plate 90C (main surface conductive layer 97C) located toward the plate first side surface 91C in the length direction Y. Nevertheless, there is no limitation to where the first power semiconductor elements 30Ad, 30Ae, and 30Af are arranged in the length direction Y. In one example, the first power semiconductor elements 30Ad, 30Ae, and 30Af are each arranged in the middle portion of the first plate main surface 95C of the first graphite plate 90C (main surface conductive layer 97C) in the length direction Y. Further, the width of the first graphite plate 90C (dimension of first graphite plate 90C in length direction Y) may be less than the width of the first graphite plate 90C of the first embodiment.

Since the second diodes 40Bd, 40Be, and 40Bf are omitted, the first element connecting members 21Aa, which are connected to the first source electrodes 32A of the second power semiconductor elements 30Bd, 30Be, and 30Bf, extend from the first source electrodes 32A to the conductive layer 14A. Further, the width of the second graphite plate 90D (dimension of second graphite plate 90D in length direction Y) may be less than the width of the second graphite plate 90D of the first embodiment. The power module 1B of the present embodiment has the same advantages as the power module 1A of the first embodiment.

Application Examples of Power Module

Figure 35:
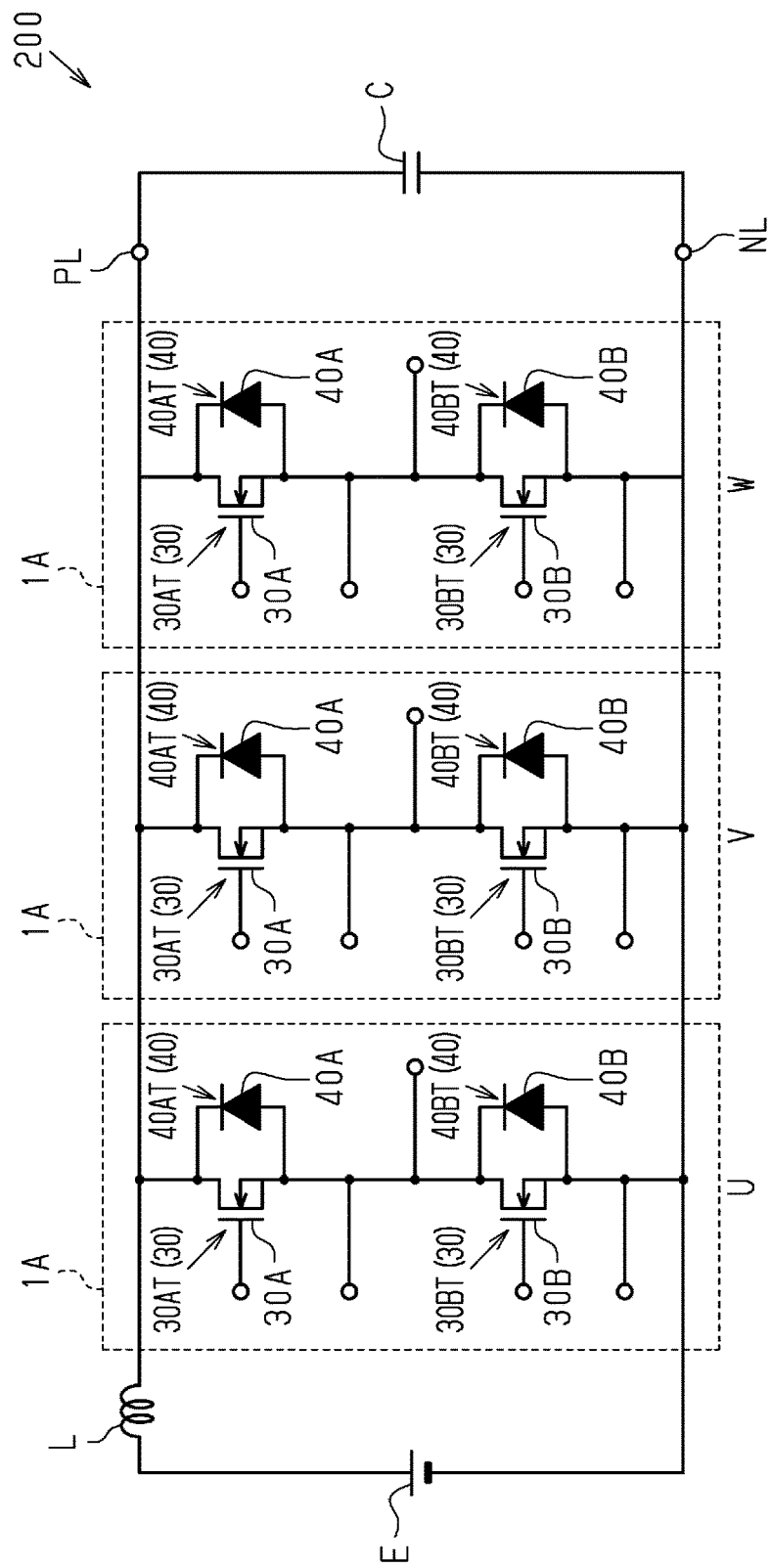
FIG. 35 is a circuit diagram of a three-phase AC inverter to which the power module is applied.
Figure 36:
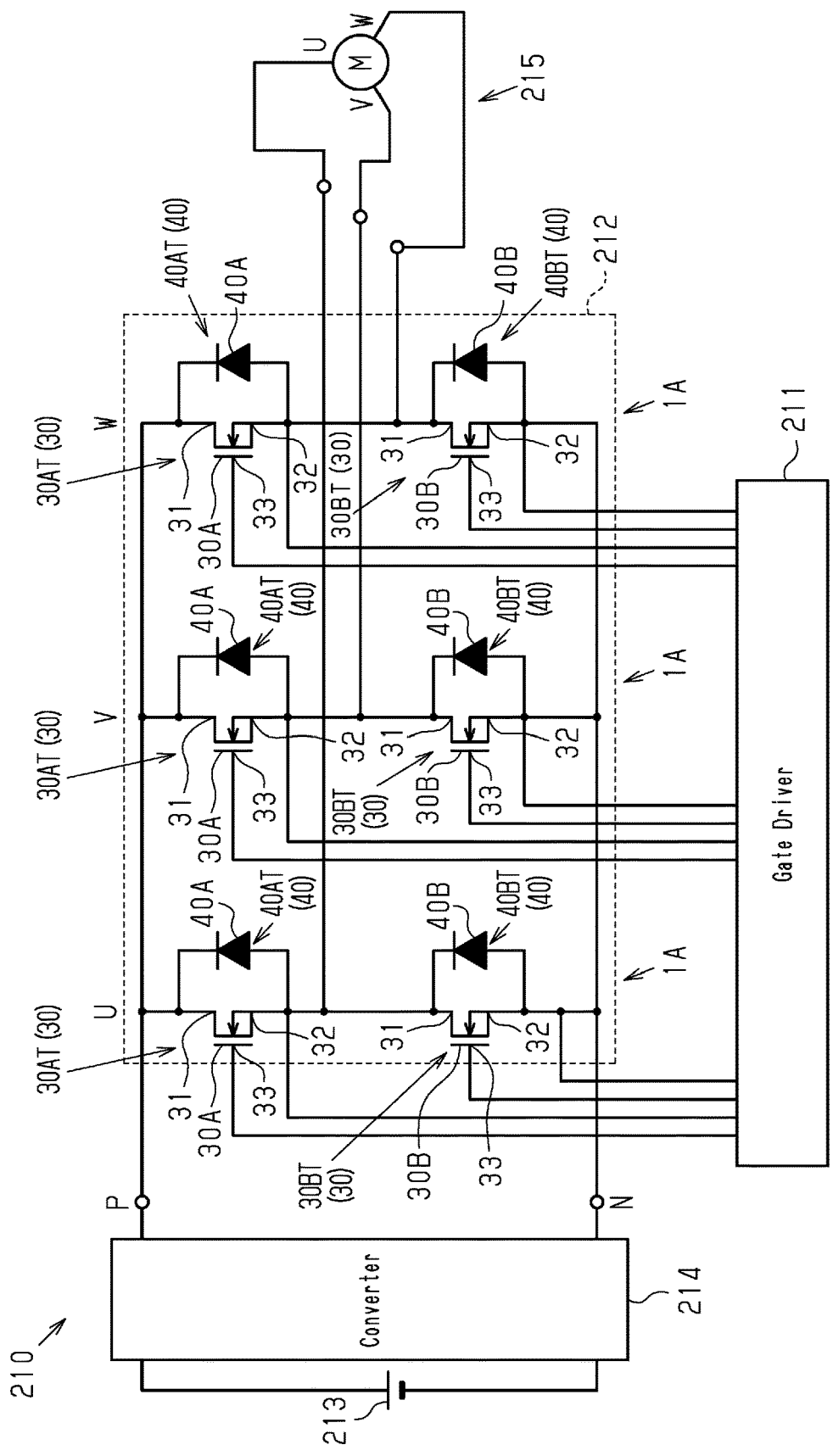
FIG. 36 is a circuit diagram of the three-phase AC inverter to which the power module is applied.

Examples of circuit configurations including the power modules 1A and 1B will now be described. FIGS. 35 and 36 do not show the body diode 34 for the sake or brevity.

As a first circuit configuration example, FIG. 35 shows a three-phase AC inverter 200 including the power module 1A. In the three-phase AC inverter 200, a power module 1A forming a U-phase inverter, a power module 1A forming a V-phase inverter, and a power module 1A forming a W-phase inverter are connected in parallel to one another. The three-phase AC inverter 200 uses SiC MOSFETs as the power semiconductor elements 30 and connects a snubber capacitor C between a power terminal PL and a ground terminal NL. The power semiconductor elements 30 may use IGBTs, and a three-phase converter connected to the snubber capacitor C (not shown) may be connected between the power terminal PL and the ground terminal NL. Although not shown in FIG. 35, when using the power module 1B to form the three-phase AC inverter 200, the diodes 40 are arranged outside the power module 1B.

As shown in FIG. 35, the power module 1A is connected to a power supply E. When a switching action is performed, the switching speed of the SiC MOSFET is high. Thus, the inductance L of the connection line produces a large surge voltage Ldi/dt. For example, for a current change of di=300 A, when a time change resulting from switching is dt=100 nsec, di/dt=$3\times10^9$ (A/s) is obtained.

The value of the inductance L varies the value of the surge voltage Ldi/dt. However, the surge voltage Ldi/dt is superimposed on the power supply E. The snubber capacitor C connected between the power terminal PL and the ground terminal NL absorbs the surge voltage Ldi/dt.

As a second circuit configuration example, FIG. 36 shows a three-phase AC inverter 210 including the power module 1A.

The three-phase AC inverter 210, which includes a power module unit 212 connected to a gate driver 211, a power supply or battery 213, and a converter 214, drives and controls a three-phase motor 215. The power module unit 212 is connected to a U-phase inverter, a V-phase inverter, and a W-phase inverter corresponding to the U-phase, V-phase, and W-phase of the three-phase motor 215.

The gate driver 211 is connected to each of the gate electrodes 33 of the first power semiconductor element group 30AT and the gate electrodes 33 of the second power semiconductor element group 30BT in the power module 1A forming the U-phase inverter, the gate electrodes 33 of the first power semiconductor element group 30AT and the gate electrodes 33 of the second power semiconductor element group 30BT in the power module 1A forming the V-phase inverter, and the gate electrodes 33 of the first power semiconductor element group 30AT and the gate electrodes 33 of the second power semiconductor element group 30BT in the power module 1A forming the W-phase inverter. Further, the gate driver 211 is connected to each of the source electrodes 32 of the first power semiconductor element group 30AT and the source electrodes 32 of the second power semiconductor element group 30BT in the power module 1A forming the U-phase inverter, the source electrodes 32 of the first power semiconductor element group 30AT and the source electrodes 32 of the second power semiconductor element group 30BT in the power module 1A forming the V-phase inverter, and the source electrodes 32 of the first power semiconductor element group 30AT and the source electrodes 32 of the second power semiconductor element group 30BT in the power module 1A forming the W-phase inverter.

The power module unit 212 is connected between a positive terminal (+) P and a negative terminal (−) N of the converter 214, which is connected to the power supply or battery (E) 213, and includes the power semiconductor element groups 30AT and 30BT of the power module 1A forming the U-phase inverter, the power semiconductor element groups 30AT and 30BT of the power module 1A forming the V-phase inverter, and the power semiconductor element groups 30AT and 30BT of the power module 1A forming the W-phase inverter.

The diode groups 40AT and 40BT serving as freewheel diodes are connected in antiparallel between the source electrodes 32 and the drain electrodes 31 of the power semiconductor element groups 30AT and 30BT. The power module 1B may be applied to the three-phase AC inverter 210. In this case, the diode groups 40AT and 40BT are arranged outside the power module 1B.

In this manner, when the power modules 1A (1B) are used like in the three-phase AC inverters 200 and 210, the three-phase AC inverters 200 and 210 may be cooled with a coolant. Preferably, in such a configuration, the power modules 1A (1B) are laid out along a flow passage of the coolant. This readily cools the power modules 1A (1B).

MODIFIED EXAMPLES

The embodiments described above exemplify, without any intention to limit, applicable forms of a power module according to this disclosure. The power module in accordance with this disclosure may be modified from the embodiments described above. For example, the configuration in each of the above embodiments may be replaced, changed, or omitted in part or include an additional element. In the modified examples described hereafter, same reference characters are given to those components that are the same as the corresponding components of the above embodiments. Such components will not be described in detail.

In each of the above embodiments, one of the first output terminal 52A and the second output terminal 52B may be omitted.

Figure 37:
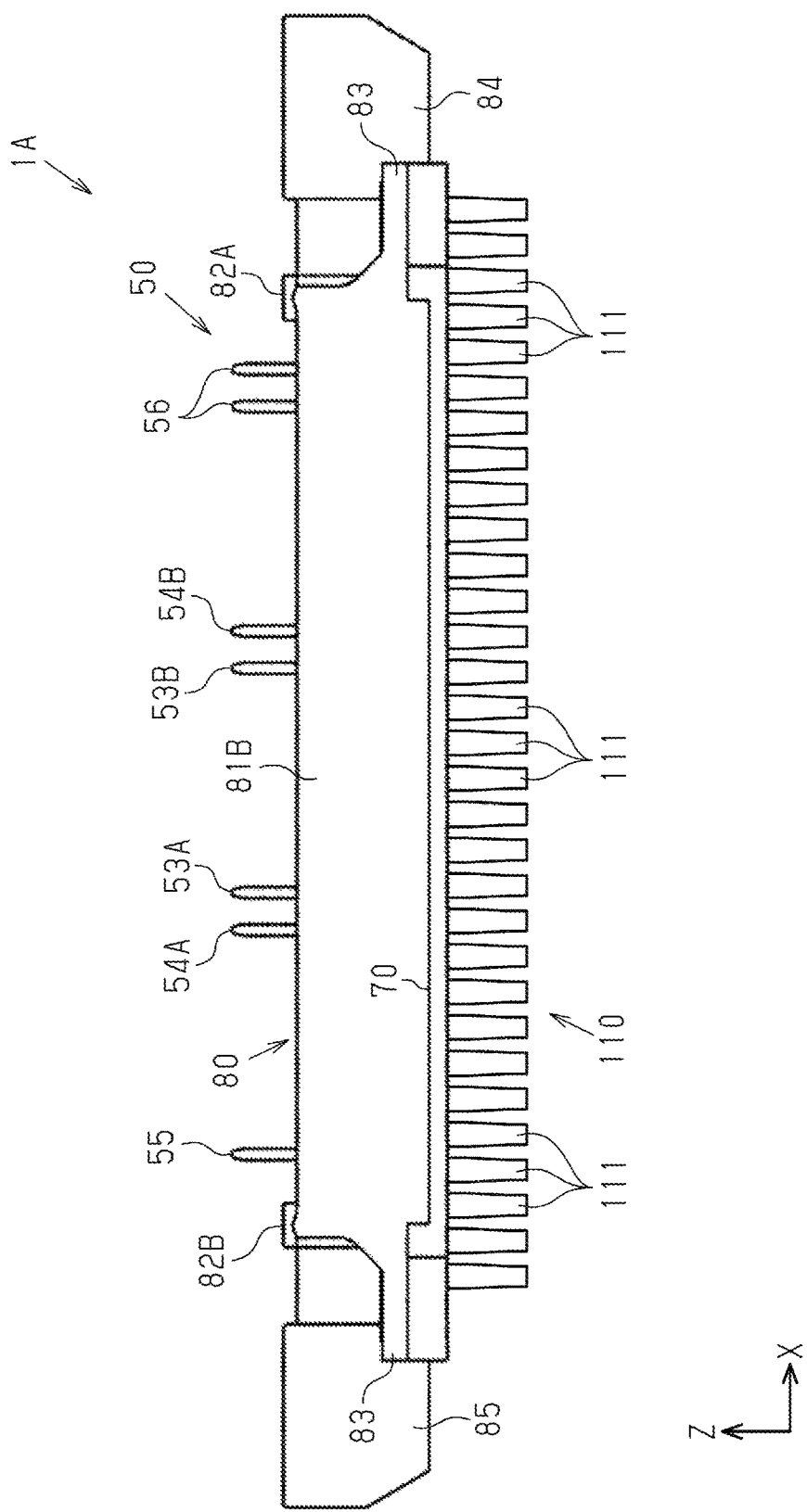
FIG. 37 is a side view illustrating a power module of a modified example.

In each of the above embodiments, as shown in FIG. 37, a heat sink 110, which is one example of a cooler, may be attached to the heat dissipation back surface 70r of the heat dissipation plate 70. The heat sink 110 includes fins 111. The heat dissipation plate 70 and the heat sink 110 may be formed integrally as a single component.

With this configuration, the heat sink 110 is arranged on the heat dissipation plate 70. This directly cools the heat sink 110. Thus, the heat dissipation efficiency of the power semiconductor elements 30A and 30B is further increased.

Instead of the fins 111, the heat sink 110 may include heat dissipation pins, each having a circular or polygonal cross section obtained by cutting the fins 111 along a plane extending in the width direction X and the length direction Y in FIG. 37. Further, the fins 111 and the heat dissipation pins may both be used.

Figure 38:
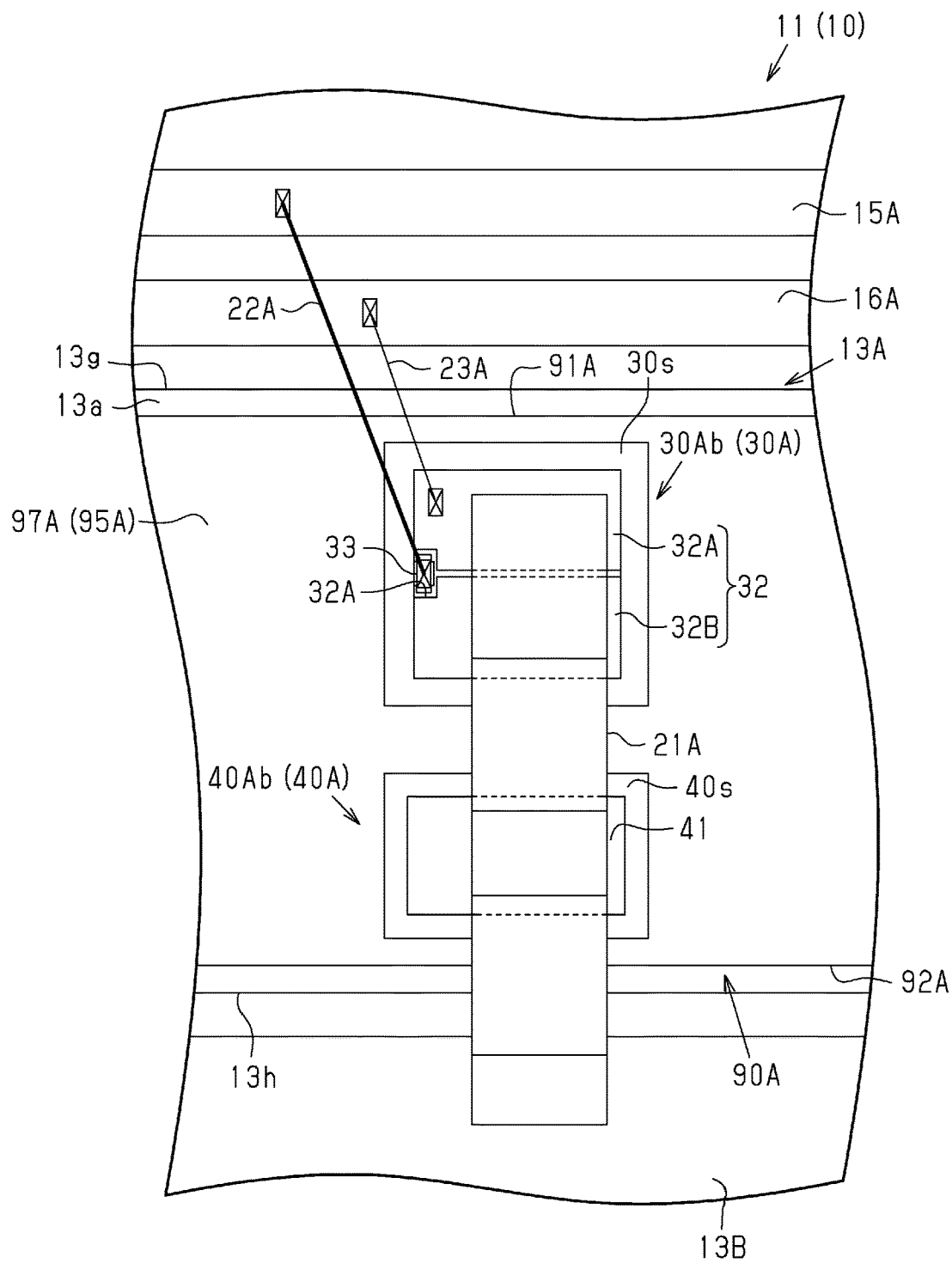
FIG. 38 is an enlarged view of a first power semiconductor element, a first diode, and their surrounding in the power module of the modified example.
Figure 39:
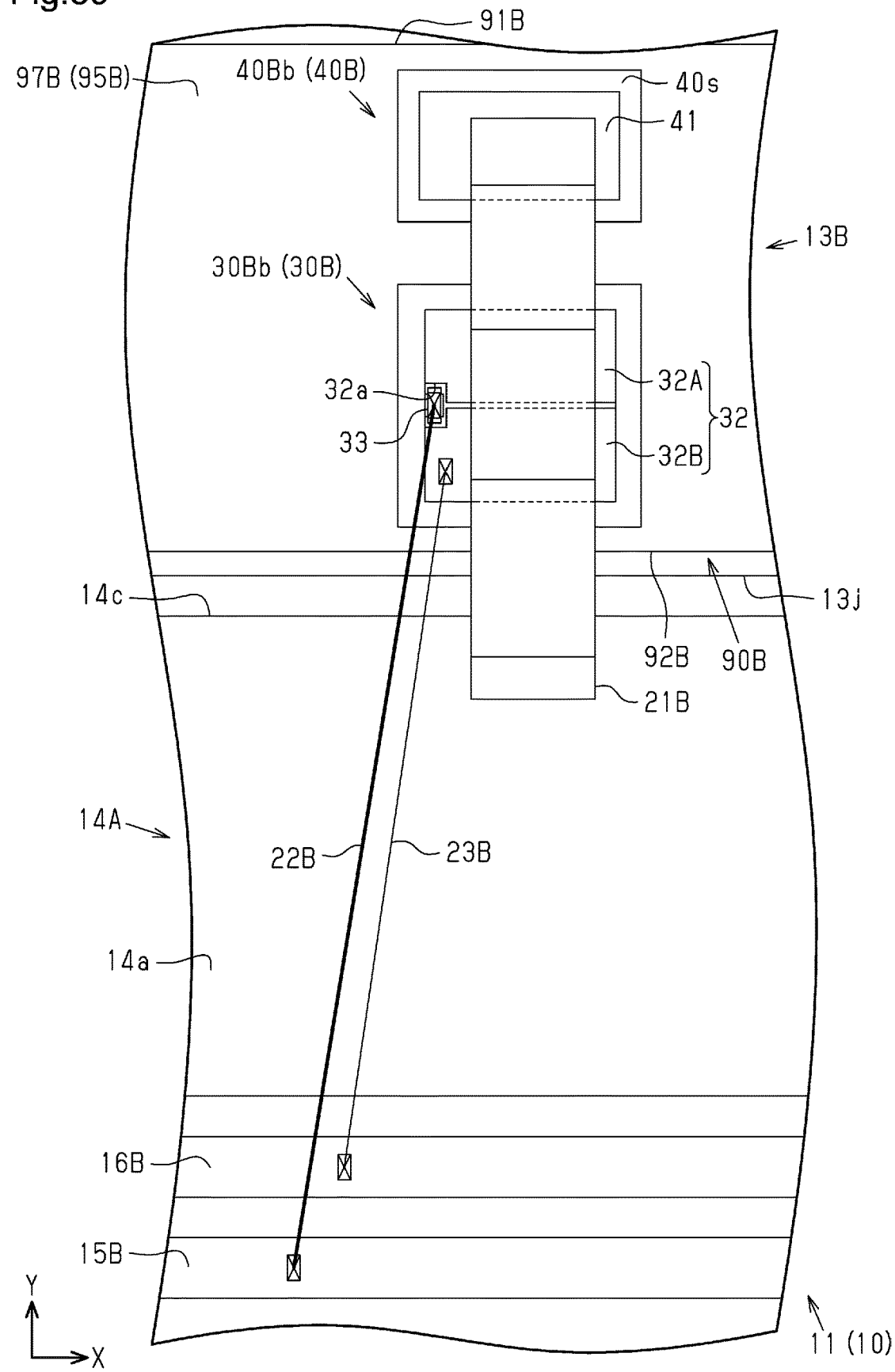
FIG. 39 is an enlarged view of a second power semiconductor element, a second diode, and their surrounding in the power module of the modified example.

In each of the above embodiments, the first element connecting members 21A and the second element connecting members 21B are not limited to wires and may be strips of plates in plan view. The first element connecting members 21A and the second element connecting members 21B are each formed from Cu, a Cu alloy, Al, or an Al alloy. In one example, as shown in FIG. 38, in the power module 1A, the first element connecting member 21A is connected to and over the first source electrode 32A and the second source electrode 32B of the first power semiconductor element 30Ab, to and over the entire anode electrode 41 of the first diode 40Ab, and to the second mounting layer 13B. In a further example, as shown in FIG. 39, in the power module 1A, the first element connecting member 21A is connected to and over the first source electrode 32A and the second source electrode 32B of the second power semiconductor element 30Bb, to and over the entire anode electrode 41 of the second diode 40Bb, and to the conductive layer 14A. The first element connecting members 21A connected to the first power semiconductor elements 30Aa and 30Ac to 30Af may be modified in the same manner as the first element connecting member 21A of FIG. 38. Further, the first element connecting members 21A connected to the second power semiconductor elements 30Ba and 30Bc to 30Bf may be modified in the same manner as the first element connecting member 21A of FIG. 39.

Figure 40:
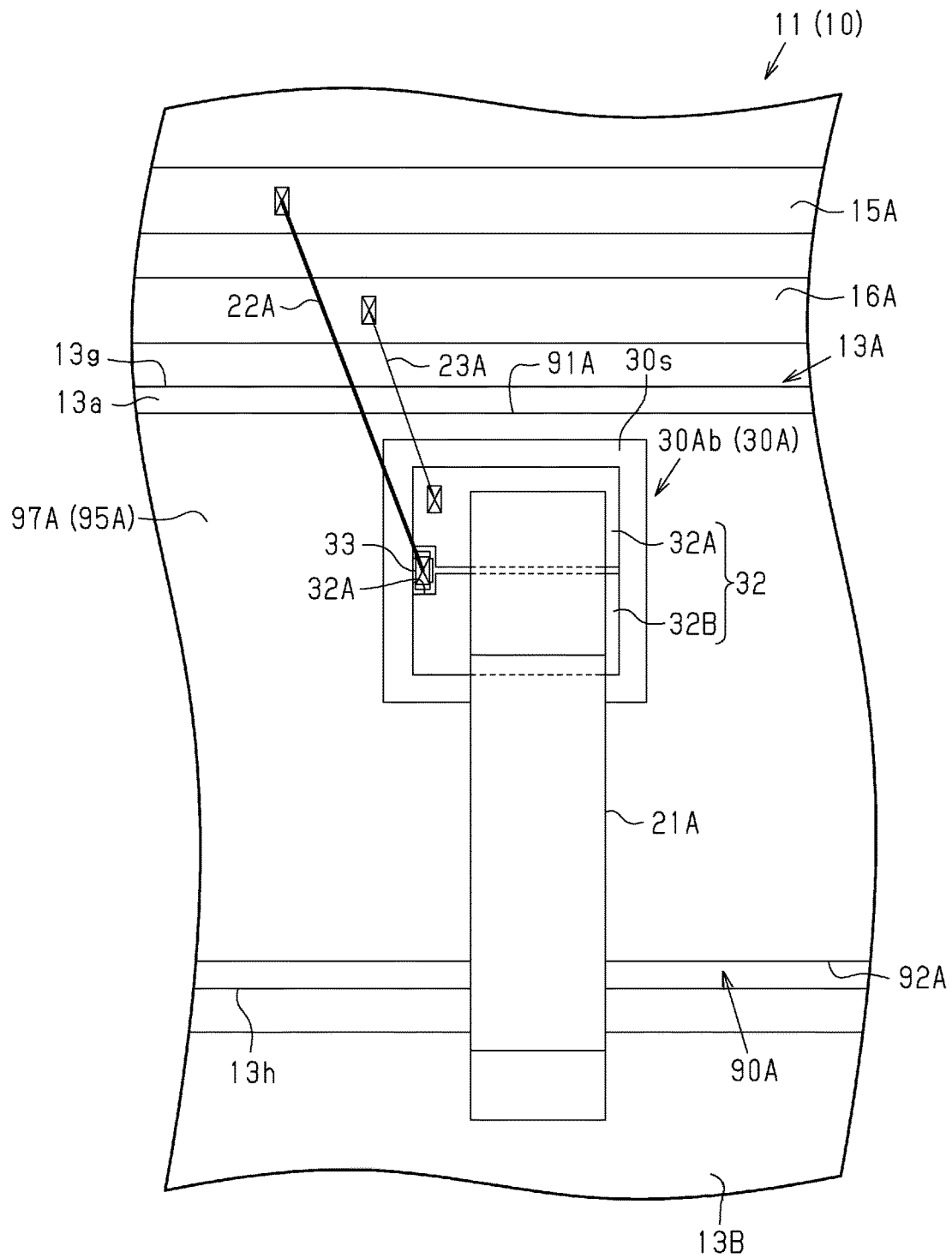
FIG. 40 is an enlarged view of a first power semiconductor element and its surrounding in a power module of a modified example.
Figure 41:
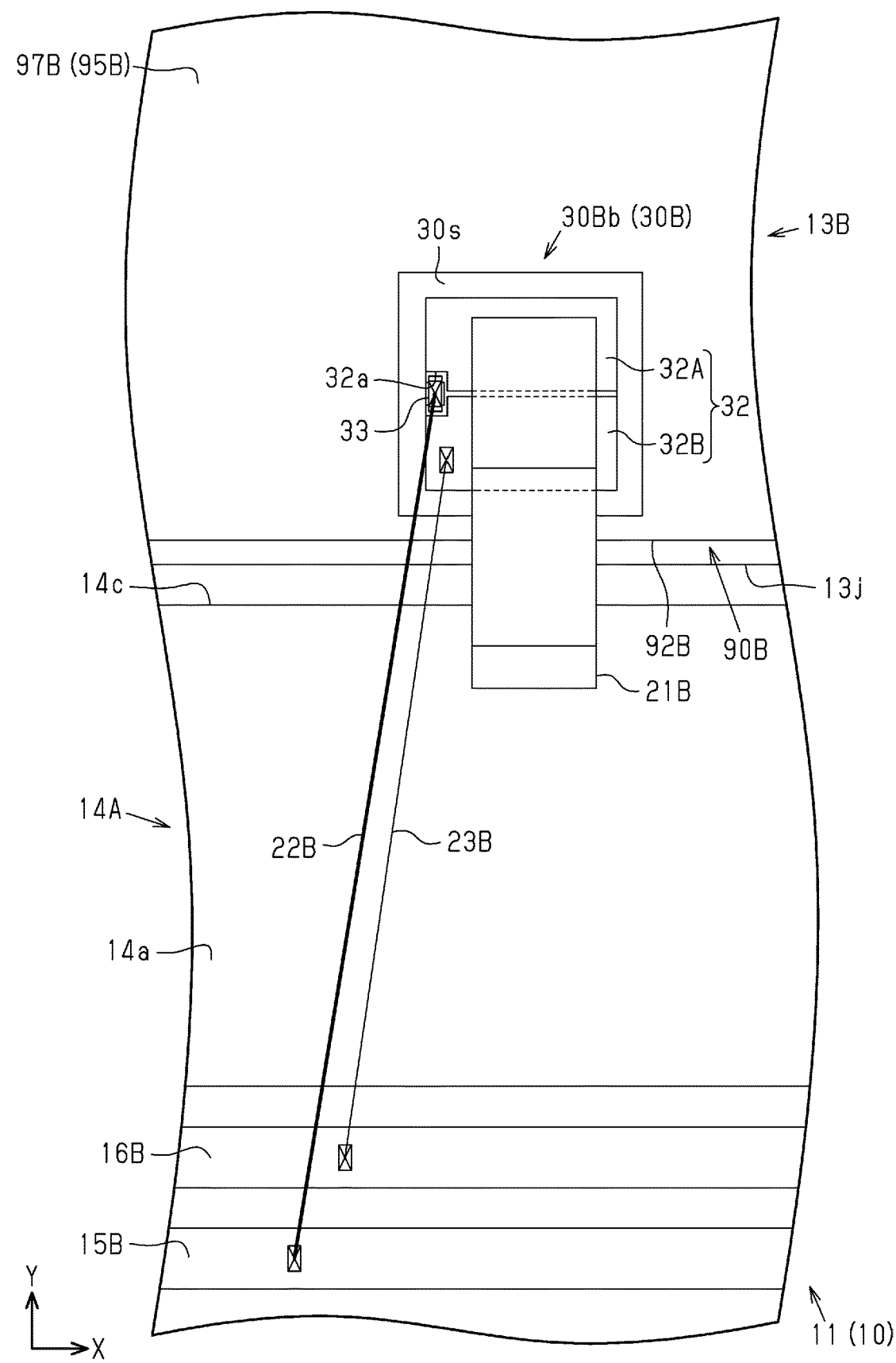
FIG. 41 is an enlarged view of a second power semiconductor element and its surrounding in the power module of the modified example.

In one example, as shown in FIG. 40, in the power module 1B, the first element connecting member 21A is connected to and over the first source electrode 32A and the second source electrode 32B of the first power semiconductor element 30Ab and to the second mounting layer 13B. In a further example, as shown in FIG. 41, in the power module 1B, the first element connecting member 21A is connected to and over the first source electrode 32A and the second source electrode 32B of the second power semiconductor element 30Bb and to the conductive layer 14A. The first element connecting members 21A connected to the first power semiconductor elements 30Aa and 30Ac to 30Af may be modified in the same manner as the first element connecting member 21A of FIG. 40. Further, the first element connecting members 21A connected to the second power semiconductor elements 30Ba and 30Bc to 30Bf may be modified in the same manner as the first element connecting member 21A of FIG. 41.

In each of the above embodiments, the first substrate 11 and the second substrate 12 may be formed integrally as the substrate 10. In this case, the coupling members 100A to 100C are omitted. Further, the first control layer 15A and the first control layer 15C may be integrated. In this case, the first control layer connecting member 103A is omitted. Further, the first detection layer 16A and the first detection layer 16C may be integrated. In this case, the first detection layer connecting member 104A is omitted. Further, the second control layer 15B and the second control layer 15D may be integrated. In this case, the second control layer connecting member 103B is omitted. Further, the second detection layer 16B and the second detection layer 16D may be integrated. In this case, the second detection layer connecting member 104B is omitted.

In each of the above embodiments, the power semiconductor elements 30A and 30B may each be changed in number. In one example, five first power semiconductor elements 30A are mounted on each of the first graphite plates 90A and 90C, and five second power semiconductor elements 30B are mounted on each of the second graphite plates 90B and 90D. In the first embodiment, the number of each of the diodes 40A and 40B is set in accordance with the number of the power semiconductor elements 30A and 30B.

Figure 42:
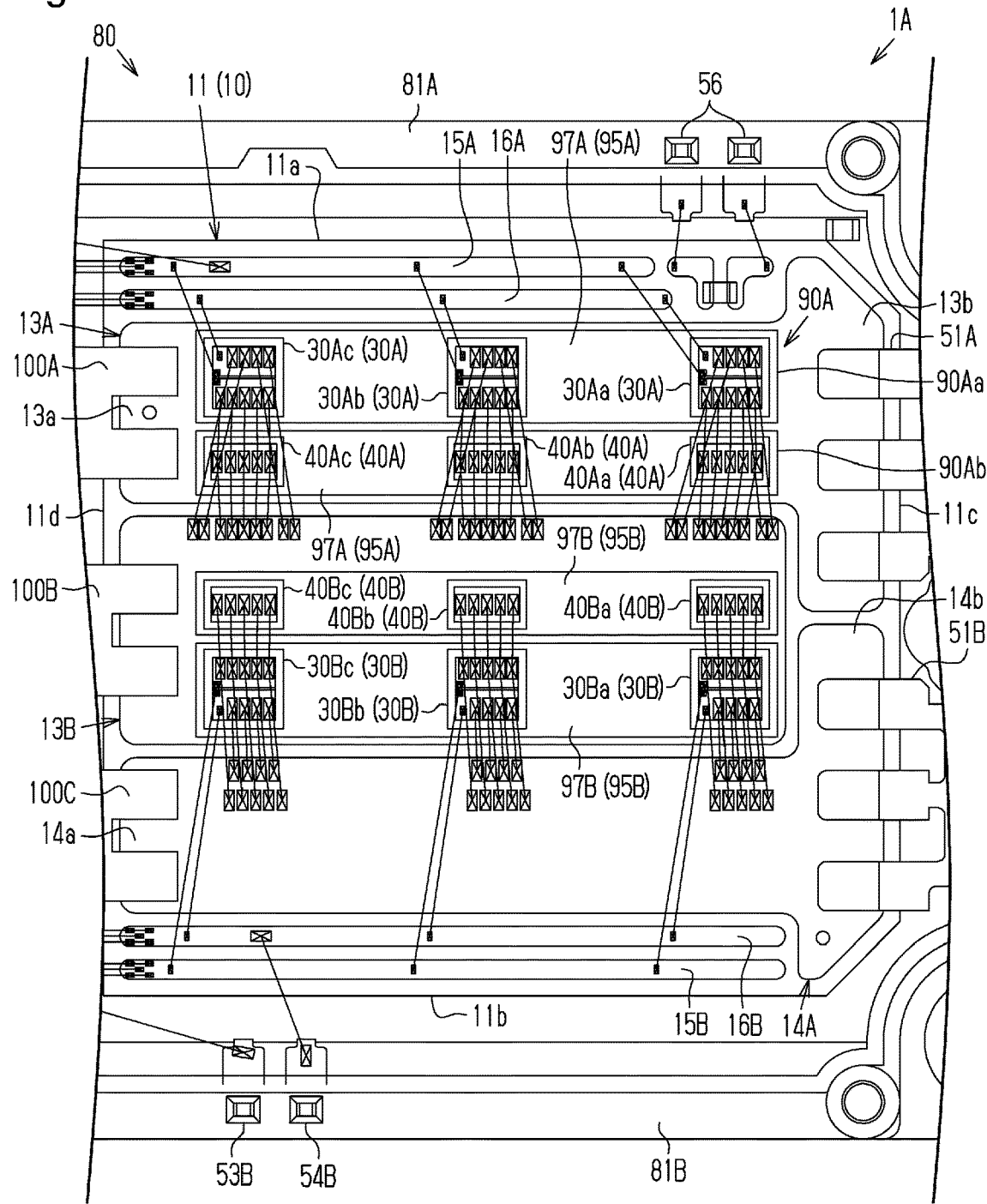
FIG. 42 is a plan view of a first graphite plate and its surrounding in a power module of a modified example.

In the first embodiment, as shown in FIG. 42, the first graphite plate 90A may include a first graphite portion 90Aa, on which the first power semiconductor elements 30A are arranged, and a second graphite portion 90Ab, on which the first diodes 40A are arranged. The first graphite portion 90Aa and the second graphite portion 90Ab are spaced apart in the length direction Y. In the first graphite portion 90Aa, the graphite plate 90xy forms a plate main surface 95A of the first graphite portion 90Aa, and the graphite plate 90xz forms a plate back surface 96A of the first graphite portion 90Aa. In the second graphite portion 90Ab, the graphite plate 90$xy$ forms the plate main surface 95A of the second graphite portion 90Ab, and the graphite plate 90$xz$ forms the plate back surface 96A of the second graphite portion 90Ab.

Further, as shown in FIG. 42, the width of the first graphite portion 90Aa (dimension of first graphite portion 90Aa in length direction Y) is greater than the width of the second graphite portion 90Ab (dimension of second graphite portion 90Ab in length direction Y). The dimension of the first graphite portion 90Aa in the width direction X is equal to the dimension of the second graphite portion 90Ab in the width direction X. The thickness of the first graphite portion 90Aa (dimension of first graphite portion Aa in the thickness direction Z) is equal to the thickness of the second graphite portion 90Ab (dimension of second graphite portion Ab in thickness direction Z).

Here, as long as the difference in the dimension of the first graphite portion 90Aa in the length direction Y and the dimension of the second graphite portion 90Ab in the length direction Y is, for example, within 5% of the dimension of the second graphite portion 90Ab in the length direction Y, this will mean that the width of the first graphite portion 90Aa is equal to the width of the second graphite portion 90Ab. As long as the difference in the dimension of the first graphite portion 90Aa in the width direction X and the dimension of the second graphite portion 90Ab in the width direction X is, for example, within 5% of the dimension of the second graphite portion 90Ab in the width direction X, this will mean that the dimension of the first graphite portion 90Aa in the width direction X is equal to the dimension of the second graphite portion 90Ab in the width direction X. Further, as long as the difference in the dimension of the first graphite portion 90Aa in the thickness direction Z and the dimension of the second graphite portion 90Ab in the thickness direction Z is, for example, within 5% of the dimension of the second graphite portion 90Ab in the thickness direction Z, this will mean that the thickness of the first graphite portion 90Aa is equal to the thickness of the second graphite portion 90Ab.

The dimension of the first graphite portion 90Aa in the width direction X may be changed. In one example, the dimension of the first graphite portion 90Aa in the width direction X may be less than the dimension of the second graphite portion 90Ab in the width direction X. Preferably, in this case, the first graphite portion 90Aa is arranged on the main mounting portion 13$a$ of the first mounting layer 13A in the width direction X so that the first power semiconductor element 30Aa becomes closer to the first control layer 15A and the first detection layer 16A.

The thickness of the first graphite portion 90Aa may be changed. In one example, the thickness of the first graphite portion 90Aa may differ from the thickness of the second graphite portion 90Ab. In one example, the thickness of the first graphite portion 90Aa may be greater than the thickness of the second graphite portion 90Ab. More specifically, the thickness of the first graphite portion 90Aa may be greater than the thickness of the first graphite plate 90A in each of the above embodiments.

The dimension of the second graphite portion 90Ab in the width direction X may be changed. In one example, the dimension of the second graphite portion 90Ab in the width direction X may differ from the dimension of the first graphite portion 90Aa in the width direction X.

Further, the thickness of the second graphite portion 90Ab may be changed. In one example, the thickness of the second graphite portion 90Ab may be less than the thickness of the first graphite portion 90Aa. More specifically, the thickness of the second graphite portion 90Ab may be less than the thickness of the first graphite plate 90A in each of the above embodiments.

The second graphite plate 90B may include a first graphite portion 90Ba, on which the second power semiconductor elements 30B are arranged, and a second graphite portion 90Bb, on which the second diodes 40B are arranged. In the first graphite portion 90Ba, the graphite plate 90$xy$ forms the plate main surface 95B of the first graphite portion 90Ba, and the graphite plate 90$xz$ forms the plate back surface 96B of the first graphite portion 90Ba. In the second graphite portion 90Bb, the graphite plate 90$xy$ forms the plate main surface 95B of the second graphite portion 90Bb, and the graphite plate 90$xz$ forms the plate back surface 96B of the second graphite portion 90Bb.

Further, as shown in FIG. 42, the width of the first graphite portion 90Ba (dimension of first graphite portion 90Ba in length direction Y) is greater than the width of the second graphite portion 90Bb (dimension of second graphite portion 90Bb in length direction Y). The dimension of the first graphite portion 90Ba in the width direction X is equal to the dimension of the second graphite portion 90Bb in the width direction X. The thickness of the first graphite portion 90Ba (dimension of first graphite portion Ba in thickness direction Z) is equal to the thickness of the second graphite portion 90Bb (dimension of graphite portion Bb in thickness direction Z).

Here, as long as the difference in the dimension of the first graphite portion 90Aa in the length direction Y and the dimension of the second graphite portion 90Ab in the length direction Y is, for example, within 5% of the dimension of the second graphite portion 90Ab in the length direction Y, this will mean that the width of the first graphite portion 90Aa is equal to the width of the second graphite portion 90Ab. As long as the difference in the dimension of the first graphite portion 90Ba in the width direction X and the dimension of the second graphite portion 90Bb in the width direction X is, for example, within 5% of the dimension of the second graphite portion 90Bb in the width direction X, this will mean that the dimension of the first graphite portion 90Ba in the width direction X is equal to the dimension of the second graphite portion 90Bb in the width direction X. Further, as long as the difference in the dimension of the first graphite portion 90Ba in the thickness direction Z and the dimension of the second graphite portion 90Bb in the thickness direction Z is within, for example, 5% of the dimension of the second graphite portion 90Bb in the thickness direction Z, this will mean that the thickness of the first graphite portion 90Ba is equal to the thickness of the second graphite portion 90Bb.

The dimension of the first graphite portion 90Ba in the width direction X may be changed. In one example, the dimension of the first graphite portion 90Ba in the width direction X may be less than the dimension of the second graphite portion 90Bb in the width direction X. Further, the dimension of the first graphite portion 90Ba in the width direction X may differ from the dimension of the first graphite portion 90Aa in the width direction X and the dimension of the second graphite portion 90Ab in the width direction X.

The thickness of the first graphite portion 90Ba may be changed. In one example, the thickness of the first graphite portion 90Ba may differ from the thickness of the second graphite portion 90Bb. In one example, the thickness of the first graphite portion 90Ba may be greater than the thickness of the second graphite portion 90Bb. More specifically, the thickness of the first graphite portion 90Ba may be greater than the thickness of the second graphite plate 90B in each of the above embodiments. Further, the thickness of the first graphite portion 90Ba may differ from the thickness of the first graphite portion 90Aa and the thickness of the second graphite portion 90Ab.

The dimension of the second graphite portion 90Bb in the width direction X may be changed. In one example, the dimension of the second graphite portion 90Bb in the width direction X may differ from the dimension of the first graphite portion 90Ba in the width direction X. Further, the dimension of the second graphite portion 90Bb in the width direction X may differ from the dimension of the first graphite portion 90Aa in the width direction X and the dimension of the second graphite portion 90Ab in the width direction X.

The thickness of the second graphite portion 90Bb may be changed. In one example, the thickness of the second graphite portion 90Bb may be less than the thickness of the first graphite portion 90Ba. More specifically, the thickness of the second graphite portion 90Bb may be less than the thickness of the second graphite plate 90B in each of the above embodiments. Further, the thickness of the second graphite portion 90Bb may differ from the thickness of the first graphite portion 90Aa and the thickness of the second graphite portion 90Ab.

In the first graphite plate 90A, the stacked construction of the graphite plate 90x and the graphite plate 90xz in the first graphite portion 90Aa may differ from the stacked construction of the graphite plate 90x and the graphite plate 90xz in the second graphite portion 90Ab. In the second graphite plate 90B, the stacked construction of the graphite plate 90x and the graphite plate 90xz in the first graphite portion 90Ba may differ from the stacked construction of the graphite plate 90x and the graphite plate 90xz in the second graphite portion 90Bb. Further, the first graphite plate 90C and the second graphite plate 90D of the second substrate 12 may be modified in the same manner as the first graphite plate 90A and the second graphite plate 90B shown in FIG. 42.

Figure 43:
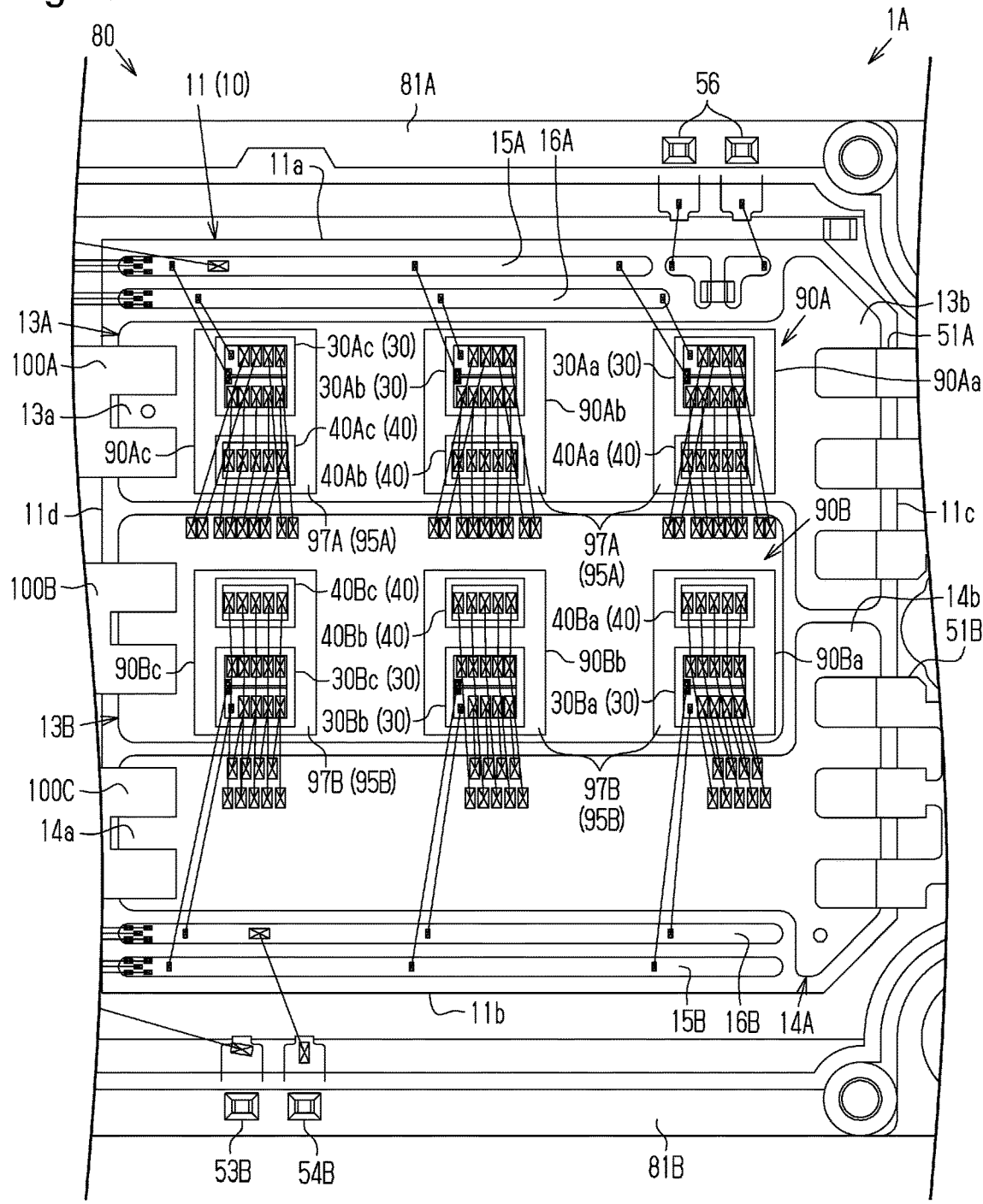
FIG. 43 is a plan view of a first graphite plate and its surrounding in a power module of a modified example.

In the first embodiment, each set of the first power semiconductor element 30A and the first diode 40A may be arranged separately on the first graphite plate 90A. In one example, as shown in FIG. 43, the first graphite plate 90A includes the first graphite portion 90Aa, the second graphite portion 90Ab, and a third graphite portion 90Ac. The first power semiconductor elements 30Aa and the first diode 40Aa are arranged in the first graphite portion 90Aa. The first power semiconductor element 30Ab and the first diode 40Ab are arranged in the second graphite portion 90Ab. The first power semiconductor element 30Ac and the first diode 40Ac are arranged in the third graphite portion 90Ac. The first graphite portion 90Aa, the second graphite portion 90Ab, and the third graphite portion 90Ac are aligned in the length direction Y and spaced apart in the width direction X. In the first graphite portion 90Aa, the graphite plate 90xy forms the plate main surface 95A of the first graphite portion 90Aa, and the graphite plate 90xz forms the plate back surface 96A of the first graphite portion 90Aa. In the second graphite portion 90Ab, the graphite plate 90xy forms the plate main surface 95A of the second graphite portion 90Ab, and the graphite plate 90xz forms the plate back surface 96A of the second graphite portion 90Ab. In the third graphite portion 90Ac, the graphite plate 90xy forms a plate main surface 95A of the third graphite portion 90Ac, and the graphite plate 90xz forms a plate back surface 96A of the third graphite portion 90Ac.

Further, as shown in FIG. 43, the dimension of the first graphite portion 90Aa in the length direction Y is equal to the dimension of the second graphite portion 90Ab in the length direction Y and the dimension of the third graphite portion 90Ac in the length direction Y. The dimension of the first graphite portion 90Aa in the width direction X is equal to the dimension of the second graphite portion 90Ab in the width direction X and the dimension of the third graphite portion 90Ac in the width direction X. The thickness of the first graphite portion 90Aa (dimension of the first graphite portion 90Aa in thickness direction Z) is equal to the thickness of the second graphite portion 90Ab (thickness of second graphite portion 90Ab in the thickness direction Z) and the thickness of the third graphite portion 90Ac (thickness of third graphite portion 90Ac in thickness direction Z).

Here, as long as the difference in the dimension of the first graphite portion 90Aa in the length direction Y and the dimension of the second graphite portion 90Ab in the length direction Y is, for example, within 5% of the dimension of the second graphite portion 90Ab in the length direction Y, this will mean that the dimension of the first graphite portion 90Aa in the length direction Y is equal to the dimension of the second graphite portion 90Ab in the length direction Y. As long as the difference in the dimension of the first graphite portion 90Aa in the length direction Y and the dimension of the third graphite portion 90Ac in the length direction Y is, for example, within 5% of the dimension of the third graphite portion 90Ac in the length direction Y, this will mean that the dimension of the first graphite portion 90Aa in the length direction Y is equal to the dimension of the third graphite portion 90Ac in the length direction Y. As long as the difference in the dimension of the first graphite portion 90Aa in the width direction X and the dimension of the second graphite portion 90Ab in the width direction X is, for example, within 5% of the dimension of the second graphite portion 90Ab in the width direction X, this will mean that the dimension of the first graphite portion 90Aa in the width direction X is equal to the dimension of the second graphite portion 90Ab in the width direction X. As long as the difference in the dimension of the first graphite portion 90Aa in the width direction X and the dimension of the third graphite portion 90Ac in the width direction X is, for example, within 5% of the dimension of the third graphite portion 90Ac in the width direction X, this will mean that the dimension of the first graphite portion 90Aa in the width direction X is equal to the dimension of the third graphite portion 90Ac in the width direction X. Further, as long as the difference in the dimension of the first graphite portion 90Aa in the thickness direction Z and the dimension of the second graphite portion 90Ab in the thickness direction Z is, for example, within 5% of the dimension of the second graphite portion 90Ab in the thickness direction Z, this will mean that the thickness of the first graphite portion 90Aa is equal to the thickness of the second graphite portion 90Ab. Further, as long as the difference in the dimension of the first graphite portion 90Aa in the thickness direction Z and the thickness of the third graphite portion 90Ac in the thickness direction Z is, for example, within 5% of the thickness of the third graphite portion 90Ac in the thickness direction Z, this will mean that the thickness of the first graphite portion 90Aa is equal to the thickness of the third graphite portion 90Ac.

The dimension of the first graphite portion 90Aa in the width direction X may be changed. In one example, the dimension of the first graphite portion 90Aa in the width direction X may be less than or greater than at least one of the dimension of the second graphite portion 90Ab in the width direction X and the dimension of the third graphite portion 90Ac in the width direction X.

The thickness of the first graphite portion 90Aa may be changed. In one example, the thickness of the first graphite portion 90Aa may be less than at least one of the thickness of the second graphite portion 90Ab and the thickness of the third graphite portion 90Ac. In one example, the thickness of the first graphite portion 90Aa may be greater than the thickness of the second graphite portion 90Ab and the thickness of the third graphite portion 90Ac. More specifically, the thickness of the first graphite portion 90Aa may be greater than the thickness of the first graphite plate 90A in each of the above embodiments.

The dimension of the second graphite portion 90Ab in the width direction X may be changed. In one example, the dimension of the second graphite portion 90Ab in the width direction X may be less than or greater than at least one of the dimension of the first graphite portion 90Aa in the width direction X and the dimension of the third graphite portion 90Ac in the width direction X.

Further, the thickness of the second graphite portion 90Ab may be changed. In one example, the thickness of the second graphite portion 90Ab may differ from at least one of the thickness of the first graphite portion 90Aa and the thickness of the third graphite portion 90Ac. In one example, the thickness of the second graphite portion 90Ab may be greater than the thickness of the first graphite portion 90Aa and the thickness of the third graphite portion 90Ac. More specifically, the thickness of the second graphite portion 90Ab may be greater than the thickness of the first graphite plate 90A in each of the above embodiments.

Further, the dimension of the third graphite portion 90Ac in the width direction X may be changed. In one example, the dimension of the third graphite portion 90Ac in the width direction X may be less than or greater than at least one of the dimension of the first graphite portion 90Aa in the width direction X and the dimension of the second graphite portion 90Ab in the width direction X.

Further, the thickness of the third graphite portion 90Ac may be changed. In one example, the thickness of the third graphite portion 90Ac may differ from at least one of the thickness of the first graphite portion 90Aa and the thickness of the second graphite portion 90Ab. In one example, the thickness of the third graphite portion 90Ac may be greater than the thickness of the first graphite portion 90Aa and the thickness of the second graphite portion 90Ab. More specifically, the thickness of the third graphite portion 90Ac may be greater than the thickness of the first graphite plate 90A in each of the above embodiments.

Further, the first graphite portion 90Aa, the second graphite portion 90Ab, and the third graphite portion 90Ac do not have to be spaced apart in equal intervals in the width direction X. The first graphite portion 90Aa and the second graphite portion 90Ab may be moved toward the fourth side surface 11$d$ of the first substrate 11.

Each set of the second power semiconductor element 30B and the second diode 40B may be arranged separately on the second graphite plate 90B. In one example, as shown in FIG. 43, the second graphite plate 90B includes the first graphite portion 90Ba, the second graphite portion 90Bb, and a third graphite portion 90Bc. The second power semiconductor element 30Ba and the second diode 40Ba are arranged in the first graphite portion 90Ba. The second power semiconductor elements 30Bb and the second diodes 40Bb are arranged in the second graphite portion 90Bb. The second power semiconductor element 30Bc and the second diode 40Bc are arranged in the third graphite portion 90Bc. The first graphite portion 90Ba, the second graphite portion 90Bb, and the third graphite portion 90Bc are aligned in the length direction Y and spaced apart in the width direction X. In the first graphite portion 90Ba, the graphite plate 90$xy$ forms the plate main surface 95B of the first graphite portion 90Ba, and the graphite plate 90$xz$ forms the plate back surface 96B of the first graphite portion 90Ba. In the second graphite portion 90Bb, the graphite plate 90$xy$ forms the plate main surface 95B of the second graphite portion 90Bb, and the graphite plate 90$xz$ forms the plate back surface 96B of the second graphite portion 90Bb. In the third graphite portion 90Bc, the graphite plate 90$xy$ forms the plate main surface 95B of the third graphite portion 90Bc, and the graphite plate 90$xz$ forms the plate back surface 96B of the third graphite portion 90Bc.

Further, as shown in FIG. 43, the dimension of the first graphite portion 90Ba in the length direction Y is equal to the dimension of the second graphite portion 90Bb in the length direction Y and the dimension of the third graphite portion 90Bc in the length direction Y. The dimension of the first graphite portion 90Ba in the width direction X is equal to the dimension of the second graphite portion 90Bb in the width direction X and the dimension of the third graphite portion 90Bc in the width direction X. The thickness of the first graphite portion 90Ba (dimension of first graphite portion 90Ba in thickness direction Z) is equal to the thickness of the second graphite portion 90Bb (dimension of second graphite portion 90Bb in thickness direction Z) and the thickness of the third graphite portion 90Bc (dimension of third graphite portion 90Bc in thickness direction Z).

Here, as long as the difference in the dimension of the first graphite portion 90Ba in the length direction Y and the dimension of the second graphite portion 90Bb in the length direction Y is, for example, within 5% of the dimension of the second graphite portion 90Bb in the length direction Y, this will mean that the dimension of the first graphite portion 90Ba in the length direction Y is equal to the dimension of the second graphite portion 90Bb in the length direction Y. As long as the difference in the dimension of the first graphite portion 90Ba in the length direction Y and the dimension of the third graphite portion 90Bc in the length direction Y is, for example, within 5% of the dimension of the third graphite portion 90Bc in the length direction Y, this will mean that the dimension of the first graphite portion 90Ba in the length direction Y is equal to the dimension of the third graphite portion 90Bc in the length direction Y. As long as the difference in the dimension of the first graphite portion 90Ba in the width direction X and the dimension of the second graphite portion 90Bb in the width direction X is, for example, within 5% of the dimension of the second graphite portion 90Bb in the width direction X, this will mean that the dimension of the first graphite portion 90Ba in the width direction X is equal to the dimension of the second graphite portion 90Bb in the width direction X. As long as the difference in the dimension of the first graphite portion 90Ba in the width direction X and the dimension of the third graphite portion 90Bc in the width direction X is, for example, within 5% of the dimension of the third graphite portion 90Bc in the width direction X, this will mean that the dimension of the first graphite portion 90Ba in the width direction X is equal to the dimension of the third graphite portion 90Bc in the width direction X. As long as the difference in the dimension of the first graphite portion 90Ba in the thickness direction Z and the dimension of the second graphite portion 90Bb in the thickness direction Z is within, for example, 5% of the dimension of the second graphite portion 90Bb in the thickness direction Z, this will mean that the thickness of the first graphite portion 90Ba is equal to the thickness of the second graphite portion 90Bb. As long as the difference in the dimension of the first graphite portion 90Ba in the thickness direction Z and the dimension of the third graphite portion 90Bc in the thickness direction Z is, for example, within 5% of the dimension of the third graphite portion 90Bc in the thickness direction Z, this will mean that the thickness of the first graphite portion 90Ba is equal to the thickness of the third graphite portion 90Bc.

The dimension of the first graphite portion 90Ba in the width direction X may be changed. In one example, the dimension of the first graphite portion 90Ba in the width direction X may be less than or greater than at least one of the dimension of the second graphite portion 90Bb in the width direction X and the dimension of the third graphite portion 90Bc in the width direction X.

Further, the thickness of the first graphite portion 90Ba may be changed. In one example, the thickness of the first graphite portion 90Ba may differ from at least one of the thickness of the second graphite portion 90Bb and the thickness of the third graphite portion 90Bc. In one example, the thickness of the first graphite portion 90Ba may be greater than the thickness of the second graphite portion 90Bb and the thickness of the third graphite portion 90Bc. More specifically, the thickness of the first graphite portion 90Ba may be greater than the thickness of the second graphite plate 90B in each of the above embodiments.

The dimension of the second graphite portion 90Bb in the width direction X may be changed. In one example, the dimension of the second graphite portion 90Bb in the width direction X may be less than or greater than at least one of the dimension of the first graphite portion 90Ba in the width direction X and the dimension of the third graphite portion 90Bc in the width direction X.

The thickness of the second graphite portion 90Bb may be changed. In one example, the thickness of the second graphite portion 90Bb may differ from at least one of the thickness of the first graphite portion 90Ba and the thickness of the third graphite portion 90Bc. In one example, the thickness of the second graphite portion 90Bb may be greater than the thickness of the first graphite portion 90Ba and the thickness of the third graphite portion 90Bc. More specifically, the thickness of the second graphite portion 90Bb may be greater than the thickness of the second graphite plate 90B in each of the above embodiments.

Further, the dimension of the third graphite portion 90Bc in the width direction X may be changed. In one example, the dimension of the third graphite portion 90Bc in the width direction X may be less than or greater than at least one of the dimension of the first graphite portion 90Ba in the width direction X and the dimension of the second graphite portion 90Bb in the width direction X.

The thickness of the third graphite portion 90Bc may be changed. In one example, the thickness of the third graphite portion 90Bc may differ from at least one of the thickness of the first graphite portion 90Ba and the thickness of the second graphite portion 90Bb. In one example, the thickness of the third graphite portion 90Bc may be greater than the thickness of the first graphite portion 90Ba and the thickness of the second graphite portion 90Bb. More specifically, the thickness of the third graphite portion 90Bc may be greater than the thickness of the second graphite plate 90B.

The first graphite portion 90Ba, the second graphite portion 90Bb, and the third graphite portion 90Bc do not have to be spaced apart in equal intervals in the width direction X.

Further, the first graphite portion 90Ba does not have to be aligned with the first graphite portion 90Aa in the width direction X. For example, the first graphite portion 90Aa may be located toward the fourth side surface 11d of the first substrate 11 from the first graphite portion 90Ba in the width direction X. Further, the second graphite portion 90Bb does not have to be aligned with the second graphite portion 90Ab in the width direction X. The third graphite portion 90Bc does not have to be aligned with the third graphite portion 90Ac in the width direction X.

In the first graphite plate 90A, at least one of the stacked construction of the graphite plate $90x$ and the graphite plate $90xz$ in the first graphite portion 90Aa, the stacked construction of the graphite plate $90x$ and the graphite plate $90xz$ in the second graphite portion 90Ab, and the stacked construction of the graphite plate $90x$ and the graphite plate $90xz$ in the third graphite portion 90Ac may differ in configuration from the other stacked constructions. In the second graphite plate 90B, at least one of the stacked construction of the graphite plate $90x$ and the graphite plate $90xz$ in the first graphite portion 90Ba, the stacked construction of the graphite plate $90x$ and the graphite plate $90xz$ in the second graphite portion 90Bb, and the stacked construction of the graphite plate $90x$ and the graphite plate $90xz$ in the third graphite portion 90Bc may differ in configuration from the other stacked constructions. Further, the first graphite plate 90C and the second graphite plate 90D of the second substrate 12 may be modified in the same manner as the first graphite plate 90A and the second graphite plate 90B shown in FIG. 43.

Figure 44:
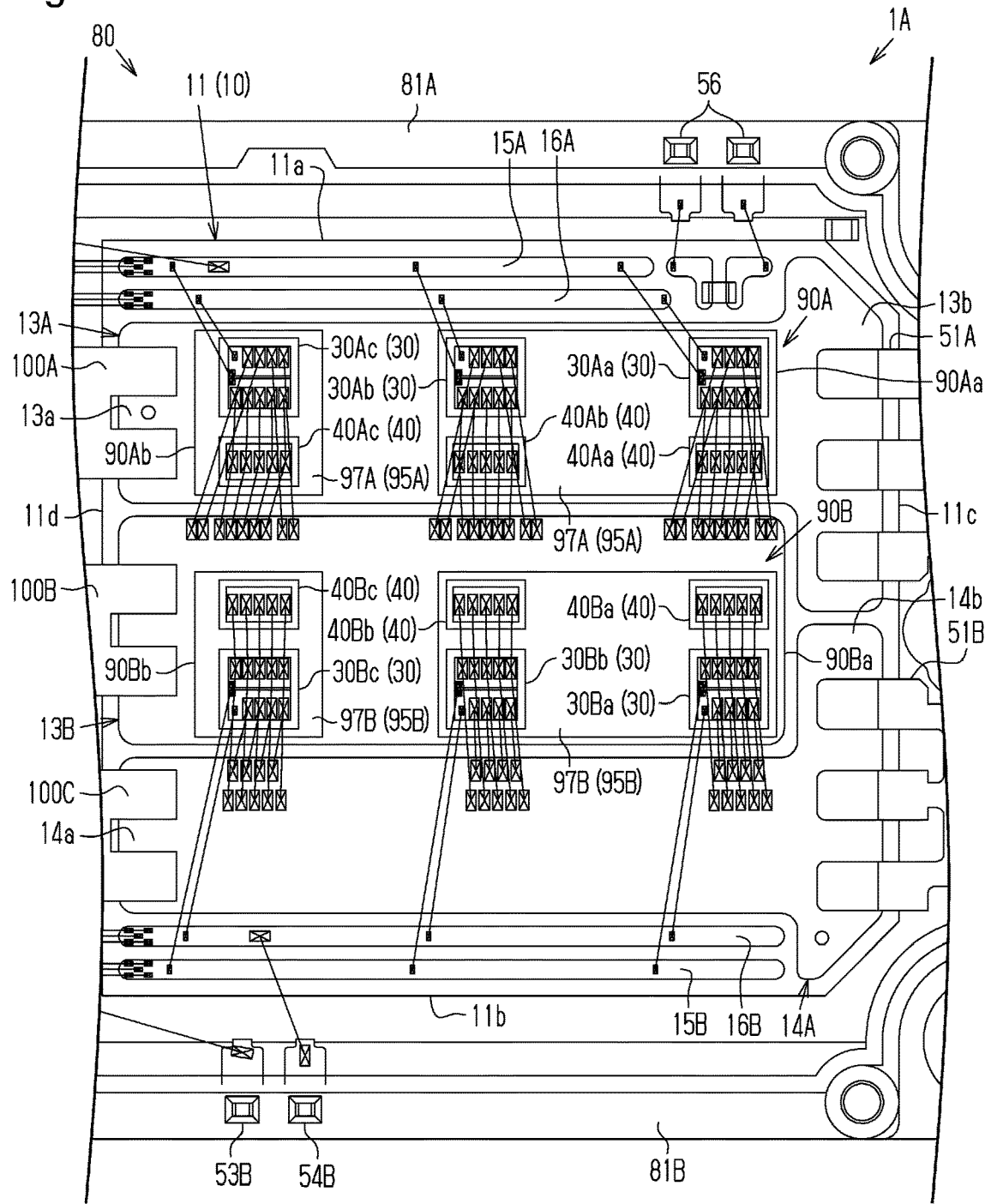
FIG. 44 is a plan view of a first graphite plate and its surrounding in a power module of a modified example.

In the first embodiment, as shown in FIG. 44, the first graphite plate 90A may have a configuration (first configuration) that includes the first graphite portion 90Aa, on which the first power semiconductor elements 30Aa and 30Ab and the first diodes 40Aa and 40Ab are arranged, and the second graphite portion 90Ab, on which the first power semiconductor element 30Ac and the first diode 40Ac are arranged. The first graphite portion 90Aa and the second graphite portion 90Ab are spaced apart in the width direction X. In the first graphite portion 90Aa, the graphite plate $90xy$ forms the plate main surface 95A of the first graphite portion 90Aa, and the graphite plate $90xz$ forms the plate back surface 96A of the first graphite portion 90Aa. In the second graphite portion 90Ab, the graphite plate $90xy$ forms the plate main surface 95A of the second graphite portion 90Ab, and the graphite plate $90xz$ forms the plate back surface 96A of the second graphite portion 90Ab.

Further, as shown in FIG. 44, the dimension of the first graphite portion 90Aa in the width direction X is greater than the dimension of the second graphite portion 90Ab in the width direction X. In one example, the dimension of the first graphite portion 90Aa in the width direction X is two times or greater than the dimension of the second graphite portion 90Ab in the width direction X. The dimension of the first graphite portion 90Aa in the length direction Y is equal to the dimension of the second graphite portion 90Ab in the length direction Y. The thickness of the first graphite portion 90Aa (dimension of the first graphite portion 90Aa in thickness direction Z) is equal to the thickness of the second graphite portion 90Ab (thickness of second graphite portion 90Ab in thickness direction Z).

Here, as long as the difference in the dimension of the first graphite portion 90Aa in the length direction Y and the dimension of the second graphite portion 90Ab in the length direction Y is, for example, within 5% of the dimension of the second graphite portion 90Ab in the length direction Y, this will mean that the dimension of the first graphite portion 90Aa in the length direction Y is equal to the dimension of the second graphite portion 90Ab in the length direction Y. Further, as long as the difference in the dimension of the first graphite portion 90Aa in the thickness direction Z and the dimension of the second graphite portion 90Ab in the thickness direction Z is, for example, within 5% of the dimension of the second graphite portion 90Ab in the thickness direction Z, this will mean that the thickness of the first graphite portion 90Aa is equal to the thickness of the second graphite portion 90Ab.

The dimension of the first graphite portion 90Aa in the width direction X may be changed. The dimension of the first graphite portion 90Aa in the width direction X only needs to allow the first power semiconductor element 30Aa to be spaced apart from the first power semiconductor element 30Ab in the width direction X, and the first diode 40Aa to be spaced apart from the first diode 40Ab in the width direction X.

The thickness of the first graphite portion 90Aa may be changed. In one example, the thickness of the first graphite portion 90Aa may differ from the thickness of the second graphite portion 90Ab. In one example, the thickness of the first graphite portion 90Aa may be greater than the thickness of the second graphite portion 90Ab. More specifically, the thickness of the first graphite portion 90Aa may be greater than the thickness of the first graphite plate 90A in each of the above embodiments.

Further, the position where the first graphite portion 90Aa is arranged in the width direction X may be changed. In one example, the first graphite portion 90Aa may be moved toward the fourth side surface 11d of the first substrate 11 so that the first power semiconductor element 30Aa becomes closer to the first control layer 15A and the first detection layer 16A in the width direction X.

The dimension of the second graphite portion 90Ab in the width direction X may be changed. In one example, the dimension of the second graphite portion 90Ab in the width direction X is greater than or equal to one-half of the dimension of the first graphite portion 90Aa in the width direction X and less than or equal to the dimension of the first graphite portion 90Aa in the width direction X.

Further, the thickness of the second graphite portion 90Ab may be changed. In one example, the thickness of the second graphite portion 90Ab may differ from the thickness of the first graphite portion 90Aa. Further, the thickness of the second graphite portion 90Ab may be greater than or less than the thickness of the first graphite plate 90A in each of the above embodiments.

Further, the second graphite plate 90B may have a configuration (first configuration) that includes the first graphite portion 90Ba, on which the second power semiconductor elements 30Ba and 30Bb and the second diodes 40Ba and 40Bb are arranged, and the second graphite portion 90Bb, on which the second power semiconductor element 30Bc and the second diode 40Bc are arranged. The first graphite portion 90Ba and the second graphite portion 90Bb are spaced apart in the width direction X. In the first graphite portion 90Ba, the graphite plate 90xy forms the plate main surface 95B of the first graphite portion 90Ba, and the graphite plate 90xz forms the plate back surface 96B of the first graphite portion 90Ba. In the second graphite portion 90Bb, the graphite plate 90xy forms the plate main surface 95B of the second graphite portion 90Bb, and the graphite plate 90xz forms the plate back surface 96B of the second graphite portion 90Bb.

Further, as shown in FIG. 44, the dimension of the first graphite portion 90Ba in the width direction X is greater than the dimension of the second graphite portion 90Bb in the width direction X. In one example, the dimension of the first graphite portion 90Ba in the width direction X is two times or greater than the dimension of the second graphite portion 90Bb in the width direction X. The dimension of the first graphite portion 90Ba in the length direction Y is equal to the dimension of the second graphite portion 90Bb in the length direction Y. The thickness of the first graphite portion 90Ba (dimension of first graphite portion 90Ba in thickness direction Z) is equal to the thickness of the second graphite portion 90Bb (dimension of second graphite portion 90Bb in thickness direction Z).

Here, as long as the difference in the dimension of the first graphite portion 90Ba in the length direction Y and the dimension of the second graphite portion 90Bb in the length direction Y is, for example, within 5% of the dimension of the second graphite portion 90Bb in the length direction Y, this will mean that the dimension of the first graphite portion 90Ba in the length direction Y is equal to the dimension of the second graphite portion 90Bb in the length direction Y. As long as the difference in the dimension of the first graphite portion 90Ba in the thickness direction Z and the dimension of the second graphite portion 90Bb in the thickness direction Z is within, for example, 5% of the dimension of the second graphite portion 90Bb in the thickness direction Z, this will mean that the thickness of the first graphite portion 90Ba is equal to the thickness of the second graphite portion 90Bb.

The dimension of the first graphite portion 90Ba in the width direction X may be changed. The dimension of the first graphite portion 90Ba in the width direction X only needs to allow the second power semiconductor element 30Ba to be spaced apart from the second power semiconductor element 30Bb in the width direction X, and the second diode 40Ba to be spaced apart from the second diode 40Bb in the width direction X.

Further, the thickness of the first graphite portion 90Ba may be changed. In one example, the thickness of the first graphite portion 90Ba may differ from the thickness of the second graphite portion 90Bb. In one example, the thickness of the first graphite portion 90Ba may be greater than the thickness of the second graphite portion 90Bb. More specifically, the thickness of the first graphite portion 90Ba may be greater than the thickness of the second graphite plate 90B in each of the above embodiments.

Further, the position where the first graphite portion 90Ba is arranged in the width direction X may be changed. In one example, the first graphite portion 90Ba may be moved toward the fourth side surface 11d of the first substrate 11.

The dimension of the second graphite portion 90Bb in the width direction X may be changed. In one example, the dimension of the second graphite portion 90Bb in the width direction X may be one-half or greater than the dimension of the first graphite portion 90Ba in the width direction X and less than or equal to the dimension of the first graphite portion 90Ba in the width direction X.

The thickness of the second graphite portion 90Bb may be changed. In one example, the thickness of the second graphite portion 90Bb may differ from the thickness of the first graphite portion 90Ba. Further, the thickness of the second graphite plate 90B in each of the above embodiments may be greater or less.

The first graphite plate 90A may have a configuration (second configuration) that includes the first graphite portion 90Aa, on which the first power semiconductor element 30Aa and the first diode 40Aa are arranged, and the second graphite portion 90Ab, on which the first power semiconductor elements 30Ab 30Ac and the first diodes 40Ab and 40Ac are arranged. Further, the second graphite plate 90B may have a configuration (second configuration) that includes the first graphite portion 90Ba, on which the second power semiconductor element 30Ba and the second diode 40Ba are arranged, and the second graphite portion 90Bb, on which the second power semiconductor elements 30Bb and 30Bc and the second diodes 40 Bb and 40Bc are arranged. The first graphite plate 90C and the second graphite plate 90D of the second substrate 12 may be modified in the same manner as the first configuration or second configuration of the first graphite plate 90A and the first configuration and second configuration of the second graphite plate 90B. The combination of the first configuration or the second configuration may be changed in each of the graphite plates 90A to 90D.

Further, in the first graphite plate 90A, the stacked construction of the graphite plate 90$x$ and the graphite plate 90$xz$ in the first graphite portion 90Aa may differ from the stacked construction of the graphite plate 90$x$ and the graphite plate 90$xz$ in the second graphite portion 90Ab. In the second graphite plate 90B, the stacked construction of the graphite plate 90$x$ and the graphite plate 90$xz$ in the first graphite portion 90Ba may differ from the stacked construction of the graphite plate 90$x$ and the graphite plate 90$xz$ in the second graphite portion 90Bb.

In the first embodiment, the first diodes 40A may be arranged outside the first graphite plates 90A and 90C. In one example, the first diodes 40A are arranged on the main mounting portion 13$a$ of the first mounting layer 13A of the first substrate 11. Further, the first diodes 40A are arranged on the main mounting portion 13$c$ of the first mounting layer 13C of the second substrate 12.

In the first embodiment, the second diodes 40B may be arranged outside the second graphite plates 90B and 90D. In one example, the second diodes 40B may be arranged on the second mounting layer 13B of the first substrate 11. Further, the second diodes 40B are arranged on the main mounting portion 13$e$ of the second mounting layer 13D of the second substrate 12.

In the second embodiment, the dimension of each of the graphite plates 90A to 90D in the length direction Y may be changed. In one example, the dimension of each of the graphite plates 90A to 90D in the length direction Y may be less than the dimension of each of the graphite plates 90A to 90D of the first embodiment in the length direction Y.

In the first embodiment, the first substrate 11 or the second substrate 12 may be omitted from the substrate 10. When the second substrate 12 is omitted, the first mounting layer 13C, the second mounting layer 13D, the conductive layer 14B, the first control layer 15C, the first detection layer 16C, the graphite plates 90C and 90D, the power semiconductor elements 30Ad to 30Af and 30Bd to 30Bf, and the diodes 40Ad to 40Af and 40Bd to 40Bf are mainly omitted. When the first substrate 11 is omitted, the first mounting layer 13A, the second mounting layer 13B, the conductive layer 14A, the first control layer 15A, the first detection layer 16A, the graphite plates 90A and 90B, the power semiconductor elements 30Aa to 30Ad and 30Ba to 30Bd, and the diodes 40Aa to 40Ad and 40Ba to 40Bd are mainly omitted.

In the second embodiment, the first substrate 11 or the second substrate 12 may be omitted from the substrates 10. When the second substrate 12 is omitted, the first mounting layer 13C, the second mounting layer 13D, the conductive layer 14B, the first control layer 15C, the first detection layer 16C, the graphite plates 90C and 90D, and the power semiconductor elements 30Ad to 30Af and 30Bd to 30Bf are mainly omitted. When the first substrate 11 is omitted, the first mounting layer 13A, the second mounting layer 13B, the conductive layer 14A, the first control layer 15A, the first detection layer 16A, the graphite plates 90A and 90B, and the power semiconductor elements 30Aa to 30Ad and 30Ba to 30Bd are mainly omitted.

In each of the above embodiments, the power current terminal 55 may be omitted. In this case, the power current detection connecting member 24 is omitted.

In each of the above embodiments, the thermistor 18 may be omitted. In addition, the thermistor mounting layer 17, the two temperature terminals 56, and the two thermistor connecting members 27 may be omitted.

In each of the above embodiments, the configuration of each of the graphite plates 90A to 90D may be changed. In one example, at least either one of the main surface conductive layer 97A to 97D and the back surface conductive layers 98A to 98D may be omitted from each of the graphite plates 90A to 90D.

Further, in each of the graphite plates 90A to 90D, the graphite plate 90$xy$ having the XZ orientation and the graphite plate 90$xz$ having the XZ orientation may be stacked in any order.

In a first example, the first graphite plate 90A has a configuration in which the graphite plate 90$xz$ is formed on the graphite plate 90$xy$, and the remaining graphite plates 90B to 90D each have a configuration in which the graphite plate 90$xy$ is formed on the graphite plate 90$xz$.

In a second example, each of the first graphite plates 90A and 90C has a configuration in which the graphite plate 90$xz$ is formed on the graphite plate 90$xy$, and each of the second graphite plates 90B and 90D has a configuration in which the graphite plate 90$xy$ is formed on the graphite plate 90$xz$.

In a third example, each of the first graphite plate 90A and the second graphite plate 90B has a configuration in which the graphite plate 90$xz$ is formed on the graphite plate 90$xy$, and each of the first graphite plate 90C and the second graphite plate 90D has a configuration in which the graphite plate 90$xy$ is formed on the graphite plate 90$xz$.

In a fourth example, each of the first graphite plates 90A and 90C and the second graphite plate 90B has a configuration in which the graphite plate 90$xz$ is formed on the graphite plate 90$xy$, and the second graphite plate 90D has a configuration in which the graphite plate 90$xy$ is formed on the graphite plate 90$xz$.

In a fifth example, each of the graphite plates 90A to 90D has a configuration in which the graphite plate 90$xz$ is formed on the graphite plate 90$xy$.

In a sixth example, the second graphite plate 90B has a configuration in which the graphite plate 90$xz$ is formed on the graphite plate 90$xy$, and each of the remaining graphite plates 90A to 90C and 90D has a configuration in which the graphite plate 90$xy$ is formed on the graphite plate 90$xz$.

In a seventh example, each of the second graphite plate 90B and the first graphite plate 90C has a configuration in which the graphite plate 90$xz$ is formed on the graphite plate 90$xy$, and each of the first graphite plate 90A and the second graphite plate 90B has a configuration in which the graphite plate 90$xy$ is formed on the graphite plate 90$xz$.

In an eighth example, each of the second graphite plates 90B and 90D has a configuration in which the graphite plate 90$xz$ is formed on the graphite plate 90$xy$, and each of the first graphite plates 90A and 90C has a configuration in which the graphite plate 90$xy$ is formed on the graphite plate 90$xz$.

In a ninth example, each of the second graphite plates 90B and 90D and the first graphite plate 90C has a configuration in which the graphite plate 90xz is formed on the graphite plate 90xy, and the first graphite plate 90A has a configuration in which the graphite plate 90xy is formed on the graphite plate 90xz.

In a tenth example, the first graphite plate 90C has a configuration in which the graphite plate 90xz is formed on the graphite plate 90xy, and each of the remaining graphite plates 90A, 90B, and 90D has a configuration in which the graphite plate 90xy is formed on the graphite plate 90xz.

In an eleventh example, each of the first graphite plate 90C and the second graphite plate 90D has a configuration in which the graphite plate 90xz is formed on the graphite plate 90xy, and each of the first graphite plate 90A and the second graphite plate 90B has a configuration in which the graphite plate 90xy is formed on the graphite plate 90xz.

In a twelfth example, the second graphite plate 90D has a configuration in which the graphite plate 90xz is formed on the graphite plate 90xy, and each of the remaining graphite plates 90A to 90C has a configuration in which the graphite plate 90xy is formed on the graphite plate 90xz.

In a thirteenth example, each of the graphite plates 90A to 90D has a configuration in which the graphite plate 90xy is formed on the graphite plate 90xz.

In each of the above embodiments, each of the first graphite plates 90A and 90C may have the configuration of a second thermal conductor of which the thermal conductivity in the planar direction of the first plate main surfaces 95A and 95C is higher in a predetermined first direction than a second direction intersecting the first direction in plan view. One example of the first direction is the length direction Y, and one example of the second direction is the width direction X. One example of a second thermal conductor is a graphite plate 90yz (not shown) having a YZ orientation. The graphite plate 90yz has a thermal conductivity of, for example, X=5 (W/mK), Y=1500 (W/mK), and Z=1500 (W/mK).

Preferably, when the first graphite plates 90A and 90C are each formed by the graphite plate 90yz, the first power semiconductor elements 30A are spaced apart in the second direction. In this manner, by spacing apart the first power semiconductor elements 30A in the direction in which the thermal conductivity is low, heat interference is hindered between adjacent ones of the first power semiconductor elements 30A.

When the first direction is the length direction Y and the second direction is the width direction X, the first graphite plate 90A is spaced apart from the first control layer 15A in the first direction, and the first graphite plate 90C is spaced apart from the first control layer 15C in the first direction. The first power semiconductor elements 30A arranged on the first plate main surface 95A of the first graphite plate 90A are located in a portion of the first plate main surface 95A located toward the first control layer 15A from the first diodes 40A. The first power semiconductor elements 30A on the first plate main surface 95C of the first graphite plate 90C are arranged in a portion of the first plate main surface 95C located toward the first control layer 15C from the first diodes 40A.

The second thermal conductor may be arranged on the first graphite plates 90A and 90C toward the corresponding first plate main surfaces 95A and 95C or toward the corresponding first plate back surfaces 96A and 96C.

The shape of each of the first graphite plates 90A and 90C in plan view is rectangular so that the second direction is the long-side direction and the first direction is the short-side direction. Preferably, in this case, the first power semiconductor elements 30A are spaced apart in the second direction. This allows the distance to be increased between adjacent ones of the first power semiconductor elements 30A in the second direction. Thus, heat interference is further hindered between adjacent ones of the first power semiconductor elements 30A in the second direction.

In each of the above embodiments, each of the first graphite plates 90A and 90C may be formed by arranging the second thermal conductor, of which the thermal conductivity in the predetermined first direction of the planar direction of the first plate main surfaces 95A and 95C is greater than the thermal conductivity in the second direction that intersects the first direction in plan view, on the graphite plate 90xy (first thermal conductor) in the thickness direction Z. In this case, the first graphite plates 90A and 90C are formed by arranging the second thermal conductor toward the first plate main surfaces 95A and 95C of the first graphite plates 90A and 90C, and arranging the graphite plate 90xy (first thermal conductor) toward the first plate back surfaces 96A and 96C of the first graphite plates 90A and 90C. The first graphite plate 90A and 90C may be formed by arranging the second thermal conductor toward the first plate back surfaces 96A and 96C of the first graphite plates 90A and 90C, and arranging the graphite plate 90xy (first thermal conductor) toward the first plate main surfaces 95A and 95C of the first graphite plates 90A and 90C.

In each of the above embodiments, each of the second graphite plates 90B and 90D may have the configuration of a second thermal conductor of which the thermal conductivity in the planar direction of the second plate main surfaces 95B and 95D is higher in a predetermined first direction than a second direction intersecting the first direction in plan view. One example of the first direction is the length direction Y, and one example of the second direction is the width direction X. One example of a second thermal conductor is a graphite plate 90yz (not shown) having a YZ orientation. The graphite plate 90yz has a thermal conductivity of, for example, X=5 (W/mK), Y=1500 (W/mK), and Z=1500 (W/mK).

Preferably, when the second graphite plates 90B and 90D are each formed by the graphite plate 90yz, the second power semiconductor elements 30B are spaced apart in the second direction. In this manner, by spacing apart the second power semiconductor elements 30B in the direction in which the thermal conductivity is low, heat interference is hindered between adjacent ones of the second power semiconductor elements 30B.

When the first direction is the length direction Y and the second direction is the width direction X, the second graphite plate 90B is spaced apart from the second control layer 15B in the first direction, and the second graphite plate 90D and the second control layer 15D are spaced apart in the first direction. The second power semiconductor elements 30B on the second plate main surface 95B of the second graphite plate 90B are arranged in a portion of the second plate main surface 95B located toward the second control layer 15B in the second diodes 40B. The second power semiconductor elements 30B on the second plate main surface 95D of the second graphite plate 90D are arranged in a portion of the second plate main surface 95D located toward the second control layer 15D from the second diodes 40B.

The second thermal conductor may be arranged on the second graphite plates 90B and 90D toward the corresponding second plate main surfaces 95B and 95D or toward the corresponding second plate back surfaces 96B and 96D.

The shape of each of the second graphite plates 90B and 90D in plan view is rectangular so that the second direction is the long-side direction and the first direction is the short-side direction. Preferably, in this case, the second power semiconductor elements 30B are spaced apart in the second direction. This allows the distance to be increased between adjacent ones of the second power semiconductor elements 30B in the second direction. Thus, heat interference is further hindered between adjacent ones of the second power semiconductor elements 30B in the second direction.

In each of the above embodiments, each of the second graphite plates 90B and 90D may be formed by arranging the second thermal conductor, of which the thermal conductivity in the predetermined first direction of the planar direction of the second plate main surfaces 95B and 95D is greater than the thermal conductivity in the second direction that intersects the first direction in plan view, on the graphite plate 90xy (first thermal conductor) in the thickness direction Z. In this case, the second graphite plates 90B and 90D are formed by arranging the second thermal conductor toward the second plate main surfaces 95B and 95D of the second graphite plates 90B and 90D, and arranging the graphite plate 90xy (first thermal conductor) toward the second plate back surfaces 96B and 96D of the second graphite plates 90B and 90D. The second graphite plates 90B and 90D are formed by arranging the second thermal conductor toward the second plate back surfaces 96B and 96D of the second graphite plates 90B and 90D, and arranging the graphite plate 90xy (first thermal conductor) toward the second plate main surfaces 95B and 95D of the second graphite plates 90B and 90D.

In each of the above embodiments, each of the graphite plates 90A to 90D does not need to have the stacked construction of the graphite plate 90xy and the graphite plate 90xz. At least one of the first graphite plates 90A and 90C and the second graphite plates 90B and 90D may be formed by one of the graphite plate 90xy, the graphite plate 90xz, and the graphite plate 90yz.

When the first graphite plates 90A and 90C are formed by the graphite plates 90xz, the first power semiconductor elements 30A are spaced apart in the direction in which the thermal conductivity is low in the graphite plate 90xz, that is, in the length direction Y of the graphite plate 90xz. In the first embodiment, the first diodes 40A are spaced apart from the first power semiconductor elements 30A in the direction in which the thermal conductivity is high in the graphite plate 90xz, that is, in the width direction X of the graphite plate 90xz. Further, the first diodes 40A are spaced apart in the length direction Y of the graphite plate 90xz.

In this manner, the width direction X and the length direction Y of the power module 1A differs from the width direction X and the length direction Y of the graphite plate 90xz. More specifically, the first graphite plates 90A and 90C are arranged so that the width direction X of the power module 1A corresponds to the length direction Y of the graphite plate 90xz, and the length direction Y of the power module 1A corresponds to the width direction X of the graphite plate 90xz.

Thus, when the first power semiconductor elements 30A are spaced apart in the width direction X of the power module 1A, the first power semiconductor elements 30A are spaced apart in the length direction Y of the graphite plate 90xz. Further, when the first diodes 40A are spaced apart from the first power semiconductor elements 30A in the length direction Y of the power module 1A, the first diodes 40A are spaced apart from the first power semiconductor elements 30A in the width direction X of the graphite plate 90xz.

When the second graphite plates 90B and 90D are formed by the graphite plate 90xz, the second power semiconductor elements 30B are spaced apart in the direction in which the thermal conductivity is low in the graphite plate 90xz, that is, the length direction Y of the graphite plate 90xz. In the first embodiment, the second diodes 40B are spaced apart from the second power semiconductor elements 30B in the direction in which the thermal conductivity is high in the graphite plate 90xz, that is, in the width direction X of the graphite plate 90xz. Further, the second diodes 40B are spaced apart in the length direction Y of the graphite plate 90xz.

In this manner, the width direction X and the length direction Y of the power module 1A differs from the width direction X and the length direction Y of the graphite plate 90xz. More specifically, the second graphite plates 90B and 90D are arranged so that the width direction X of the power module 1A corresponds to the length direction Y of the graphite plate 90xz, and the length direction Y of the power module 1A corresponds to the width direction X of the graphite plate 90xz.

Thus, when the second power semiconductor elements 30B are spaced apart in the width direction X of the power module 1A, the second power semiconductor elements 30B are spaced apart in the length direction Y of the graphite plate 90xz. Further, when the second diodes 40B are spaced apart from the second power semiconductor elements 30B in the length direction Y of the power module 1A, the second diodes 40B are spaced apart from the second power semiconductor elements 30B in the width direction X of the graphite plate 90xz.

When the first graphite plates 90A and 90C are formed by the graphite plate 90yz, the first power semiconductor elements 30A are arranged in the direction in which the thermal conductivity is low in the graphite plate 90yz, that is, in the width direction X of the graphite plate 90yz. In the first embodiment, the first diodes 40A are spaced apart from the first power semiconductor elements 30A in the direction in which the thermal conductivity is high in the graphite plate 90yz, that is, in the length direction Y of the graphite plate 90yz. Further, the first diodes 40A are spaced apart in the width direction X of the graphite plate 90yz.

In this manner, the width direction X and the length direction Y of the power module 1A corresponds to the width direction X and the length direction Y of the graphite plate 90xz. More specifically, the first graphite plates 90A and 90C are arranged so that the width direction X of the power module 1A corresponds to the width direction X of the graphite plate 90xz, and the length direction Y of the power module 1A corresponds to the length direction Y of the graphite plate 90xz.

When the second graphite plates 90B and 90D are formed by the graphite plate 90yz, the second power semiconductor elements 30B are arranged in the direction in which the thermal conductivity is low in the graphite plate 90yz, that is, in the width direction X of the graphite plate 90yz. In the first embodiment, the second diodes 40B are spaced apart from the second power semiconductor elements 30B in the direction in which the thermal conductivity is high in the graphite plate 90yz, that is, in the length direction Y of the graphite plate 90yz. Further, the second diodes 40B are spaced apart in the width direction X of the graphite plate 90yz.

In this manner, the width direction X and the length direction Y of the power module 1A differs from the width direction X and the length direction Y of the graphite plate 90xz. More specifically, the second graphite plates 90B and 90D are arranged so that the width direction X of the power module 1A corresponds to the length direction Y of the graphite plate 90xz, and the length direction Y of the power module 1A corresponds to the width direction X of the graphite plate 90xz.

In each of the above embodiments, the second power semiconductor elements 30B may be omitted. In this case, the second mounting layers 13B and 13D are omitted, and the source electrodes 32 of the first power semiconductor elements 30A are connected by the first element connecting members 21A to the conductive layers 14A and 14B. In this manner, the power modules 1A and 1B may each be formed as a single switching element instead of an inverter.

In each of the above embodiments, at least one of the coupling members 100A to 100C may be formed by one or more wires. The coupling member 100A may have any form as long as it electrically connects the first mounting layer 13A and the first mounting layer 13C. The coupling member 100B may have any form as long as it electrically connects the second mounting layer 13B and the second mounting layer 13D. The coupling member 100C may have any form as long as it electrically connects the conductive layer 14A and the conductive layer 14B.

In each of the above embodiments, the power module may include a single substrate, a mounting layer and conductive layer arranged on a substrate main surface of the substrate, a graphite plate mounted on the mounting layer, and semiconductor elements arranged on a plate main surface of the graphite plate.

Clauses

Technical concepts obtained from the above embodiments and the modified examples will now be described.

Clause 1
  A power module including:
  a substrate that is electrically insulative and includes a substrate main surface and a substrate back surface at opposite sides in a thickness direction;
  a mounting layer that is conductive and arranged on the substrate main surface;
  a graphite plate having anisotropic thermal conductivity and including a plate main surface and a plate back surface at opposite sides in the thickness direction, where the plate back surface is connected to the mounting layer; and a power semiconductor element arranged on the plate main surface.

Clause 2
  The power module according to clause 1, where the graphite plate includes a first thermal conductor of which thermal conductivity is higher in a planar direction that is orthogonal to the thickness direction than in the thickness direction.

Clause 3
  The power module according to clause 2, where the first thermal conductor is arranged toward the plate main surface in the thickness direction.

Clause 4
  The power module according to clause 2, where the first thermal conductor is arranged toward the plate back surface in the thickness direction.

Clause 5
  The power module according to any one of clauses 2 to 4, where the power semiconductor element is one of a plurality of power semiconductor elements, the power module further including:
  the power semiconductor elements,
  where the power semiconductor elements are spaced apart from each other in the planar direction of the plate main surface.

Clause 6
  The power module according to clause 5, where:
  the plate main surface is shaped to extend in a long-side direction and a short-side direction as viewed in the thickness direction; and
  the power semiconductor elements are spaced apart from each other in the long-side direction.

Clause 7
  The power module according to any one of clauses 1 to 6, where the power semiconductor element is a transistor, the power module further including:
  a diode connected in antiparallel to the power semiconductor element.

Clause 8
  The power module according to any one of clauses 2 to 6, where the power semiconductor element is one of a plurality of power semiconductor elements, the power module further including:
  the power semiconductor elements and diodes, each connected in antiparallel to one of the power semiconductor elements, where
  each of the power semiconductor elements is a transistor,
  the power semiconductor elements are spaced apart from each other in the planar direction of the plate main surface, and
  the diodes are spaced apart from the power semiconductor elements in a direction orthogonal to an arrayed direction of the power semiconductor elements in the planar direction as viewed in the thickness direction and spaced apart from each other in the arrayed direction.

Clause 9
  The power module according to clause 8, where:
  the plate main surface is shaped to extend in a long-side direction and a short-side direction as viewed in the thickness direction;
  the power semiconductor elements are spaced apart in the long-side direction; and
  the diodes are spaced apart from the power semiconductor elements in the short-side direction and spaced apart from each other in the long-side direction.

Clause 10
  The power module according to any one of clauses 7 to 9, where:
  the plate main surface is shaped to extend in a long-side direction and a short-side direction as viewed in the thickness direction;
  a control layer is arranged on the substrate main surface and electrically connected to a control electrode of the power semiconductor element;
  the control layer and the graphite plate are spaced apart in a direction parallel to the short-side direction of the plate main surface as viewed in the thickness direction; and
  the power semiconductor element is located toward the control layer from the diode as viewed in the thickness direction.

Clause 11
  The power module according to any one of clauses 7 to 10, where:
  the diode includes a main surface and a back surface at opposite sides in the thickness direction, an anode electrode formed on the main surface, and a cathode electrode formed on the back surface; and
  the cathode electrode is electrically connected via the graphite plate to the mounting layer.

Clause 12

The power module according to clause 1, where in a planar direction of the plate main surface, the graphite plate includes a second thermal conductor of which thermal conductivity is higher in a predetermined first direction than in a second direction that is orthogonal to the first direction.

Clause 13

The power module according to clause 12, where the thermal conductivity in the second direction is lower than thermal conductivity in the thickness direction.

Clause 14

The power module according to clause 12 or 13, where the second thermal conductor is arranged toward the plate main surface in the thickness direction.

Clause 15

The power module according to clause 12 or 13, where the second thermal conductor is arranged toward the plate main surface in the thickness direction.

Clause 16

The power module according to any one of clauses 12 to 15, where the power semiconductor element is one of a plurality of power semiconductor elements, the power module further including:
  the power semiconductor elements,
  where the power semiconductor elements are spaced apart from each other in the second direction of the plate main surface.

Clause 17

The power module according to clause 16, where the plate main surface is shaped so that the second direction is a long-side direction and the first direction is a short-side direction as viewed in the thickness direction.

Clause 18

The power module according to any one of clauses 12 to 17, where the power semiconductor element is a transistor, the power module further including:
  a diode connected in antiparallel to the power semiconductor element.

Clause 19

The power module according to any one of clauses 12 to 18, where the power semiconductor element is one of a plurality of power semiconductor elements, the power module further including:
  the power semiconductor elements and diodes, each connected in antiparallel to one of the power semiconductor elements, where
  each of the power semiconductor elements is a transistor,
  the power semiconductor elements are spaced apart from each other in the second direction of the plate main surface, and
  the diodes are spaced apart from the power semiconductor elements in the first direction and spaced apart from each other in the second direction as viewed in the thickness direction.

Clause 20

The power module according to clause 18 or 19, where:
  the plate main surface is shaped so that the second direction is a long-side direction and the first direction is a short-side direction as viewed in the thickness direction;
  a control layer is arranged on the substrate main surface and electrically connected to a control electrode of the power semiconductor element;
  the control layer and the graphite plate are spaced apart in the first direction of the plate main surface as viewed in the thickness direction; and
  the power semiconductor element is located toward the control layer from the diode as viewed in the thickness direction.

Clause 21

The power module according to any one of clauses 18 to 20, where:
  the diode includes a main surface and a back surface at opposite sides in the thickness direction, an anode electrode formed on the main surface, and a cathode electrode formed on the back surface; and
  the cathode electrode is electrically connected via the graphite plate to the mounting layer.

Clause 22

The power module according to any one of clauses 1 to 21, where:
  the power semiconductor element includes an element main surface and an element back surface at opposite sides in the thickness direction, a main surface drive electrode formed on the element main surface, and a back surface drive electrode formed on the element back surface; and
  the back surface drive electrode is electrically connected via the graphite plate to the mounting layer.

Clause 23

The power module according to any one of clauses 1 to 22, where the graphite plate is a structure in which a first thermal conductor, of which thermal conductivity is higher in a planar direction that is orthogonal to the thickness direction than in the thickness direction, is formed on a second thermal conductor, of which thermal conductivity in a planar direction of the plate main surface is higher in a predetermined first direction than in a second direction that intersects the first direction, in the thickness direction.

Clause 24

The power module according to clause 23, where:
  the first thermal conductor is arranged toward the plate main surface; and
  the second thermal conductor is arranged toward the plate back surface.

Clause 25

The power module according to clause 23, where:
  the second thermal conductor is arranged toward the plate main surface; and
  the first thermal conductor is arranged toward the plate back surface.

Clause 26

The power module according to any one of clauses 1 to 25, where the graphite plate is thicker than the substrate.

Clause 27

The power module according to any one of clauses 1 to 26, where the substrate is formed from alumina.

Clause 28

The power module according to any one of clauses 1 to 27, where a cooler is arranged on the substrate back surface.

Clause 29

A power module including:
  a substrate that is electrically insulative and includes a substrate main surface and a substrate back surface at opposite sides in a thickness direction;
  a first mounting layer, a second mounting layer, and a conductive layer arranged on the substrate main surface in a direction orthogonal to the thickness direction;
  a first graphite plate having anisotropic thermal conductivity and including a first plate main surface and a first plate back surface at opposite sides in the thickness direction, where the first plate back surface is formed on the first mounting layer;

a second graphite plate having anisotropic thermal conductivity and including a second plate main surface and a second plate back surface at opposite sides in the thickness direction, where the second plate back surface is formed on the second mounting layer;

a first power semiconductor element arranged on the first plate main surface; and a second power semiconductor element arranged on the second plate main surface.

Clause 30

The power module according to clause 29, where the first graphite plate and the second graphite plate each include a first thermal conductor of which thermal conductivity is higher in a planar direction that is orthogonal to the thickness direction than in the thickness direction.

Clause 31

The power module according to clause 30, where:
the first thermal conductor of the first graphite plate is arranged toward the first plate main surface of the first graphite plate in the thickness direction; and
the first thermal conductor of the second graphite plate is arranged toward the second plate main surface of the second graphite plate in the thickness direction.

Clause 32

The power module according to clause 30, where:
the first thermal conductor of the first graphite plate is arranged toward the first plate back surface of the first graphite plate in the thickness direction; and
the first thermal conductor of the second graphite plate is arranged toward the second plate back surface of the second graphite plate in the thickness direction.

Clause 33

The power module according to any one of clauses 30 to 32, where the first power semiconductor element is one of a plurality of first power semiconductor elements, and the second power semiconductor element is one of a plurality of second power semiconductor elements, the power module further including:
the first power semiconductor elements and the second power semiconductor elements, where
the first power semiconductor elements are spaced apart from each other on the first plate main surface in a planar direction of the first plate main surface, and
the second power semiconductor elements are spaced apart from each other on the second plate main surface in a planar direction of the second plate main surface.

Clause 34

The power module according to clause 33, where:
the first plate main surface is shaped to extend in a long-side direction and a short-side direction as viewed in the thickness direction; and
the first power semiconductor elements are spaced apart from each other in the long-side direction.

Clause 35

The power module according to clause 34, where each of the power semiconductor elements is a transistor, the power module further including:
first diodes, each connected in antiparallel to one of the power semiconductor elements.

Clause 36

The power module according to any one of clauses 30 to 34, where the first power semiconductor element is one of a plurality of first power semiconductor elements, and the second power semiconductor element is one of a plurality of second power semiconductor elements, the power module including:

the first power semiconductor elements and first diodes, each connected in antiparallel to one of the power semiconductor elements, where
each of the first power semiconductor elements is a transistor,
the first power semiconductor elements are spaced apart from each other in a planar direction of the first plate main surface, and
the first diodes are spaced apart from the first power semiconductor elements in a direction orthogonal to an arrayed direction of the first power semiconductor elements in the planar direction of the first plate main surface as viewed in the thickness direction and spaced apart from each other in the arrayed direction.

Clause 37

The power module according to clause 36, where:
the first plate main surface is shaped to extend in a long-side direction and a short-side direction as viewed in the thickness direction;
the first power semiconductor elements are spaced apart from each other in the long-side direction; and
the first diodes are spaced apart from the first power semiconductor elements in the short-side direction and spaced apart from each other in the long-side direction.

Clause 38

The power module according to any one of clauses 35 to 37, where:
the first plate main surface is shaped to extend in a long-side direction and a short-side direction as viewed in the thickness direction;
a first control layer is arranged on the substrate main surface and electrically connected to a control electrode of the first power semiconductor element;
the first control layer and the first graphite plate are spaced apart in a direction parallel to the short-side direction of the first plate main surface as viewed in the thickness direction; and
the first power semiconductor element is located toward the first control layer from the first diodes as viewed in the thickness direction.

Clause 39

The power module according to clause 38, where the first control layer is arranged on the first mounting layer at a side opposite to the second mounting layer.

Clause 40

The power module according to any one of clauses 35 to 39, where:
each of the first diodes includes a main surface and a back surface at opposite sides in the thickness direction, an anode electrode formed on the main surface, and a cathode electrode formed on the back surface;
the cathode electrode of each of the first diodes is electrically connected via the first graphite plate to the first mounting layer; and
the anode electrode of each of the first diodes is connected by a first connecting member to the second mounting layer.

Clause 41

The power module according to any one of clauses 29 to 40, where the second power semiconductor element is one of a plurality of second power semiconductor elements, the power module further including:
the second power semiconductor elements, where
the second plate main surface is shaped to extend in a long-side direction and a short-side direction as viewed in the thickness direction, the second power semiconductor elements are spaced apart in the long-side direction of the second plate main surface.

Clause 42

The power module according to any one of clauses 29 to 41, where each of the power semiconductor elements is a transistor, the power module further including:
a second diode connected in antiparallel to the second power semiconductor element.

Clause 43

The power module according to clause 42, where the second power semiconductor element is one of a plurality of second power semiconductor elements, and the second diode is one of a plurality of second diodes, the power module including:
the second power semiconductor elements and the second diodes, each connected in antiparallel to one of the second power semiconductor elements, where
the second power semiconductor elements are spaced apart from each other in a planar direction of the second plate main surface, and
the second diodes are spaced apart from the second power semiconductor elements in a direction orthogonal to an arrayed direction of the second power semiconductor elements in the planar direction of the second plate main surface as viewed in the thickness direction and spaced apart from each other in the arrayed direction.

Clause 44

The power module according to clause 43, where:
the second plate main surface is shaped to extend in a long-side direction and a short-side direction as viewed in the thickness direction;
the second power semiconductor elements are spaced apart in the long-side direction of the second plate main surface; and
the second diodes are spaced apart from the second power semiconductor elements in the short-side direction.

Clause 45

The power module according to clause 43 or 44, where:
the second plate main surface is shaped to extend in a long-side direction and a short-side direction as viewed in the thickness direction;
a second control layer is arranged on the substrate main surface and electrically connected to a control electrode of the second power semiconductor elements;
the second control layer and the second graphite plate are spaced apart in a direction parallel to the short-side direction of the second plate main surface as viewed in the thickness direction; and
the second power semiconductor elements is located toward the second control layer from the second diodes as viewed in the thickness direction.

Clause 46

The power module according to clause 45, where the second control layer is arranged on the conductive layer at a side opposite to the second mounting layer.

Clause 47

The power module according to any one of clauses 29 to 46, where each of the first graphite plate and the second graphite plate is a structure in which a first thermal conductor, of which thermal conductivity is higher in a planar direction that is orthogonal to the thickness direction than in the thickness direction, is formed on a second thermal conductor, of which thermal conductivity in the planar direction is higher in a predetermined first direction than in a second direction that intersects the first direction, in the thickness direction.

Clause 48

The power module according to clause 47, where:
the first thermal conductor of the first graphite plate is arranged toward the first plate main surface of the first graphite plate in the thickness direction;
the first thermal conductor of the second graphite plate is arranged toward the second plate main surface of the second graphite plate in the thickness direction;
the second thermal conductor of the first graphite plate is arranged toward the first plate back surface of the first graphite plate in the thickness direction; and
the second thermal conductor of the second graphite plate is arranged toward the second plate back surface of the second graphite plate in the thickness direction.

Clause 49

The power module according to clause 47, where:
the first thermal conductor of the first graphite plate is arranged toward the first plate back surface of the first graphite plate in the thickness direction;
the first thermal conductor of the second graphite plate is arranged toward the second plate back surface of the second graphite plate in the thickness direction;
the second thermal conductor of the first graphite plate is arranged toward the first plate back surface of the first graphite plate in the thickness direction; and
the second thermal conductor of the second graphite plate is arranged toward the second plate main surface of the second graphite plate in the thickness direction.

Clause 50

The power module according to clause 29, where the first graphite plate and the second graphite plate each include a second thermal conductor of which thermal conductivity in a planar direction that is orthogonal to the thickness direction is higher in a predetermined first direction than in a second direction that intersects the first direction.

Clause 51

The power module according to clause 50, where the thermal conductivity in the second direction is lower than thermal conductivity in the thickness direction.

Clause 52

The power module according to clause 50 or 51, where:
the second thermal conductor of the first graphite plate is arranged toward the first plate main surface of the first graphite plate in the thickness direction; and
the second thermal conductor of the second graphite plate is arranged toward the second plate main surface of the second graphite plate in the thickness direction.

Clause 53

The power module according to clause 50 or 51, where:
the second thermal conductor of the first graphite plate is arranged toward the first plate main surface of the first graphite plate in the thickness direction; and
the second thermal conductor of the second graphite plate is arranged toward the second plate back surface of the second graphite plate in the thickness direction.

Clause 54

The power module according to any one of clauses 50 to 53, where the first power semiconductor element is one of a plurality of first power semiconductor elements, the power module including:
the first power semiconductor elements,
where the first power semiconductor elements are spaced apart from each other in the second direction of the first plate main surface.

Clause 55

The power module according to clause 54, where the first plate main surface is shaped so that the second direction is a long-side direction and the first direction is a short-side direction as viewed in the thickness direction.

Clause 56

The power module according to any one of clauses 50 to 55, where the first power semiconductor element is a transistor, the power module further including:
a first diode connected in antiparallel to the first power semiconductor element.

Clause 57

The power module according to any one of clauses 50 to 56, where the first power semiconductor element is one of a plurality of first power semiconductor elements, the power module including:
the first power semiconductor elements and first diodes, each connected in antiparallel to one of the power semiconductor elements, where
each of the first power semiconductor elements is a transistor,
the first power semiconductor elements are spaced apart from each other in the second direction of the first plate main surface, and
the first diodes are spaced apart from the first power semiconductor elements in the first direction and spaced apart from each other in the second direction as viewed in the thickness direction.

Clause 58

The power module according to clause 56 or 57, where:
the first plate main surface is shaped so that the second direction is a long-side direction and the first direction is a short-side direction as viewed in the thickness direction;
a control layer is arranged on the substrate main surface and electrically connected to a control electrode of the first power semiconductor element;
the control layer and the graphite plate are spaced apart in the first direction of the first plate main surface as viewed in the thickness direction; and
the first power semiconductor element is located toward the control layer from the first diodes as viewed in the thickness direction.

Clause 59

The power module according to any one of clauses 50 to 58, where the second power semiconductor element is one of a plurality of second power semiconductor elements, the power module including:
the second power semiconductor elements,
the second power semiconductor elements are spaced apart from each other in the second direction of the second plate main surface.

Clause 60

The power module according to clause 59, where the second plate main surface is shaped so that the second direction is a long-side direction and the first direction is a short-side direction as viewed in the thickness direction.

Clause 61

The power module according to any one of clauses 50 to 60, where the second power semiconductor element is a transistor, the power module further including:
a second diode connected in antiparallel to the second power semiconductor element.

Clause 62

The power module according to any one of clauses 50 to 61, where the second power semiconductor element is one of a plurality of second power semiconductor elements, the power module including:
the second power semiconductor elements and second diodes, each connected in antiparallel to one of the second power semiconductor elements, where
each of the second power semiconductor elements is a transistor,
the second power semiconductor elements are spaced apart from each other in the second direction of the second plate main surface, and
the second diodes are spaced apart from the second power semiconductor elements in the first direction and spaced apart from each other in the second direction as viewed in the thickness direction.

Clause 63

The power module according to clause 61 or 62, where:
the second plate main surface is shaped so that the second direction is a long-side direction and the first direction is a short-side direction as viewed in the thickness direction;
a control layer is arranged on the substrate main surface and electrically connected to a control electrode of the second power semiconductor element;
the control layer and the graphite plate are spaced apart in the first direction of the second plate main surface as viewed in the thickness direction; and
the second power semiconductor element is located toward the control layer from the second diode as viewed in the thickness direction.

Clause 64

The power module according to any one of clauses 29 to 63, where:
the first power semiconductor element includes a first element main surface and a first element back surface at opposite sides in the thickness direction, a first main surface drive electrode formed on the first element main surface, and a first back surface drive electrode formed on the first element back surface;
the first back surface drive electrode is electrically connected via the first graphite plate to the first mounting layer; and
the first main surface drive electrode is electrically connected by a first connecting member to the second mounting layer.

Clause 65

The power module according to any one of clauses 35 to 40 and 56 to 58, where:
the first diode includes a first main surface and a first back surface at opposite sides in the thickness direction, an anode electrode formed on the first main surface, and a cathode electrode formed on the first back surface; and
the cathode electrode is electrically connected via the graphite plate to the mounting layer.

Clause 66

The power module according to any one of clauses 29 to 65, where:
the second power semiconductor element includes a second element main surface and a second element back surface at opposite sides in the thickness direction, a second main surface drive electrode formed on the second element main surface, and a second back surface drive electrode formed on the second element back surface;
the second back surface drive electrode is electrically connected via the second graphite plate to the second mounting layer; and
the second main surface drive electrode is electrically connected by a second connecting member to the conductive layer.

Clause 67

The power module according to any one of clauses 42 to 46 and 61 to 63, where:
the second diode includes a second main surface and a second back surface at opposite sides in the thickness direction, an anode electrode formed on the second main surface, and a cathode electrode formed on the second back surface; and
the cathode electrode of the second diode is electrically connected via the second graphite plate to the second mounting layer; and
the anode electrode of each of the second diode is connected by a second connecting member to the conductive layer.

Clause 68

The power module according to any one of clauses 29 to 67, where the second graphite plate is arranged on the second mounting layer toward the conductive layer.

Clause 69

The power module according to any one of clauses 29 to 68, where:
the substrate includes a first substrate and a second substrate spaced apart from each other in an orthogonal direction that is orthogonal to both of the thickness direction and an arrayed direction in which the first mounting layer, the second mounting layer, and the conductive layer are arrayed;
the substrate main surface of each of the first substrate and the second substrate includes the first mounting layer, the second mounting layer, and the conductive layer;
the first mounting layer of each of the first substrate and the second substrate is formed on the first graphite plate; and
the second mounting layer of each of the first substrate and the second substrate is formed on the second graphite plate.

Clause 70

The power module according to clause 69, where:
the first mounting layer of the first substrate and the first mounting layer of the second substrate are aligned with a gap in between in an arrayed direction of the first substrate and the second substrate;
the second mounting layer of the first substrate and the second mounting layer of the second substrate are spaced apart in the arrayed direction;
the conductive layer of the first substrate and the conductive layer of the second substrate are spaced apart in the arrayed direction;
the first mounting layer of the first substrate and the first mounting layer of the second substrate are electrically connected by a first coupling member;
the second mounting layer of the first substrate and the second mounting layer of the second substrate are electrically connected by a second coupling member; and
the conductive layer of the first substrate and the conductive layer of the second substrate are electrically connected by a third coupling member.

Clause 71

The power module according to clause 69 or 70, where:
the substrate main surface of each of the first substrate and the second substrate includes a first control layer and a second control layer;
the first control layer of the first substrate and the first control layer of the second substrate are spaced apart in the arrayed direction;
the second control layer of the first substrate and the second control layer of the second substrate are spaced apart in the arrayed direction;
the first control layer of the first substrate and the first control layer of the second substrate are connected by a first control layer connecting member; and
the second control layer of the first substrate and the second control layer of the second substrate are connected by a second control layer connecting member.

Clause 72

The power module according to any one of clauses 69 to 71, further including:
a first input terminal, a second input terminal, and an output terminal, where
the first input terminal is connected to the first mounting layer of the first substrate,
the second input terminal is connected to the second mounting layer of the first substrate, and
the output terminal is connected to the second mounting layer of the second substrate.

Clause 73

The power module according to any one of clauses 69 to 72, where the first substrate and the second substrate are each formed from alumina.

Clause 74

The power module according to any one of clauses 69 to 73, where a cooler is arranged over the substrate back surface of the first substrate and the substrate back surface of the second substrate.

The invention claimed is:

1. A power module comprising:
a substrate that is electrically insulative and includes a substrate main surface and a substrate back surface at opposite sides in a thickness direction;
a mounting layer that is conductive and arranged on the substrate main surface;
a graphite plate having anisotropic thermal conductivity and including a plate main surface and a plate back surface at opposite sides in the thickness direction, wherein the plate back surface is connected to the mounting layer;
a power semiconductor element arranged on the plate main surface, the power semiconductor element being a transistor; and
a diode connected in antiparallel to the power semiconductor element, wherein:
the plate main surface is shaped to extend in a long-side direction and a short-side direction as viewed in the thickness direction;
a control layer is arranged on the substrate main surface and electrically connected to a control electrode of the power semiconductor element;
the control layer and the graphite plate are spaced apart in a direction parallel to the short-side direction of the plate main surface as viewed in the thickness direction; and
the power semiconductor element is located toward the control layer from the diode as viewed in the thickness direction.

2. The power module according to claim 1, wherein the graphite plate includes a first thermal conductor of which thermal conductivity is higher in a planar direction that is orthogonal to the thickness direction than in the thickness direction.

3. The power module according to claim 2, wherein the power semiconductor element is one of a plurality of power semiconductor elements, the power module comprising:

the power semiconductor elements,
wherein the power semiconductor elements are spaced apart from each other in the planar direction of the plate main surface.

4. The power module according to claim 3, wherein:
the power semiconductor elements are spaced apart from each other in the long-side direction.

5. The power module according to claim 2, wherein the power semiconductor element is one of a plurality of power semiconductor elements, the power module comprising:
the power semiconductor elements and diodes, each connected in antiparallel to one of the power semiconductor elements, wherein
each of the power semiconductor elements is a transistor,
the power semiconductor elements are spaced apart from each other in the planar direction of the plate main surface, and
the diodes are spaced apart from the power semiconductor elements in a direction orthogonal to an arrayed direction of the power semiconductor elements in the planar direction as viewed in the thickness direction and spaced apart from each other in the arrayed direction.

6. The power module according to claim 5, wherein:
the power semiconductor elements are spaced apart in the long-side direction; and
the diodes are spaced apart from the power semiconductor elements in the short-side direction and spaced apart from each other in the long-side direction.

7. The power module according to claim 1, wherein:
the diode includes a main surface and a back surface at opposite sides in the thickness direction, an anode electrode formed on the main surface, and a cathode electrode formed on the back surface; and
the cathode electrode is electrically connected via the graphite plate to the mounting layer.

8. The power module according to claim 1, wherein in a planar direction of the plate main surface, the graphite plate includes a second thermal conductor of which thermal conductivity is higher in a predetermined first direction than in a second direction that is orthogonal to the first direction.

9. The power module according to claim 8, wherein the thermal conductivity in the second direction is lower than thermal conductivity in the thickness direction.

10. The power module according to claim 8, wherein the power semiconductor element is one of a plurality of power semiconductor elements, the power module comprising:
the power semiconductor elements,
wherein the power semiconductor elements are spaced apart from each other in the second direction of the plate main surface.

11. The power module according to claim 10, wherein the plate main surface is shaped so that the second direction is a long-side direction and the first direction is a short-side direction as viewed in the thickness direction.

12. The power module according to claim 8, wherein the power semiconductor element is one of a plurality of power semiconductor elements, the power module comprising:
the power semiconductor elements and diodes, each connected in antiparallel to one of the power semiconductor elements, wherein
each of the power semiconductor elements is a transistor,
the power semiconductor elements are spaced apart from each other in the second direction of the plate main surface, and
the diodes are spaced apart from the power semiconductor elements in the first direction and spaced apart from each other in the second direction as viewed in the thickness direction.

13. The power module according to claim 8, wherein:
the plate main surface is shaped so that the second direction is a long-side direction and the first direction is a short-side direction as viewed in the thickness direction; and
the control layer and the graphite plate are spaced apart in the first direction of the plate main surface as viewed in the thickness direction.

14. The power module according to claim 8, wherein:
the diode includes a main surface and a back surface at opposite sides in the thickness direction, an anode electrode formed on the main surface, and a cathode electrode formed on the back surface; and
the cathode electrode is electrically connected via the graphite plate to the mounting layer.

15. The power module according to claim 1, wherein:
the power semiconductor element includes an element main surface and an element back surface at opposite sides in the thickness direction, a main surface drive electrode formed on the element main surface, and a back surface drive electrode formed on the element back surface; and
the back surface drive electrode is electrically connected via the graphite plate to the mounting layer.

16. The power module according to claim 1, wherein the graphite plate is a structure in which a first thermal conductor, of which thermal conductivity is higher in a planar direction that is orthogonal to the thickness direction than in the thickness direction, is formed on a second thermal conductor, of which thermal conductivity in a planar direction of the plate main surface is higher in a predetermined first direction than in a second direction that intersects the first direction, in the thickness direction.

17. A power module comprising:
a substrate that is electrically insulative and includes a substrate main surface and a substrate back surface at opposite sides in a thickness direction;
a first mounting layer, a second mounting layer, and a conductive layer arranged on the substrate main surface in a direction orthogonal to the thickness direction;
a first graphite plate having anisotropic thermal conductivity and including a first plate main surface and a first plate back surface at opposite sides in the thickness direction, wherein the first plate back surface is formed on the first mounting layer;
a second graphite plate having anisotropic thermal conductivity and including a second plate main surface and a second plate back surface at opposite sides in the thickness direction, wherein the second plate back surface is formed on the second mounting layer;
a first power semiconductor element arranged on the first plate main surface, the first power semiconductor element being a transistor;
a second power semiconductor element arranged on the second plate main surface, the second power semiconductor element being a transistor;
a first diode connected in antiparallel to the first power semiconductor element; and
a second diode connected in antiparallel to the second power semiconductor element, wherein:

each of the first plate main surface and the second plate main surface is shaped to extend in a long-side direction and a short-side direction as viewed in the thickness direction;

a first control layer and a second control layer are arranged on the substrate main surface, the first control layer electrically connected to a control electrode of the first power semiconductor element and the second control layer electrically connected to a control electrode of the second power semiconductor element;

the first control layer and the first graphite plate are spaced apart in a direction parallel to the short-side direction of the first plate main surface as viewed in the thickness direction;

the second control layer and the second graphite plate are spaced apart in a direction parallel to the short-side direction of the second plate main surface as viewed in the thickness direction;

the first power semiconductor element is located toward the first control layer from the first diode as viewed in the thickness direction; and the second power semiconductor element is located toward the second control layer from the second diode as viewed in the thickness direction.

18. A power module comprising:

a substrate that is electrically insulative and includes a substrate main surface and a substrate back surface at opposite sides in a thickness direction;

a mounting layer that is conductive and arranged on the substrate main surface;

a graphite plate having anisotropic thermal conductivity and including a plate main surface and a plate back surface at opposite sides in the thickness direction, wherein the plate back surface is connected to the mounting layer; and a power semiconductor element arranged on the plate main surface, wherein:

the power semiconductor element includes an element main surface and an element back surface at opposite sides in the thickness direction, a main surface drive electrode formed on the element main surface, and a back surface drive electrode formed on the element back surface; and the back surface drive electrode is electrically connected via the graphite plate to the mounting layer.

\* \* \* \* \*